(12) United States Patent
Saida et al.

(10) Patent No.: US 8,576,616 B2
(45) Date of Patent: Nov. 5, 2013

(54) MAGNETIC ELEMENT AND NONVOLATILE MEMORY DEVICE

(75) Inventors: Daisuke Saida, Tokyo (JP); Minoru Amano, Kanagawa-ken (JP); Junichi Ito, Kanagawa-ken (JP); Yuichi Ohsawa, Kanagawa-ken (JP); Saori Kashiwada, Kanagawa-ken (JP); Chikayoshi Kamata, Kanagawa-ken (JP); Tadaomi Daibou, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 201 days.

(21) Appl. No.: 13/227,959

(22) Filed: Sep. 8, 2011

(65) Prior Publication Data
US 2012/0243308 A1 Sep. 27, 2012

(30) Foreign Application Priority Data
Mar. 25, 2011 (JP) ................. 2011-068928

(51) Int. Cl.
*G11C 11/00* (2006.01)
(52) U.S. Cl.
USPC ........... 365/158; 365/171; 365/173; 365/148; 257/422; 257/425
(58) Field of Classification Search
USPC ........... 365/158, 171, 173, 148; 257/422, 425
See application file for complete search history.

(56) References Cited

U.S. PATENT DOCUMENTS

| | | | |
|---|---|---|---|
| 8,014,193 B2 | 9/2011 | Nakayama et al. | |
| 2004/0165425 A1* | 8/2004 | Nakamura et al. | 365/171 |
| 2005/0169044 A1* | 8/2005 | Hosotani | 365/158 |
| 2006/0038247 A1* | 2/2006 | Noh et al. | 257/421 |
| 2009/0015958 A1* | 1/2009 | Nakamura et al. | 360/55 |
| 2009/0050991 A1* | 2/2009 | Nagai et al. | 257/421 |

FOREIGN PATENT DOCUMENTS

| | | |
|---|---|---|
| JP | 2008-546129 | 12/2008 |
| JP | 2009-21352 | 1/2009 |
| JP | 2009-158665 | 7/2009 |
| JP | 2009-231753 | 10/2009 |
| WO | WO 2006/133342 A2 | 12/2006 |

OTHER PUBLICATIONS

U.S. Appl. No. 13/601,343, filed Aug. 31, 2012, Saida, et al.
U.S. Appl. No. 13/416,408, filed Mar. 9, 2012, Saida, et al.

(Continued)

*Primary Examiner* — Vu Le
*Assistant Examiner* — Han Yang
(74) *Attorney, Agent, or Firm* — Oblon, Spivak, McClelland, Maier & Neustadt, L.L.P.

(57) ABSTRACT

According to one embodiment, a magnetic element includes first and second conductive layers, an intermediate interconnection, and first and second stacked units. The intermediate interconnection is provided between the conductive layers. The first stacked unit is provided between the first conductive layer and the interconnection, and includes first and second ferromagnetic layer and a first nonmagnetic layer provided between the first and second ferromagnetic layers. The second stacked unit is provided between the second conductive layer and the interconnection, and includes third and fourth ferromagnetic layers and a second nonmagnetic layer provided between the third and fourth ferromagnetic layers. A magnetization direction of the second ferromagnetic layer is determined by causing a spin-polarized electron and a magnetic field to act on the second ferromagnetic layer.

20 Claims, 29 Drawing Sheets

(56) References Cited

OTHER PUBLICATIONS

U.S. Appl. No. 13/416,076, filed Mar. 9, 2012, Saida, et al.
U.S. Appl. No. 13/416,724, filed Mar. 9, 2012, Saida, et al.
U.S. Appl. No. 13/210,678, filed Aug. 16, 2011, Tadaomi Daibou, et al.
U.S. Appl. No. 13/037,592, filed Mar. 1, 2011, Daisuke Saida, et al.
U.S. Appl. No. 13/184,976, filed Jul. 18, 2011, Masahiko Nakayama, et al.
U.S. Appl. No. 13/228,040, filed Sep. 8, 2011, Saida, et al.
Japanese Office Action issued Feb. 4, 2013, in Patent Application No. 2011-068928 (with English-language translation).
U.S. Appl. No. 13/795,620, filed Mar. 12, 2013, Saida, et al.

\* cited by examiner

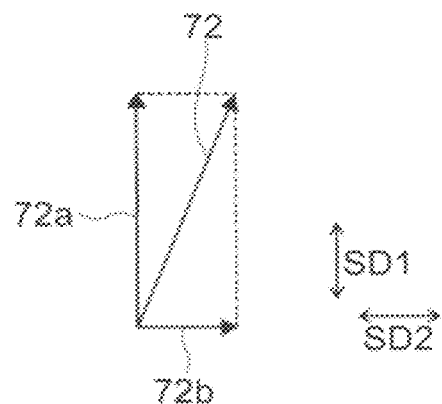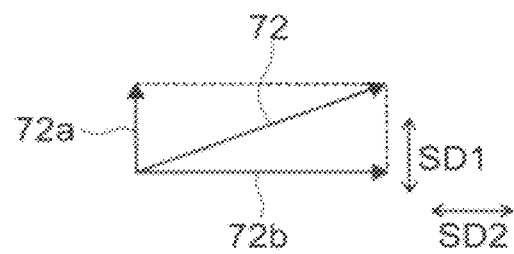
FIG. 2A  FIG. 2B
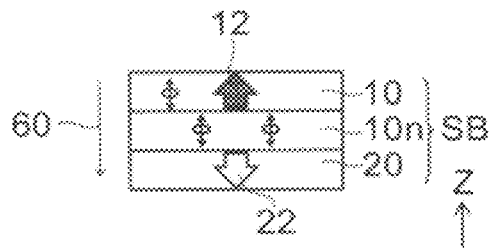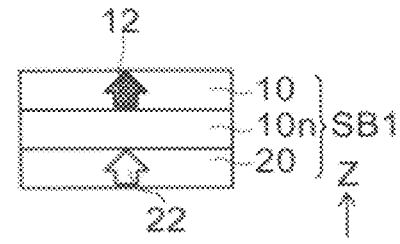
FIG. 3A  FIG. 3B
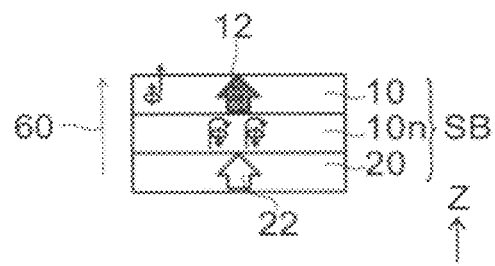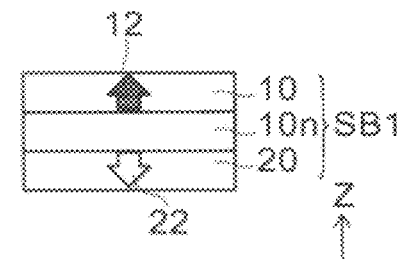
FIG. 3C  FIG. 3D

MAGNETIC ELEMENT AND NONVOLATILE MEMORY DEVICE

CROSS-REFERENCE TO RELATED APPLICATIONS

This application is based upon and claims the benefit of priority from the prior Japanese Patent Application No. 2011-068928, filed on Mar. 25, 2011; the entire contents of which are incorporated herein by reference.

FIELD

Embodiments described herein relate generally to a magnetic element and a nonvolatile memory device.

BACKGROUND

Some magnetic random access memories (MRAM) have a configuration in which a magnetic tunnel junction (MTJ) element exhibiting the tunneling magnetoresistive (TMR) effect is used for a data memory unit. The configuration is drawing attention as a high-speed and large-capacity nonvolatile memory. Writing to the memory layer of the MTJ element is performed by, for example, a spin-transfer torque writing system. In regard to such a memory, a configuration is desired that suppresses false writing during reading out the memory state of the memory.

BRIEF DESCRIPTION OF THE DRAWINGS

FIG. 2A and FIG. 2B are schematic views showing magnetization;

FIG. 3A to FIG. 3D are schematic views showing the operation of the magnetic element according to the embodiment;

FIG. 15A to FIG. 15F are schematic views showing a magnetic element according to the embodiment;

DETAILED DESCRIPTION

Figure 1A:
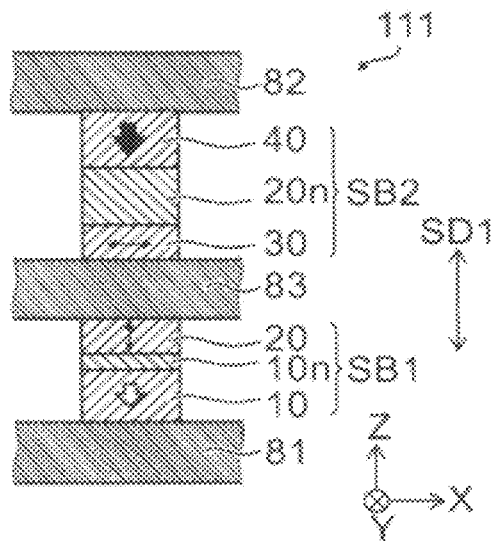
FIG. 1A to FIG. 1D are schematic cross-sectional views showing magnetic elements according to a first embodiment.

In general, according to one embodiment, a magnetic element includes a first conductive layer, a second conductive layer, an intermediate interconnection, a first stacked unit, and a second stacked unit. The intermediate interconnection is provided between the first conductive layer and the second conductive layer. The first stacked unit is provided between the first conductive layer and the intermediate interconnection. The first stacked unit includes a first ferromagnetic layer, a second ferromagnetic layer and a first nonmagnetic layer. A magnetization of the first ferromagnetic layer is fixed in a first direction. The second ferromagnetic layer is stacked with the first ferromagnetic layer along a stacking direction from the first conductive layer toward the second conductive layer. A direction of a magnetization of the second ferromagnetic layer is variable. The first nonmagnetic layer is provided between the first ferromagnetic layer and the second ferromagnetic layer. The second stacked unit is provided between the second conductive layer and the intermediate interconnection. The second stacked unit includes a third ferromagnetic layer, a fourth ferromagnetic layer and a second nonmagnetic layer. A direction of a magnetization of the third ferromagnetic layer is variable. The fourth ferromagnetic layer is stacked with the third ferromagnetic layer along the stacking direction. A magnetization of the fourth ferromagnetic layer is fixed in a second direction. The second nonmagnetic layer is provided between the third ferromagnetic layer and the fourth ferromagnetic layer. The direction of the magnetization of the second ferromagnetic layer is configured to be determined to a direction in accordance with a direction of a current by causing an electron whose spin is polarized by passing the current through the first stacked unit and the second stacked unit along the stacking direction to act on the second ferromagnetic layer and by causing a magnetic field generated from a precession of the magnetization of the third ferromagnetic layer to act on the second ferromagnetic layer.

In general, according to one other embodiment, a nonvolatile memory device includes a magnetic element and a control circuit unit. The magnetic element includes a first conductive layer, a second conductive layer, an intermediate interconnection, a first stacked unit and a second stacked unit. The intermediate interconnection is provided between the first conductive layer and the second conductive layer. The first stacked unit is provided between the first conductive layer and the intermediate interconnection. The first stacked unit includes a first ferromagnetic layer, a second ferromagnetic layer and a first nonmagnetic layer. A magnetization of the first ferromagnetic layer is fixed in a first direction. The second ferromagnetic layer is stacked with the first ferromagnetic layer along a stacking direction from the first conductive layer toward the second conductive layer. A direction of a magnetization of the second ferromagnetic layer is variable. The first nonmagnetic layer is provided between the first ferromagnetic layer and the second ferromagnetic layer. The second stacked unit is provided between the second conductive layer and the intermediate interconnection. The second stacked unit includes a third ferromagnetic layer, a fourth ferromagnetic layer and a second nonmagnetic layer. A direction of a magnetization of the third ferromagnetic layer is variable. The fourth ferromagnetic layer is stacked with the third ferromagnetic layer along the stacking direction. A magnetization of the fourth ferromagnetic layer is fixed in a second direction. The second nonmagnetic layer is provided between the third ferromagnetic layer and the fourth ferromagnetic layer. A direction of the magnetization of the second ferromagnetic layer is configured to be determined to a direction in accordance with a direction of a current by causing an electron whose spin is polarized by passing the current through the first stacked unit and the second stacked unit along the stacking direction to act on the second ferromagnetic layer and by causing a magnetic field generated from a precession of the magnetization of the third ferromagnetic layer to act on the second ferromagnetic layer. The control circuit unit is directly or indirectly connected to the first conductive layer, the second conductive layer, and the intermediate interconnection. The control circuit unit passes a current between the first conductive layer and the intermediate interconnection in a read operation reading out data stored in the magnetic element. The current has a value larger than a current flowing between the second conductive layer and the intermediate interconnection in the read operation.

In general, according to one other embodiment, a nonvolatile memory device includes: a plurality of bit lines; a plurality of word lines; and a plurality of memory cells. Each of the memory cells is provided at an intersection of each of the bit lines and each of the word lines. Each of the memory cells includes a first stacked unit; a second stacked unit; an intermediate interconnection provided between the first stacked unit and the second stacked unit; and a selection transistor including a gate. A current is able to be passed through the selection transistor by switching the gate to ON. The first stacked unit includes: a first ferromagnetic layer, a second ferromagnetic layer, and a first nonmagnetic layer. A magnetization of the first ferromagnetic layer is fixed in a first direction. The second ferromagnetic layer is stacked with the first ferromagnetic layer along a stacking direction from the first stacked unit toward the second stacked unit. A direction of a magnetization of the second ferromagnetic layer is variable. The first nonmagnetic layer provided between the first ferromagnetic layer and the second ferromagnetic layer. The second stacked unit includes a third ferromagnetic layer, a fourth ferromagnetic layer and a second nonmagnetic layer. A direction of a magnetization of the third ferromagnetic layer is variable. The fourth ferromagnetic layer is stacked with the third ferromagnetic layer along the stacking direction. A magnetization of the fourth ferromagnetic layer is fixed in a second direction. The second nonmagnetic layer is provided between the third ferromagnetic layer and the fourth ferromagnetic layer. Each of the memory cells has a function of storing data by determining a direction of the magnetization of the second ferromagnetic layer to a direction in accordance with a direction of a current by causing an electron whose spin is polarized by passing the current in a direction substantially perpendicular to layer surfaces of the first and second stacked units to act on the second ferromagnetic layer and by causing a magnetic field generated from a precession of the magnetization of the third ferromagnetic layer to act on the second ferromagnetic layer. Each of the bit lines includes a first, a second and a third bit interconnection. Each of the first, the second and the third bit interconnections is connected to one of the memory cells provided at the intersection of each of the bit lines and each of the word lines. The first bit interconnection is directly or indirectly connected to a first end of the first stacked unit of the one of the memory cells on a side opposite to the intermediate interconnection. The second bit interconnection is directly or indirectly connected to a second end of the second stacked unit of the one of the memory cells on a side opposite to the intermediate interconnection. The third bit interconnection is directly or indirectly connected to the intermediate interconnection of the one of the memory cells. The selection transistor of the one of the memory cells is disposed at least one of between the first bit interconnection and the first end and between the second bit interconnection and the second end. The one of the word lines is connected to the gate of the selection transistor of the one of the memory cells.

In general, according to one other embodiment, a nonvolatile memory device includes a first magnetic element, a second magnetic element, a first bit interconnection, a second bit interconnection, a third bit interconnection, a fourth bit interconnection, a fifth bit interconnection, a first selection transistor, a second selection transistor a first word line and a second word line. The first magnetic element includes a first stacked unit, a second stacked unit and a first intermediate interconnection. The first stacked unit includes a first ferromagnetic layer, a second ferromagnetic layer and a first nonmagnetic layer. A magnetization of the first ferromagnetic layer is fixed in a first direction. The second ferromagnetic layer is stacked with the first ferromagnetic layer. A direction of a magnetization of the second ferromagnetic layer is variable. The first nonmagnetic layer is provided between the first ferromagnetic layer and the second ferromagnetic layer. The second stacked unit is stacked with the first stacked unit along a stacking direction from the first ferromagnetic layer toward the second ferromagnetic layer. The second stacked unit includes a third ferromagnetic layer, a fourth ferromagnetic layer and a second nonmagnetic layer. A direction of a magnetization of the third ferromagnetic layer is variable. The fourth ferromagnetic layer is stacked with the third ferromagnetic layer along the stacking direction. A magnetization of the fourth ferromagnetic layer is fixed in a second direction. The second nonmagnetic layer is provided between the third ferromagnetic layer and the fourth ferromagnetic layer. The first intermediate interconnection is provided between the first stacked unit and the second stacked unit. A direction of the magnetization of the second ferromagnetic layer is configured to be determined to a direction in accordance with a direction of a current by causing an electron whose spin is polarized by passing the current through the first stacked unit and the second stacked unit along the stacking direction to act on the second ferromagnetic layer and by causing a magnetic field generated from a precession of the magnetization of the third ferromagnetic layer to act on the second ferromagnetic layer. The second magnetic element is juxtaposed to the first magnetic element along a direction orthogonal to the stacking direction. The second magnetic element includes a third stacked unit, a fourth stacked unit and a second intermediate interconnection. The third stacked unit includes a fifth ferromagnetic layer, a sixth ferromagnetic layer and a third nonmagnetic layer. A magnetization of the fifth ferromagnetic layer is fixed in a third direction. The sixth ferromagnetic layer is stacked with the fifth ferromagnetic layer along the stacking direction. A direction of a magnetization of the sixth ferromagnetic layer is variable. The third nonmagnetic layer is provided between the fifth ferromagnetic layer and the sixth ferromagnetic layer. The fourth stacked unit is stacked with the third stacked unit along the stacking direction. The fourth stacked unit includes a seventh ferromagnetic layer, an eighth ferromagnetic layer and a fourth nonmagnetic layer. A direction of a magnetization of the seventh ferromagnetic layer is variable. The eighth ferromagnetic layer is stacked with the seventh ferromagnetic layer along the stacking direction. A magnetization of the eighth ferromagnetic layer is fixed in a fourth direction. The fourth nonmagnetic layer is provided between the seventh ferromagnetic layer and the eighth ferromagnetic layer. The second intermediate interconnection is provided between the third stacked unit and the fourth stacked unit. A direction of the magnetization of the sixth ferromagnetic layer is configured to be determined to a direction in accordance with a direction of a current by causing an electron whose spin is polarized by passing the current through the third stacked unit and the fourth stacked unit along the stacking direction to act on the second ferromagnetic layer and by causing a magnetic field generated from a precession of the magnetization of the seventh ferromagnetic layer to act on the sixth ferromagnetic layer. The first bit interconnection is directly or indirectly connected to a first end of the first stacked unit on a side opposite to the first intermediate interconnection. The second bit interconnection is directly or indirectly connected to a second end of the second stacked unit on a side opposite to the first intermediate interconnection. The third bit interconnection is directly or indirectly connected to the first intermediate interconnection and the second intermediate interconnection. The fourth bit interconnection is directly or indirectly connected to a third end of the third stacked unit on a side opposite to the second intermediate interconnection. The fifth bit interconnection is directly or indirectly connected to a fourth end of the fourth stacked unit on a side opposite to the second intermediate interconnection. The first selection transistor is disposed at least one of between the first bit interconnection and the first end and between the second bit interconnection and the second end. The second selection transistor is disposed at least one of between the fourth bit interconnection and the third end and between the fifth bit interconnection and the fourth end. The first word line is directly or indirectly connected to a gate of the first selection transistor. The second word line is directly or indirectly connected to a gate of the second selection transistor.

Various embodiments will be described hereinafter with reference to the accompanying drawings.

The drawings are schematic or conceptual; and the relationships between the thickness and width of portions, the proportional coefficients of sizes among portions, etc., are not necessarily the same as the actual values thereof. Further, the dimensions and proportions may be illustrated differently among drawings, even for identical portions.

In the specification of this application and the drawings, components similar to those described in regard to a drawing thereinabove are marked with the same reference numerals, and a detailed description is omitted as appropriate.

First Embodiment

FIG. 1A to FIG. 1D are schematic cross-sectional views illustrating the configurations of magnetic elements according to a first embodiment.

FIG. 1A to FIG. 1D illustrate the configurations of magnetic elements 111, 111a, 111b, and 111c according to the embodiment, respectively. First, the magnetic element 111 is described.

As shown in FIG. 1A, the magnetic element 111 includes a first conductive layer 81, a second conductive layer 82, an intermediate interconnection 83, a first stacked unit SB1, and a second stacked unit SB2. The first conductive layer 81 includes a portion opposed to the second conductive layer 82. The intermediate interconnection 83 is provided between the first conductive layer 81 and the second conductive layer 82. The first conductive layer 81 and the second conductive layer 82 function as electrodes.

A direction from the first conductive layer 81 toward the second conductive layer 82 is taken as a Z-axis direction. One axis perpendicular to the Z-axis is taken as an X-axis. The axis perpendicular to the X-axis and the Z-axis is taken as a Y-axis. The Z-axis corresponds to a stacking direction SD1. The stacking direction SD1 is, for example, a direction perpendicular to the film surface of a first ferromagnetic layer 10. The film surface corresponds to a layer surface, and is, for example, parallel to the X-Y plane.

At least part of the first conductive layer 81, at least part of the second conductive layer 82, and at least part of the intermediate interconnection 83 extend in the X-Y plane, for example. The extending directions of the first conductive layer 81, the second conductive layer 82, and the intermediate interconnection 83 are arbitrary in the X-Y plane.

When viewed along the Z-axis, the first conductive layer 81 includes a portion overlapping with the second conductive layer 82. In the portion where the first conductive layer 81 and the second conductive layer 82 overlap when viewed along the Z-axis, at least part of the intermediate interconnection 83 is provided between the first conductive layer 81 and the second conductive layer 82.

The first stacked unit SB1 is provided between the first conductive layer 81 and the intermediate interconnection 83. The first stacked unit SB1 includes a first ferromagnetic layer 10, a second ferromagnetic layer 20, and a first nonmagnetic layer 10n.

In the first ferromagnetic layer 10, the magnetization is fixed in a first direction. That is, the magnetization of the first ferromagnetic layer 10 is substantially fixed in the first direction. The second ferromagnetic layer 20 is stacked with the first ferromagnetic layer 10 along the stacking direction SD1. In the second ferromagnetic layer 20, the direction of the magnetization is variable. The first nonmagnetic layer 10n is provided between the first ferromagnetic layer 10 and the second ferromagnetic layer 20.

The second stacked unit SB2 is provided between the second conductive layer 82 and the intermediate interconnection 83. The second stacked unit SB2 includes a third ferromagnetic layer 30, a fourth ferromagnetic layer 40, and a second nonmagnetic layer 20n.

In the third ferromagnetic layer 30, the direction of the magnetization is variable. The fourth ferromagnetic layer 40 is stacked with the third ferromagnetic layer 30 along the stacking direction SD1. In the fourth ferromagnetic layer 40, the magnetization is fixed in a second direction. That is, the magnetization of the fourth ferromagnetic layer 40 is substantially fixed in the second direction. The second nonmagnetic layer 20n is provided between the third ferromagnetic layer 30 and the fourth ferromagnetic layer 40.

In the specification of this application, "stack" includes not only the case where a plurality of layers are stacked in contact with each other but also the case where a plurality of layers are stacked via other components.

The stacking direction SD1 is parallel to the direction along which the first ferromagnetic layer 10, the first nonmagnetic layer 10n, and the second ferromagnetic layer 20 are stacked. The stacking direction SD1 is parallel to the direction along which the third ferromagnetic layer 30, the second nonmagnetic layer 20n, and the fourth ferromagnetic layer 40 are stacked.

At least part of the intermediate interconnection 83 is provided between the first stacked unit SB1 and the second stacked unit SB2. One end of the first stacked unit SB1 is connected to the intermediate interconnection 83. The other end of the first stacked unit SB1 is connected to the first conductive layer 81. One end of the second stacked unit SB2 is connected to the intermediate interconnection 83. The other end of the second stacked unit SB2 is connected to the second conductive layer 82.

In the magnetic element 111, an electron whose spin is polarized by passing a current through the first stacked unit SB1 and the second stacked unit SB2 along the stacking direction SD1 is caused to act on the second ferromagnetic layer 20, and a magnetic field generated from the precession of the magnetization of the third ferromagnetic layer 30 is caused to act on the second ferromagnetic layer 20. Thereby, the direction of the magnetization of the second ferromagnetic layer 20 can be determined to a direction in accordance with the direction of the current.

In the magnetic element 111, the second stacked unit SB2 functions as a magnetic field generation source. The first stacked unit SB1 functions as a magnetic memory unit. Hereinafter, the second stacked unit SB2 may be referred to as the magnetic field generation source and the first stacked unit SB1 may be referred to as the magnetic memory unit, as appropriate.

The first ferromagnetic layer 10 functions as, for example, a first magnetization fixed layer. In the first ferromagnetic layer 10, the magnetization is fixed in a direction substantially perpendicular to the film surface. In the second ferromagnetic layer 20, for example, the magnetization easy axis is in a direction substantially perpendicular to the film surface. The second ferromagnetic layer 20 functions as a magnetic memory layer. The first nonmagnetic layer 10n functions as a first spacer layer. In the case where the first nonmagnetic layer 10n is a tunnel barrier layer based on an insulating material, the first stacked unit SB1 including the first ferromagnetic layer 10, the first nonmagnetic layer 10n, and the second ferromagnetic layer 20 has a structure of, for example, MTJ (magnetic tunnel junction).

The third ferromagnetic layer 30 functions as a magnetization rotation layer. In the third ferromagnetic layer 30, for example, the magnetization easy axis is in a direction substantially parallel to the film surface. The fourth ferromagnetic layer 40 functions as, for example, a second magnetization fixed layer. In the fourth ferromagnetic layer 40, for example, the magnetization is fixed in a direction substantially perpendicular to the film surface. The second nonmagnetic layer 20n functions as a second spacer layer.

A perpendicular magnetic film, for example, is used as the first ferromagnetic layer 10, the second ferromagnetic layer 20, and the fourth ferromagnetic layer 40. An in-plane magnetic film, for example, is used as the third ferromagnetic layer 30.

FIG. 2A and FIG. 2B are schematic views illustrating magnetization.

FIG. 2A illustrates the magnetization in a perpendicular magnetic film. FIG. 2B illustrates the magnetization in an in-plane magnetic film.

As shown in FIG. 2A and FIG. 2B, one direction perpendicular to the stacking direction SD1 is taken as an in-plane direction SD2. The in-plane direction SD2 is a direction in the X-Y plane. A magnetization 72 has a magnetization oblique shadow component in a direction perpendicular to the film surface (a magnetization component 72a parallel to the stacking direction SD1) and a magnetization oblique shadow component in a direction parallel to the film surface (a magnetization component 72b parallel to the in-plane direction SD2).

As shown in FIG. 2A, the perpendicular magnetic film has a magnetization state in which the magnetization component 72a perpendicular to the film surface is larger than the magnetization component 72b parallel to the film surface. In the perpendicular magnetic film, the direction of the magnetization is preferably substantially perpendicular to the film surface in view of operating characteristics.

As shown in FIG. 2B, the in-plane magnetic film has a magnetization state in which the magnetization component 72b parallel to the film surface is larger than the magnetization component 72a perpendicular to the film surface. In the in-plane magnetic film, the direction of the magnetization is preferably substantially parallel to the film surface in view of operating characteristics.

For convenience of description, the direction from the first stacked unit SB1 toward the second stacked unit SB2 is referred to as "upward" or an "upward direction." The direction from the second stacked unit SB2 toward the first stacked unit SB1 is referred to as "downward" or a "downward direction."

As described above, the magnetization of the first ferromagnetic layer 10 is substantially fixed in the first direction.

The magnetization of the fourth ferromagnetic layer 40 is substantially fixed in the second direction.

As illustrated in FIG. 1A, in the magnetic element 111, the first direction is the downward direction, and also the second direction is the downward direction. However, the first direction and the second direction may be variously altered. For example, the first direction may be the upward direction and the second direction may be the upward direction.

Figure 1B:
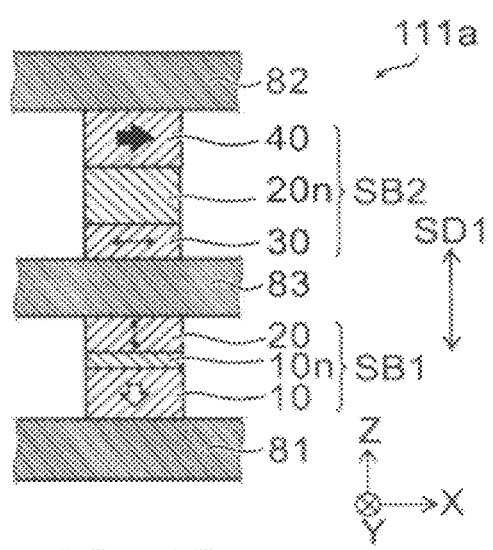
Figure 1C:
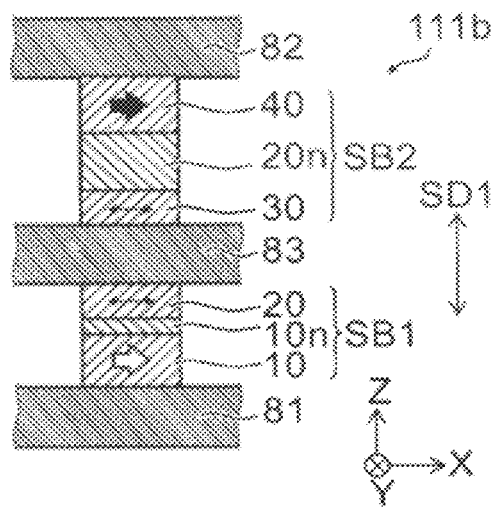
Figure 1D:
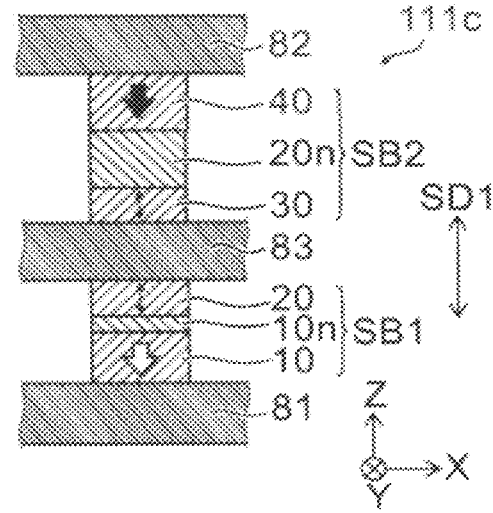

As shown in FIG. 1B to FIG. 1D, also the magnetic elements 111a, 111b, and 111c according to the embodiment include the first conductive layer 81, the second conductive layer 82, the intermediate interconnection 83, the first stacked unit SB1, and the second stacked unit SB2 mentioned above.

In the magnetic elements 111a, 111b, and 111c, the first ferromagnetic layer 10, the first nonmagnetic layer 10n, the second ferromagnetic layer 20, the intermediate interconnection 83, the third ferromagnetic layer 30, the second nonmagnetic layer 20n, and the fourth ferromagnetic layer 40 are stacked in this order.

As shown in FIG. 1B, in the magnetic element 111a, the first direction is the downward direction, and the second direction intersects with the stacking direction SD1 (in this example, being perpendicular to the stacking direction SD1).

As shown in FIG. 1C, in the magnetic element 111b, the first direction intersects with (in this example, is perpendicular to) the stacking direction SD1, and the second direction intersects with the stacking direction SD1 (in this example, being perpendicular to the stacking direction SD1). The direction of the magnetization of the second ferromagnetic layer 20 intersects with (in this example, is perpendicular to) the stacking direction SD1.

As shown in FIG. 1D, in the magnetic element 111c, the first direction is the downward direction, and also the second direction is the downward direction. The direction of the magnetization of the second ferromagnetic layer 20 and the direction of the magnetization of the third ferromagnetic layer 30 lie along the stacking direction SD1.

Thus, in the embodiment, various modifications are possible in the configuration of the first, second, third, and fourth ferromagnetic layers 10, 20, 30, and 40.

Hereinbelow, the magnetic element 111 is described. The following description can be applied also to other magnetic elements according to the embodiment.

In the magnetic element 111, for example, an electronic current can be passed through the first stacked unit SB1 and the second stacked unit SB2 via the first conductive layer 81 and the second conductive layer 82. The electronic current is a flow of electrons. When a current flows upward, the electronic current flows downward.

The second ferromagnetic layer 20 takes the role of storing data. The magnetization of the second ferromagnetic layer 20 can be reversed comparatively easily. The third ferromagnetic layer 30 takes the role of generating a high frequency magnetic field during writing.

When the electronic current is passed in the direction perpendicular to the film surface, the magnetization in the third ferromagnetic layer 30 of the magnetic field generation source precesses. Thereby, a rotating magnetic field (a high frequency magnetic field) is generated. The frequency of the high frequency magnetic field is, for example, about 1 GHz to 60 GHz. The high frequency magnetic field has a component in a direction perpendicular to the magnetization of the second ferromagnetic layer 20 (a component in the direction of the magnetization hard axis of the second ferromagnetic layer 20). Therefore, at least part of the high frequency magnetic field generated from the third ferromagnetic layer 30 is applied in the direction of the magnetization hard axis of the second ferromagnetic layer 20. If the high frequency magnetic field generated from the third ferromagnetic layer 30 is applied in the direction of the magnetization hard axis of the second ferromagnetic layer 20, it becomes very easy for the magnetization of the second ferromagnetic layer 20 to reverse.

In the magnetic element 111, the direction of the magnetization of the second ferromagnetic layer 20 can be controlled by passing an electronic current through the first stacked unit SB1 and the second stacked unit SB2. Specifically, the direction of the magnetization of the second ferromagnetic layer 20 can be reversed by changing the direction of the flow of the electronic current (polarity). When information is stored, for example, "0" and "1" are allotted in accordance with the direction of the magnetization of the second ferromagnetic layer 20.

As a specific example of the operation in the magnetic element 111, first an outline of the "write" operation will now be described.

FIG. 3A to FIG. 3D are schematic views illustrating an operation of the magnetic element according to the embodiment.

The drawings illustrate states of the first stacked unit SB1 during the "write" operation in the magnetic element 111. In the drawings, the second stacked unit SB2, the first conductive layer 81, the second conductive layer 82, and the intermediate interconnection 83 are omitted.

FIG. 3A illustrates a state where an electronic current 60 has started to be passed from the first ferromagnetic layer 10 toward the second ferromagnetic layer 20. FIG. 3B illustrates a state where passing the electronic current 60 from the first ferromagnetic layer 10 toward the second ferromagnetic layer 20 has been completed (a state where the magnetization is reversed). FIG. 3C illustrates a state where the electronic current 60 has started to be passed from the second ferromagnetic layer 20 toward the first ferromagnetic layer 10. FIG. 3D illustrates a state where passing the electronic current 60 from the second ferromagnetic layer 20 toward the first ferromagnetic layer 10 has been completed (a state where the magnetization is reversed). FIG. 3C and FIG. 3D correspond to the cases where the direction of the electronic current 60 is reversed in the cases illustrated in FIG. 3A and FIG. 3B, respectively.

In the write operation, the electronic current 60 is passed to cross the film surface of the first ferromagnetic layer 10 and the film surface of the second ferromagnetic layer 20 to perform the write operation on the second ferromagnetic layer 20. Herein, the case is described where the magnetoresistive effect via the first nonmagnetic layer 10n is a normal type.

In the magnetoresistive effect of the "normal type," the electric resistance when the magnetizations of magnetic layers on both sides of a nonmagnetic layer are parallel to each other is lower than the electric resistance when they are antiparallel. In the case of the normal type, the electric resistance between the first ferromagnetic layer 10 and the second ferromagnetic layer 20 via the first nonmagnetic layer 10n is lower when the magnetization of the first ferromagnetic layer 10 is parallel to the magnetization of the second ferromagnetic layer 20 than when antiparallel.

As shown in FIG. 3A, an electron having passed through the first ferromagnetic layer 10 having a magnetization 12 in a direction substantially perpendicular to the film surface obtains a spin in the same direction as the magnetization 12 of the first ferromagnetic layer 10. When the electron flows into the second ferromagnetic layer 20, the angular momentum of the spin is transmitted to the second ferromagnetic layer 20 to act on the magnetization 22 of the second ferromagnetic layer 20. That is, what is called a spin-transfer torque works.

Thereby, as shown in FIG. 3B, the magnetization 22 of the second ferromagnetic layer 20 becomes in the same direction as the magnetization 12 of the first ferromagnetic layer 10. This direction is the upward direction in FIG. 3B, for example one direction parallel to the stacking direction SD1. "0", for example, is allotted to the state of the second ferromagnetic layer 20 having the magnetization 22 in this direction (the upward direction in FIG. 3B).

As shown in FIG. 3C, out of the electrons having passed through the first nonmagnetic layer 10n, an electron having a spin in the same direction as the magnetization 12 of the first ferromagnetic layer 10 (the upward direction in FIG. 3C) passes through the first ferromagnetic layer 10. On the other hand, an electron having a spin in the opposite direction to the magnetization 12 of the first ferromagnetic layer 10 (the downward direction in FIG. 3C) is reflected at the interface between the first ferromagnetic layer 10 and the first nonmagnetic layer 10n. The angular momentum of the spin of the reflected electron is transmitted to the second ferromagnetic layer 20 to act on the magnetization 22 of the second ferromagnetic layer 20.

Thereby, as shown in FIG. 3D, the magnetization 22 of the second ferromagnetic layer 20 becomes in the opposite direction to the magnetization 12 of the first ferromagnetic layer 10 (the downward direction in FIG. 3D). That is, a spin-transfer torque works. "1", for example, is allotted to the state of the second ferromagnetic layer 20 having the magnetization 22 in this direction (the downward direction in FIG. 3D).

"0" or "1" is appropriately allotted to each of the plurality of different states of the second ferromagnetic layer 20 based on such action. Thereby, "writing" in the magnetic element 111 is performed.

On the other hand, in the case where the magnetoresistive effect is a "reverse type," the electric resistance between the first ferromagnetic layer 10 and the second ferromagnetic layer 20 via the first nonmagnetic layer 10n is higher when the magnetization of the first ferromagnetic layer 10 is parallel to the magnetization of the second ferromagnetic layer 20 than when antiparallel. The "write" operation in the reverse type is similar to that in the case of the normal type.

Next, an outline of the "read" operation will now be described.

The detection of the direction of the magnetization of the second ferromagnetic layer 20 in the magnetic element 111 is performed by, for example, utilizing the magnetoresistive effect. In the magnetoresistive effect, electric resistance changes with the relative direction of the magnetization of each layer. In the case where the magnetoresistive effect is utilized, a sense current is passed between the first ferromagnetic layer 10 and the second ferromagnetic layer 20 to measure the magnetic resistance. The current value of the sense current is smaller than the current value corresponding to the electronic current 60 passed during storing.

Figure 4A:
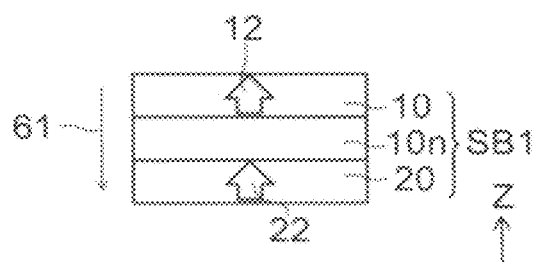
FIG. 4A and FIG. 4B are schematic views showing the operation of the magnetic element according to the embodiment.
Figure 4B:
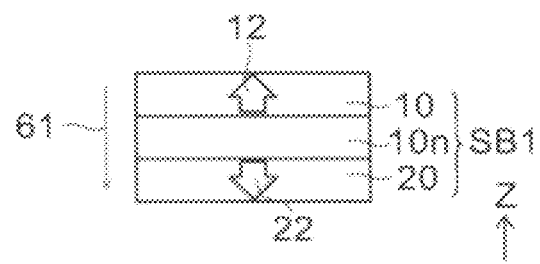

FIG. 4A and FIG. 4B are schematic views illustrating an operation of the magnetic element according to the embodiment.

The drawings illustrate states of the first stacked unit SB1 during the "read" operation in the magnetic element 111. In the drawings, the second stacked unit SB2, the first conductive layer 81, the second conductive layer 82, and the intermediate interconnection 83 are omitted.

FIG. 4A illustrates the case where the direction of the magnetization 12 of the first ferromagnetic layer 10 is the same as the direction of the magnetization 22 of the second ferromagnetic layer 20. FIG. 4B illustrates the case where the direction of the magnetization 12 of the first ferromagnetic layer 10 is antiparallel (opposite) to the direction of the magnetization 22 of the second ferromagnetic layer 20.

As shown in FIG. 4A and FIG. 4B, a sense current 61 is passed through the first stacked unit SB1 to detect the electric resistance.

In the magnetoresistive effect of the normal type, the resistance in the state of FIG. 4A is lower than the resistance in the state of FIG. 4B. In the magnetoresistive effect of the reverse type, the resistance in the state of FIG. 4A is higher than the resistance in the state of FIG. 4B.

Relating "0" and "1" to the plurality of states of different resistances, respectively, enables the reading of the memory of two value data. The direction of the sense current 61 may be opposite to the direction illustrated in FIG. 4A and FIG. 4B.

Figure 5A:
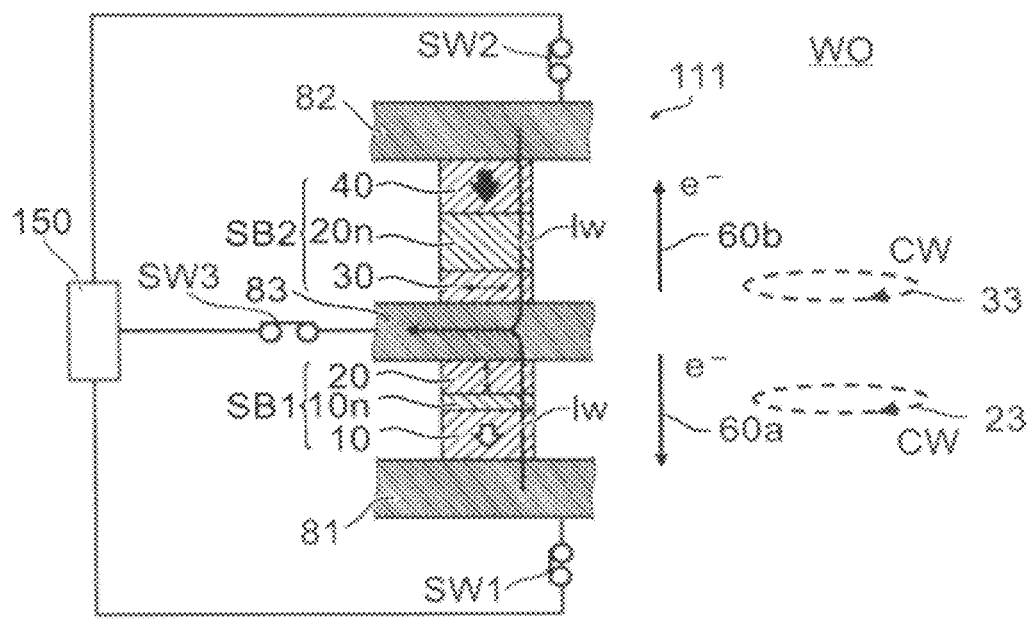
FIG. 5A and FIG. 5B are schematic views showing the operations of the magnetic element according to the first embodiment.
Figure 5B:
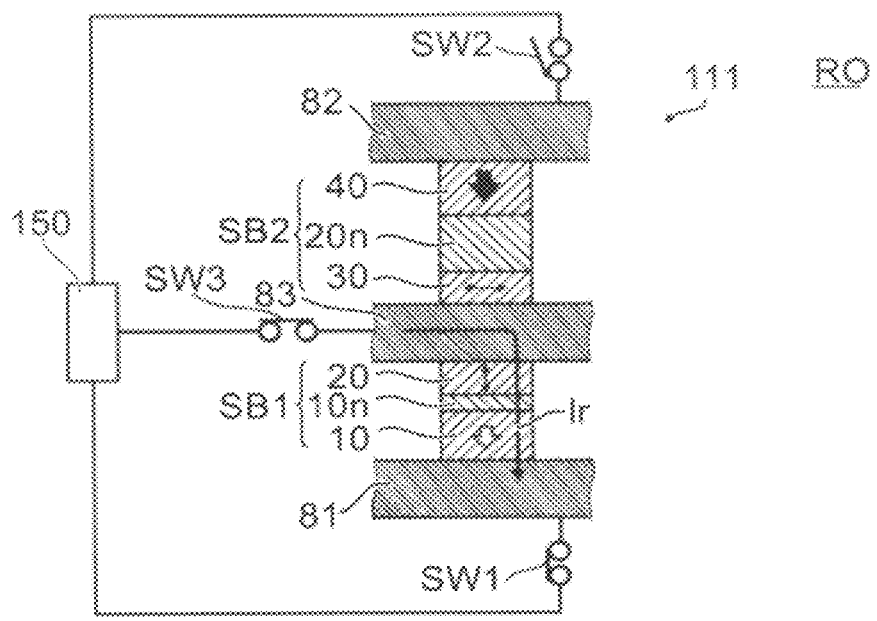

FIG. 5A and FIG. 5B are schematic views illustrating operations of the magnetic element according to the first embodiment.

FIG. 5A and FIG. 5B illustrate a write operation WO and a read operation RO, respectively, in the magnetic element 111.

As shown in FIG. 5A, a first switch SW1, a second switch SW2, and a third switch SW3 are connected to the first conductive layer 81, the second conductive layer 82, and the intermediate interconnection 83, respectively. The first switch SW1, the second switch SW2, and the third switch SW3 are, for example, a first transistor, a second transistor, and a third transistor (a first to a third selection transistor), respectively.

As shown in FIG. 5A, in the write operation WO, the first to third switches SW1 to SW3 are in the conduction state (ON state). Thereby, a current can be passed through all of the three interconnections. In this state, a write current Iw is passed between the intermediate interconnection 83 and the first conductive layer 81 and between the intermediate interconnection 83 and the second conductive layer 82. For example, an electronic current 60a is passed in the direction from the intermediate interconnection 83 toward the first conductive layer 81, and an electronic current 60b is passed in the direction from the intermediate interconnection 83 toward the second conductive layer 82. Thereby, a magnetization reversal occurs in the second ferromagnetic layer 20 effectively due to the resonance effect of the magnetic field generated from the magnetic field generation source. At this time, for example, the rotating magnetic field direction 33 of the third ferromagnetic layer 30 is a clockwise direction CW, and the precession direction 23 of the precession of the magnetization of the second ferromagnetic layer 20 is the clockwise direction CW. In the operation mentioned above, the direction of the write current Iw is arbitrary and the direction of the electronic current is arbitrary.

As shown in FIG. 5B, in the read operation RO, the first switch SW1 and the third switch SW3 are set in the conduction state (ON state), and the second switch SW2 is set in the non-conduction state (OFF state). Thereby, a situation can be created where no current flows between the intermediate interconnection 83 and the second conductive layer 82 and a current flows between the intermediate interconnection 83 and the first conductive layer 81. A read current Jr (corresponding to the sense current 61) is passed between the intermediate interconnection 83 and the first conductive layer 81 to read the memory state of the magnetic memory unit. At this time, no current flows in the magnetic field generation source. Thereby, a phenomenon can be prevented in which a magnetic field from the magnetic field generation source is applied to the magnetic memory unit to cause, for example, a magnetization reversal of the second ferromagnetic layer 20.

That is, false writing during reading is suppressed. The direction of the read current Ir is arbitrary.

In the magnetic element according to the embodiment, false writing is suppressed because the resonance effect caused by the magnetic field does not occur during reading. The configuration of the embodiment may be combined with configurations for high-speed operation and for reducing writing variation.

The embodiment may include a nonvolatile memory device. As shown in FIG. 5A and FIG. 5B, the nonvolatile memory device includes a magnetic element according to the embodiment and a control circuit unit 150. The control circuit unit 150 is directly or indirectly connected to the first conductive layer 81, the second conductive layer 82, and the intermediate interconnection 83. Herein, "directly connected" includes a state of being electrically connected with no other conductive member (e.g. a via electrode, an interconnection, etc.) interposed therebetween. "Indirectly connected" includes a state of being electrically connected with another conductive member (e.g. a via electrode, an interconnection, etc.) interposed therebetween and a state of being connected in a state where a switch (e.g. a transistor, etc.) is interposed therebetween to enable switching between conduction and non-conduction.

The operations mentioned above are performed by the control circuit unit 150.

More specifically, in the read operation RO in which data stored in the magnetic element is read out, the control circuit unit 150 passes the read current Ir having a larger value than the current flowing between the second conductive layer 82 and the intermediate interconnection 83 between the first conductive layer 81 and the intermediate interconnection 83. Thereby, a nonvolatile memory device suppressing false writing during reading can be provided.

For example, in the read operation RO, the control circuit unit 150 sets the current flowing between the second conductive layer 82 and the intermediate interconnection 83 smaller than the threshold current at which the third ferromagnetic layer 30 oscillates. For example, in the read operation, the current flowing between the second conductive layer 82 and the intermediate interconnection 83 is set to substantially zero. In the embodiment, "in the read operation RO, passing the read current Ir having a larger value than the current flowing between the second conductive layer 82 and the intermediate interconnection 83 between the first conductive layer 81 and the intermediate interconnection 83" includes passing no current between the second conductive layer 82 and the intermediate interconnection 83.

In this example, in the write operation WO in which data is written to the magnetic element, the control circuit unit 150 passes a current between the first conductive layer 81 and the intermediate interconnection 83 and passes a current between the second conductive layer 82 and the intermediate interconnection 83. At this time, the current flowing between the first conductive layer 81 and the intermediate interconnection 83 may be different from the current flowing between the second conductive layer 82 and the intermediate interconnection 83.

Furthermore, as mentioned above, the nonvolatile memory device according to the embodiment may further include a transistor (the first to third transistors mentioned above, i.e., the first to third switches SW1 to SW3 mentioned above) directly or indirectly connected at least one of between the first conductive layer 81 and the control circuit unit 150, between the second conductive layer 82 and the control circuit unit 150, and between the intermediate interconnection 83 and the control circuit unit 150. Thereby, the operations mentioned above are performed.

Examples of the configuration of each layer of the magnetic element 111 (and the magnetic elements 111a to 111c, etc.) will now be described.

As the first ferromagnetic layer 10 and the second ferromagnetic layer 20, a metal material including at least one element selected from the group consisting of iron (Fe), cobalt (Co), nickel (Ni), manganese (Mn), and chromium (Cr), for example, is preferably used. In addition, an alloy including at least one selected from the group mentioned above and at least one metal selected from the group consisting of platinum (Pt), palladium (Pd), iridium (Ir), ruthenium (Ru), and rhodium (Rh) may be used.

The characteristics of the first ferromagnetic layer 10 and the second ferromagnetic layer 20 can be adjusted by the composition of the magnetic material included and heat treatment. Furthermore, as the first ferromagnetic layer 10 and the second ferromagnetic layer 20, an amorphous alloy of rare earth-transition metal such as TbFeCo and GdFeCo may be used. A stacked structure such as Co/Pt, Co/Pd, and Co/Ni may be used as the first ferromagnetic layer 10 and the second ferromagnetic layer 20. Co/Ru, Fe/Au, Ni/Cu, and the like become a perpendicular magnetic film depending on the combination with the underlayer. Co/Ru, Fe/Au, Ni/Cu, and the like can be used as the first ferromagnetic layer 10 and the second ferromagnetic layer 20 by controlling the crystalline orientation direction of the film.

An insulating material functioning as a nonmagnetic tunnel barrier layer may be used as the first nonmagnetic layer 10n. Specifically, for example, an oxide, nitride, or fluoride including at least one element selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe) may be used.

As the first nonmagnetic layer 10n, for example, $Al_2O_3$, $SiO_2$, MgO, AlN, Ta—O, Al—Zr—O, $Bi_2O_3$, $MgF_2$, $CaF_2$, $SrTiO_3$, $AlLaO_3$, Al—N—O, Si—N—O, and the like may be used. In addition, for example, a nonmagnetic semiconductor ($ZnO_x$, InMn, GaN, GaAs, $TiO_x$, Zn, and Te or these materials doped with a transition metal) and the like may be used as the first nonmagnetic layer 10n.

The thickness of the first nonmagnetic layer 10n is preferably set to a value in a range approximately from 0.2 nanometers (nm) to 2.0 nm. Thereby, for example, an excessive high resistance is suppressed while ensuring the uniformity of the insulating film.

As the third ferromagnetic layer 30, for example, a magnetic metal including at least one element selected from the group consisting of iron (Fe), cobalt (Co), nickel (Ni), manganese (Mn), and chromium (Cr) may be used.

As the second nonmagnetic layer 20n, for example, one of a nonmagnetic tunnel barrier layer and a nonmagnetic metal layer may be used.

An insulating material, for example, is used as the nonmagnetic tunnel barrier layer. Specifically, for example, an oxide, nitride, or fluoride including at least one element selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe) may be used as the nonmagnetic tunnel barrier layer. In addition, as the nonmagnetic tunnel barrier layer, for example, $Al_2O_3$, $SiO_2$, MgO, AlN, Ta—O, Al—Zr—O, $Bi_2O_3$, $MgF_2$, $CaF_2$, $SrTiO_3$, $AlLaO_3$, Al—N—O, Si—N—O, and the like may be used.

As the nonmagnetic tunnel barrier layer, a nonmagnetic semiconductor ($ZnO_x$, InMn, GaN, GaAs, $TiO_x$, Zn, and Te or these materials doped with a transition metal) and the like may be used.

In the case where a nonmagnetic tunnel barrier layer is used as the second nonmagnetic layer 20n, the thickness of the second nonmagnetic layer 20n is preferably set to a value in a range approximately from 0.2 nm to 2.0 nm. In the case where a nonmagnetic tunnel barrier layer is used as the second nonmagnetic layer 20n, the thickness of the second nonmagnetic layer 20n is preferably made thinner than that of the first nonmagnetic layer 10n. Thereby, the possibility can be decreased that the write current decreases due to an increase in the resistance when an equal voltage is applied to the magnetic element.

As the nonmagnetic metal layer used as the second nonmagnetic layer 20n, for example, a nonmagnetic metal selected from the group consisting of copper (Cu), silver (Ag), gold (Au), chromium (Cr), zinc (Zn), gallium (Ga), niobium (Nb), molybdenum (Mo), ruthenium (Ru), palladium (Pd), hafnium (Hf), tantalum (Ta), tungsten (W), platinum (Pt), and bismuth (Bi) or an alloy including at least two nonmagnetic metals selected from the group mentioned above may be used. The thickness of the second nonmagnetic layer 20n is preferably made not less than 1.5 nm and not more than 20 nm. Thereby, an interlayer coupling does not occur between magnetic layers, and the loss of the spin polarization state of a conduction electron is suppressed when the conduction electron passes through the nonmagnetic metal layer.

As the fourth ferromagnetic layer 40, a metal material including at least one element selected from the group consisting of iron (Fe), cobalt (Co), nickel (Ni), manganese (Mn), and chromium (Cr) is preferably used. Furthermore, an alloy including these and at least one element selected from the group consisting of platinum (Pt), palladium (Pd), iridium (Ir), ruthenium (Ru), and rhodium (Rh) may be used.

The characteristics of the fourth ferromagnetic layer 40 can be adjusted by the composition of the magnetic material included and heat treatment. As the fourth ferromagnetic layer 40, an amorphous alloy of rare earth-transition metal such as TbFeCo and GdFeCo may be used. In addition, as the fourth ferromagnetic layer 40, a stacked structure such as Co/Pt, Co/Pd, and Co/Ni may be used. Co/Ru, Fe/Au, Ni/Cu, and the like become a perpendicular magnetic film depending on the combination with the underlayer. Co/Ru, Fe/Au, Ni/Cu, and the like can be used as the fourth ferromagnetic layer 40 by controlling the crystalline orientation direction of the film.

A nonmagnetic metal layer is used as the intermediate interconnection 83.

The nonmagnetic metal layer used as the intermediate interconnection 83 may include at least one nonmagnetic metal selected from the group consisting of copper (Cu), silver (Ag), gold (Au), chromium (Cr), zinc (Zn), gallium (Ga), niobium (Nb), molybdenum (Mo), ruthenium (Ru), palladium (Pd), hafnium (Hf), tantalum (Ta), titanium (Ti), tungsten (W), platinum (Pt), bismuth (Bi), iridium (Ir), and osmium (Os) or an alloy including two or more nonmagnetic metals selected from the group mentioned above. In addition, as the nonmagnetic metal layer used as the intermediate interconnection 83, one of a conductive nitride, a conductive oxide, and a conductive fluoride including at least one element selected from the group mentioned above may be used. For example, TiN, TaN, and the like may be used as the intermediate interconnection 83. Furthermore, a stacked film in which films of these materials are stacked may be used. As the intermediate interconnection 83, for example, a stacked film of a Ti film/a Ru film/a Ti film and the like may be used.

As the intermediate interconnection 83, a material with a long spin diffusion length such as copper (Cu) or a material with a short spin diffusion length such as ruthenium (Ru) may be used. In the case where it is desirable to cancel the effect of spin-polarized electrons being interposed, a material with a short spin diffusion length such as ruthenium (Ru) is preferably used as the intermediate interconnection 83.

A conductive magnetic material or a conductive nonmagnetic material is used as the first conductive layer 81 and the second conductive layer 82. Examples of the conductive magnetic material include a material similar to the material used as the third ferromagnetic layer 30 and the fourth ferromagnetic layer 40.

As the conductive nonmagnetic material used as the first conductive layer 81 and the second conductive layer 82, a metal selected from the group consisting of gold (Au), copper (Cu), chromium (Cr), zinc (Zn), gallium (Ga), niobium (Nb), molybdenum (Mo), ruthenium (Ru), palladium (Pd), silver (Ag), hafnium (Hf), tantalum (Ta), titanium (Ti), tungsten (W), platinum (Pt), bismuth (Bi), and aluminum (Al) or an alloy including two or more metals selected from the group mentioned above may be used. In addition, as the conductive nonmagnetic material used as the first conductive layer 81 and the second conductive layer 82, one of a conductive nitride, a conductive oxide, and a conductive fluoride including at least one element selected from the group mentioned above may be used.

Furthermore, as the conductive nonmagnetic material used as the first conductive layer 81 and the second conductive layer 82, a material such as carbon nanotube, carbon nanowire, and graphene may be used.

As described later, there is a case where a transistor is directly or indirectly connected to at least one of the first conductive layer 81 and the second conductive layer 82. In this case, for example, the source portion or the drain portion of the transistor may be used as the above-mentioned at least one of the first conductive layer 81 and the second conductive layer 82. Furthermore, in this case, for example, a contact portion connected to the source portion or the drain portion of the transistor may be used as the above-mentioned at least one of the first conductive layer 81 and the second conductive layer 82.

As described above, the shapes of the first stacked unit SB1 and the second stacked unit SB2 when viewed along the Z-axis are arbitrary. For example, the shapes of the first stacked unit SB1 and the second stacked unit SB2 when viewed along the Z-axis (the shape cut along a plane parallel to the film surface) may have one of a circle, ellipse, flat circle, polygon having three or more corners such as a tetragon and hexagon, and polygon having a round corner.

The inventors have found out through a calculation of micromagnetics that, if the third ferromagnetic layer 30 has a diameter larger than 35 nm, the magnetization forms a vortex (closure domain) when making a rotational motion. That is, by setting the circle-equivalent diameter of the cross-sectional shape of the third ferromagnetic layer 30 not more than 35 nm and the thickness not less than 0.5 nm and not more than 3.5 nm, a uniform magnetic field can be caused to act on the second ferromagnetic layer 20 to assist the magnetization rotation while suppressing vortex formation during the rotational motion of the magnetization. That is, a sufficient magnetic field strength to promote the reversal of the magnetization is obtained in the position of the second ferromagnetic layer 20.

Assuming that the circle-equivalent diameter of the horizontal cross-sectional shape (the cross-sectional shape when cut along a plane perpendicular to the stacking direction SD1) of the third ferromagnetic layer 30 is R (nm), a value half of "R" is r (=R/2) (nm), and the layer thickness is t (nm), a size satisfying the relation of $r<0.419t^2-2.86t+19.8$ is preferably used.

In the specification of this application, "circle-equivalent diameter" refers to the diameter of a supposed circle that has an area equal to the area of the planar shape in question. For example, in the case where the horizontal cross-sectional shape of the third ferromagnetic layer 30 is a circle, "R" means the diameter. In the case where the horizontal cross-sectional shape of the third ferromagnetic layer 30 is an ellipse, "R" means the diameter of a circle having an area equal to the area of the ellipse. In the case where the horizontal cross-sectional shape of the third ferromagnetic layer 30 is a polygon, "R" means the diameter of a circle having an area equal to the area of the polygon. The horizontal cross-sectional shape of the third ferromagnetic layer 30 is preferably a circle with a diameter of R. Thereby, the magnetization of the third ferromagnetic layer 30 precesses all at once with a component in the surface perpendicular direction and the rotating magnetic field is applied to the second ferromagnetic layer 20.

Various examples of the configuration of the magnetic element according to the embodiment will now be described as a second to a sixth embodiment. In the following, not-described configuration, the material of the components, and the like are similar to the structure and the material of the components described in regard to the magnetic element 111.

Second Embodiment

Figure 6A:
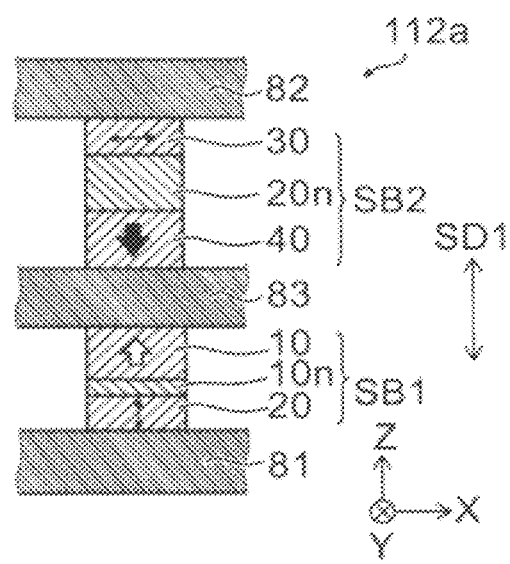
FIG. 6A and FIG. 6B are schematic cross-sectional views showing magnetic elements according to a second embodiment.
Figure 6B:
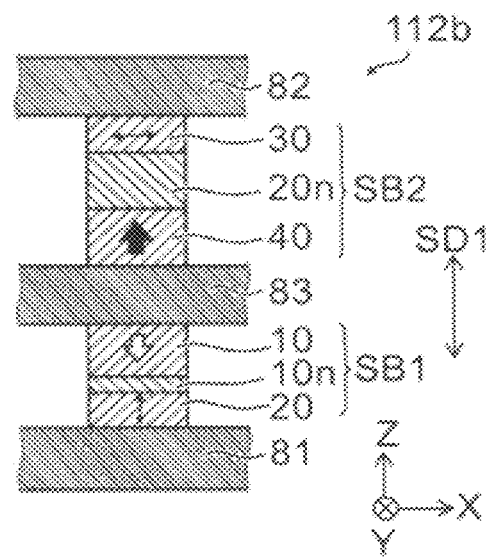

FIG. 6A and FIG. 6B are schematic cross-sectional views illustrating the configurations of magnetic elements according to a second embodiment.

As shown in FIG. 6A and FIG. 6B, in magnetic elements 112a and 112b according to the embodiment, the third ferromagnetic layer 30, the second nonmagnetic layer 20n, the fourth ferromagnetic layer 40, the intermediate interconnection 83, the first ferromagnetic layer 10, the first nonmagnetic layer 10n, and the second ferromagnetic layer 20 are stacked in this order.

In the magnetic elements 112a and 112b, the direction of the perpendicular oblique shadow component of the magnetization fixed in the first direction (the magnetization of the first ferromagnetic layer 10) is opposite to the direction of the perpendicular oblique shadow component of the magnetization fixed in the second direction (the magnetization of the fourth ferromagnetic layer 40). In the magnetic element 112a, the first direction is the upward direction and the second direction is the downward direction. In the magnetic element 112b, the first direction is the downward direction and the second direction is the upward direction.

Figure 7A:
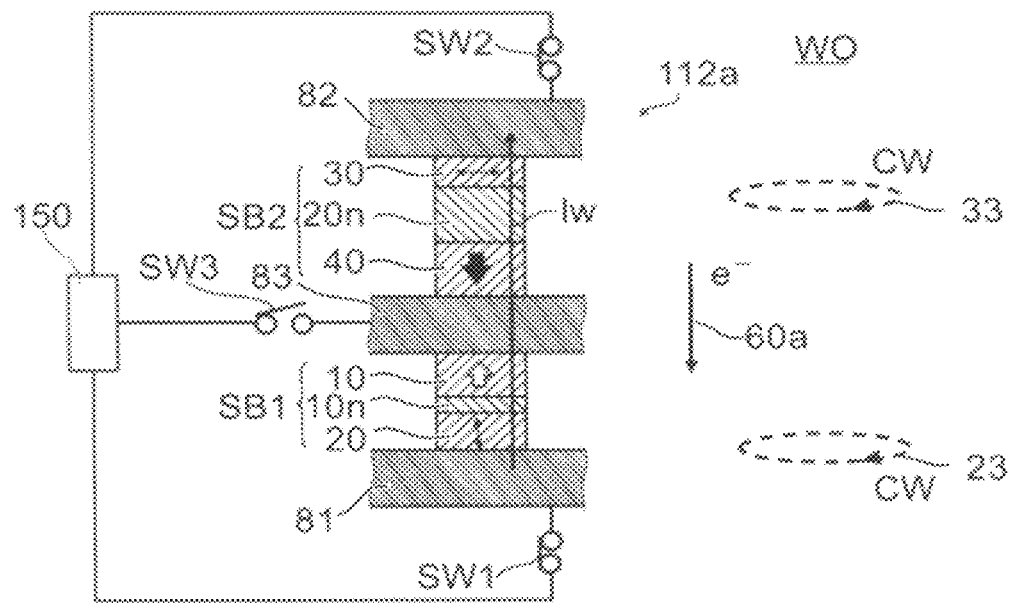
FIG. 7A and FIG. 7B are schematic views showing the operations of the magnetic element according to the second embodiment.
Figure 7B:
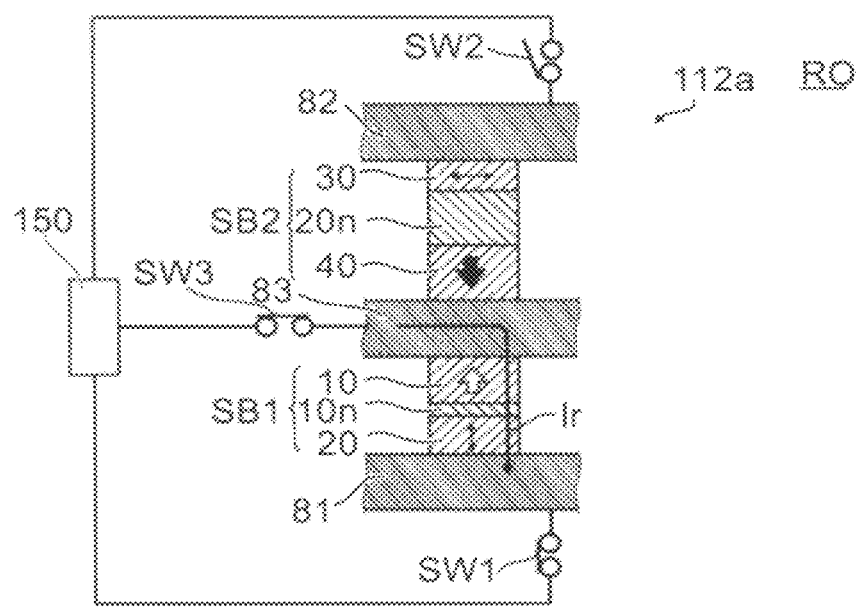

FIG. 7A and FIG. 7B are schematic views illustrating operations of the magnetic element according to the second embodiment.

FIG. 7A and FIG. 7B illustrate the write operation WO and the read operation RO, respectively, in the magnetic element 112a.

As shown in FIG. 7A, in the write operation WO, the write current Iw is passed between the first conductive layer 81 and the second conductive layer 82 while the third switch SW3 is set in the OFF state. The direction of the write current Iw is arbitrary. The direction of the rotating magnetic field generated from the third ferromagnetic layer 30 (the rotating magnetic field direction 33) and the direction in which the magnetization of the second ferromagnetic layer 20 precesses (the precession direction 23) coincide with each other. The rotating magnetic field generated from the third ferromagnetic layer 30 acts more effectively on the second ferromagnetic layer 20. This can assist the magnetization reversal of the second ferromagnetic layer 20 more efficiently. Consequently, the current necessary for writing to the second ferromagnetic layer 20 can be more reduced.

As shown in FIG. 7B, in the read operation RO, as in the case of the magnetic element 111, no current is passed between the intermediate interconnection 83 and the second conductive layer 82, and the read current Ir is passed between the intermediate interconnection 83 and the first conductive layer 81. The direction of the read current Ir is arbitrary. That is, no current is passed through the magnetic field generation source. Thereby, false writing during reading is suppressed.

The operation in the magnetic element 112b is similar to that in the magnetic element 112a and a description is therefore omitted.

Figure 8A:
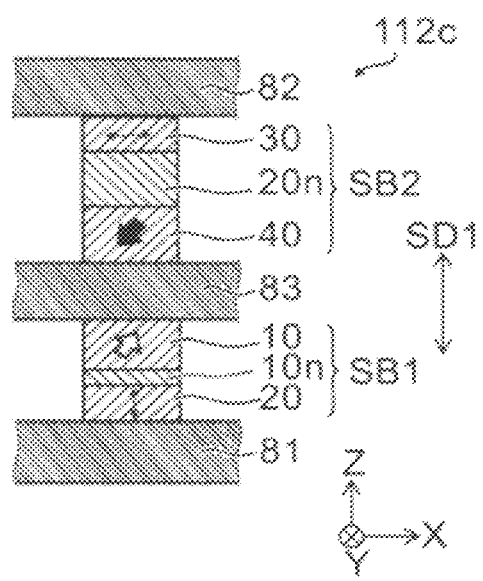
FIG. 8A and FIG. 8B are schematic cross-sectional views showing other magnetic elements according to the second embodiment.
Figure 8B:
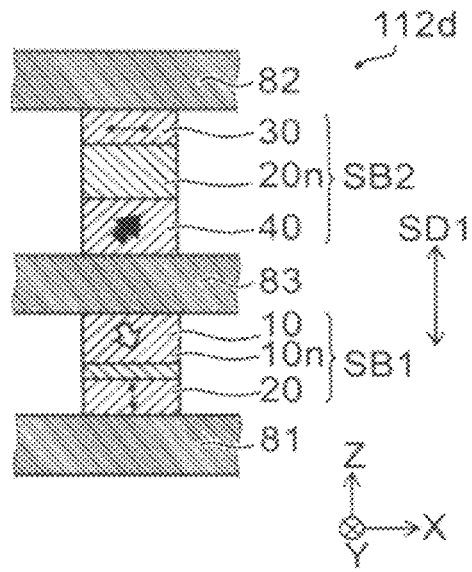

FIG. 8A and FIG. 8B are schematic cross-sectional views illustrating the configurations of other magnetic elements according to the second embodiment.

As shown in FIG. 8A and FIG. 8B, in other magnetic elements 112c and 112d according to the embodiment, the direction of the magnetization of the first ferromagnetic layer and the direction of the magnetization of the fourth ferromagnetic layer 40 are oblique to the film surface. Also in this case, the direction of the perpendicular oblique shadow component of the magnetization fixed in the first direction (the magnetization of the first ferromagnetic layer 10) is opposite to the direction of the perpendicular oblique shadow component of the magnetization fixed in the second direction (the magnetization of the fourth ferromagnetic layer 40).

The write operation WO and the read operation RO of the magnetic elements 112c and 112d are similar to those of the magnetic element 112a and a description is therefore omitted.

As mentioned above, in the magnetic elements 112a to 112d, the direction of the perpendicular oblique shadow component of the magnetization fixed in the first direction is opposite to the direction of the perpendicular oblique shadow component of the magnetization fixed in the second direction. In this case, the stray magnetic field applied in the direction perpendicular to the film surface in the position of the second ferromagnetic layer 20 can be reduced. That is, the stray magnetic field applied in the direction perpendicular to the film surface in the position of the second ferromagnetic layer 20 can be cancelled. On the other hand, the stray magnetic field applied in the direction perpendicular to the film surface in the position of the third ferromagnetic layer 30 can be caused to remain and act.

Thereby, the direction of the rotating magnetic field generated from the third ferromagnetic layer 30 (the rotating magnetic field direction 33) and the direction in which the magnetization of the second ferromagnetic layer 20 precesses (the precession direction 23) coincide with each other. Thereby, the magnetization reversal of the second ferromagnetic layer 20 can be efficiently assisted by the rotating magnetic field generated from the third ferromagnetic layer 30. As a result, the current necessary for storing (writing) information to the second ferromagnetic layer 20 can be reduced.

In the magnetic elements 112a to 112d, the first ferromagnetic layer 10 and the fourth ferromagnetic layer 40 may be coupled antiferromagnetically via the intermediate interconnection 83. Such a structure in which mutual magnetization directions are coupled antiferromagnetically via a nonmagnetic layer to become antiparallel is called a synthetic antiferromagnetic (SAF) structure. In this example, the stacked structure of "a first magnetic layer (e.g. the first ferromagnetic layer 10)/a nonmagnetic layer (e.g. the intermediate interconnection 83)/a second magnetic layer (e.g. the fourth ferromagnetic layer 40)" corresponds to the SAF structure.

Using the SAF structure can enhance the mutual magnetization fixing strength and increase resistance to external magnetic fields and thermal stability. In the structure, the stray magnetic field applied in the direction perpendicular to the film surface in the position of the magnetic memory layer (e.g. the second ferromagnetic layer 20) can be made almost zero.

A metal material such as ruthenium (Ru), iridium (Ir), and osmium (Os) is used as the nonmagnetic layer (intermediate layer) in the SAF structure. The thickness of the nonmagnetic layer is set not more than 3 nm. Thereby, a sufficiently strong antiferromagnetic coupling is obtained via the nonmagnetic layer.

That is, the intermediate interconnection 83 preferably includes a metal selected from the group consisting of ruthenium (Ru), osmium (Os), and iridium (Ir) or an alloy including at least two metals selected from the group, and the thickness of the intermediate interconnection 83 is preferably not more than 3 nm.

The dimensions (width, thickness, etc.) of the layers included in the magnetic element according to the embodiment are found through an electron microscope photographic image or the like, for example.

Third Embodiment

Figure 9A:
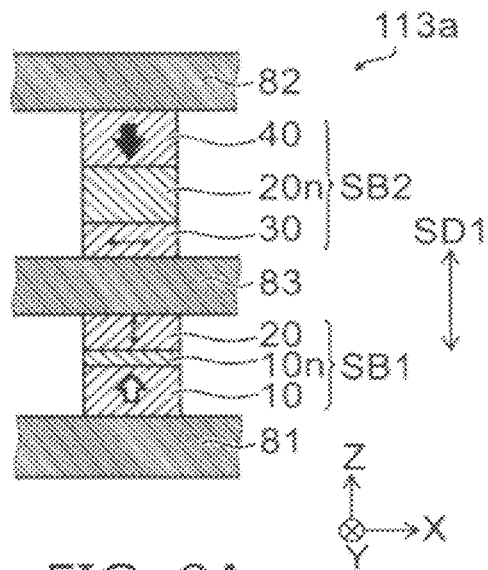
FIG. 9A and FIG. 9B are schematic cross-sectional views showing magnetic elements according to a third embodiment.
Figure 9B:
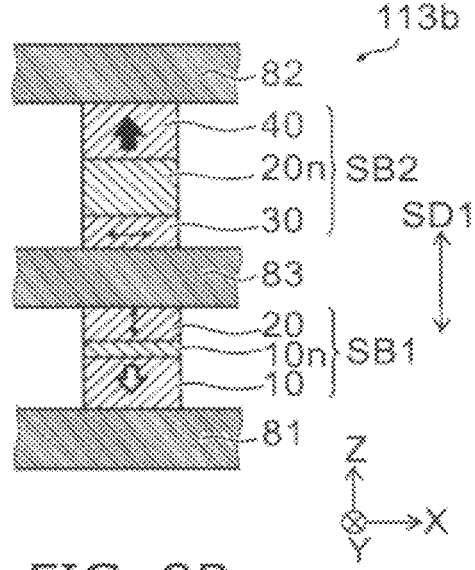

FIG. 9A and FIG. 9B are schematic cross-sectional views illustrating the configurations of magnetic elements according to a third embodiment.

As shown in FIG. 9A and FIG. 9B, in magnetic elements 113a and 113b according to the embodiment, the fourth ferromagnetic layer 40, the second nonmagnetic layer 20n, the third ferromagnetic layer 30, the intermediate interconnection 83, the second ferromagnetic layer 20, the first nonmagnetic layer 10n, and the first ferromagnetic layer 10 are stacked in this order. Also in these cases, the directions of the magnetization of the first ferromagnetic layer 10 and the magnetization of the fourth ferromagnetic layer 40 may be oblique to the film surface.

Also in the magnetic elements 113a and 113b, the direction of the perpendicular oblique shadow component of the magnetization fixed in the first direction and the direction of the perpendicular oblique shadow component of the magnetization fixed in the second direction are opposite to each other.

Figure 10A:
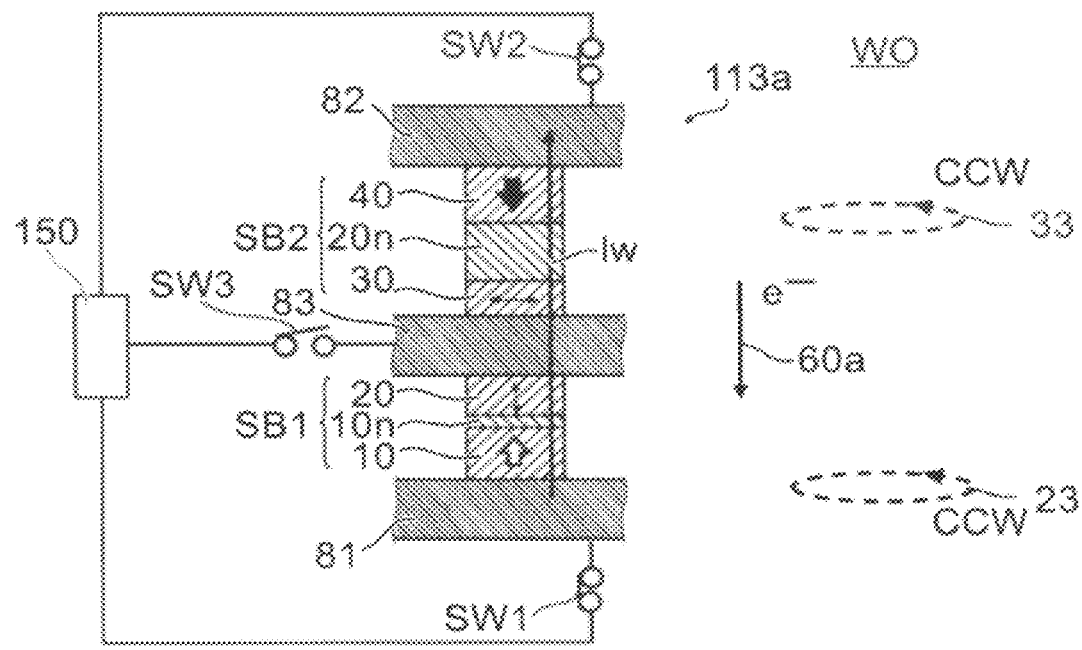
FIG. 10A and FIG. 10B are schematic views showing the operations of the magnetic element according to the third embodiment.
Figure 10B:
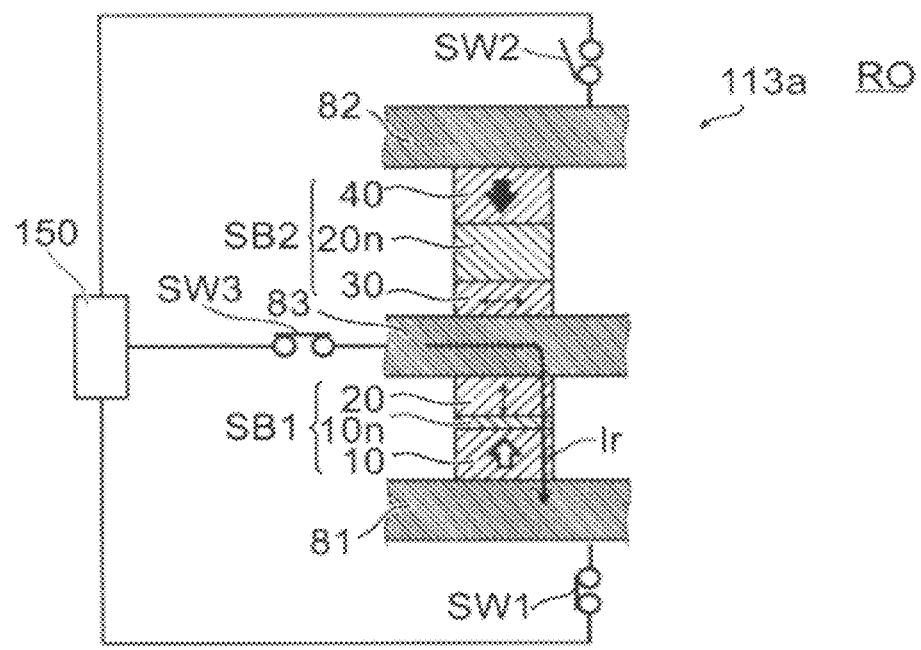

FIG. 10A and FIG. 10B are schematic views illustrating operations of the magnetic element according to the third embodiment.

FIG. 10A and FIG. 10B illustrate the write operation WO and the read operation RO, respectively, in the magnetic element 113a.

As shown in FIG. 10A, in the write operation WO, the write current Iw is passed between the first conductive layer 81 and the second conductive layer 82 while the third switch SW3 is set in the OFF state. The direction of the write current Iw is arbitrary. The direction of the rotating magnetic field generated from the third ferromagnetic layer 30 (the rotating magnetic field direction 33) and the direction in which the magnetization of the second ferromagnetic layer 20 precesses (the precession direction 23) coincide with each other. For example, the rotating magnetic field direction 33 and the precession direction 23 are a counterclockwise direction CCW.

In the magnetic element 113a (and 113b), the distance between the second ferromagnetic layer 20 and the third ferromagnetic layer 30 is shorter than, for example, that in the magnetic element 112a (and 112b). Thereby, the rotating magnetic field generated from the third ferromagnetic layer 30 can act more on the second ferromagnetic layer 20, and the magnetization reversal of the second ferromagnetic layer 20 can be assisted more efficiently. Thereby, the current necessary for writing to the second ferromagnetic layer can be more reduced.

As shown in FIG. 10B, the read operation RO in the magnetic element 113a is similar to that in the magnetic element 111. Thereby, false writing during reading is suppressed.

The operation in the magnetic element 113b is similar to that in the magnetic element 113a and a description is therefore omitted.

In the magnetic elements 113a and 113b, if the spin information is kept in the intermediate interconnection 83, the third ferromagnetic layer 30 is affected by the spin-transfer torque from the second ferromagnetic layer 20. This may cause a decrease in the controllability of the magnetization rotation of the third ferromagnetic layer 30.

At this time, as the intermediate interconnection 83, a film with a short spin diffusion length such as, for example, ruthenium (Ru) (a material having the function of spin cancel) or a layer having a structure with a short spin diffusion length is preferably used. This can suppress the decrease in the controllability of the magnetization rotation of the third ferromagnetic layer 30.

That is, the magnitude of the spin-transfer torque for the magnetization of the third ferromagnetic layer 30 to precess is determined by the spin polarization in the fourth ferromagnetic layer 40. In this configuration, the magnetization of the third ferromagnetic layer 30 can be independently controlled without being affected by the spin of other electrons (spin-transfer torque).

As the material of the intermediate interconnection 83 providing such a spin cancel effect, a metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V) or an alloy including two or more metals selected from the group can be given.

The thickness of the intermediate interconnection 83 is preferably set to a value that does not cause an interlayer magnetic coupling between the second ferromagnetic layer 20 and the third ferromagnetic layer 30. Specifically, the thickness of the intermediate interconnection 83 is preferably set not less than 1.4 nm.

If the thickness of the intermediate interconnection 83 is not less than 1.4 nm, the second ferromagnetic layer 20 and the third ferromagnetic layer 30 are not interlayer-coupled, and the spin polarization degree can be cancelled in the intermediate interconnection 83 when conduction electrons pass through the interior and interface of the intermediate interconnection 83. Furthermore, the intermediate interconnection 83 can prevent the precession of the third ferromagnetic layer 30 from changing due to the direction of the magnetization of the second ferromagnetic layer 20.

On the other hand, if the thickness of the intermediate interconnection 83 exceeds 20 nm, the strength of the rotating magnetic field generated from the third ferromagnetic layer 30 decreases in the position of the second ferromagnetic layer 20. Therefore, the thickness of the intermediate interconnection 83 is preferably set not more than 20 nm.

As the intermediate interconnection 83, a stacked film may be used as well as the single-layer film described above. The stacked film may have, for example, a stacked configuration of the following layers: a layer including a metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V) or an alloy including two or more metals selected from the group; and a copper (Cu) layer stacked at least on one side of the layer.

In addition, the stacked film used as the intermediate interconnection 83 may have, for example, a stacked configuration including a first layer and a second layer stacked at least on one side of the first layer. The first layer includes, for example, a metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V) or an alloy including two or more metals selected from the group. The second layer includes an oxide including at least one element selected from the group consisting of aluminum (Al), magnesium (Mg), titanium (Ti), iron (Fe), cobalt (Co), nickel (Ni), vanadium (V), chromium (Cr), tantalum (Ta), tungsten (W), and ruthenium (Ru).

As shown in FIG. 7A, FIG. 7B, FIG. 10A, and FIG. 10B, the embodiment includes a nonvolatile memory device including the magnetic element 112a or 113a of an example according to the second embodiment or the third embodiment and the control circuit unit 150. The operations mentioned above are performed by the control circuit unit 150. More specifically, in the read operation RO, the control circuit unit 150 passes the read current Ir having a larger value than the current flowing between the second conductive layer 82 and the intermediate interconnection 83 between the first conductive layer 81 and the intermediate interconnection 83. Furthermore, in the write operation WO in this example, the control circuit unit 150 passes a current (the write current Iw) between the first conductive layer 81 and the second conductive layer 82 via the intermediate interconnection 83.

Thus, in this example, the current mainly flows between the first conductive layer 81 and the second conductive layer 82 in the write operation WO, and the current mainly flows between the intermediate interconnection 83 and the first conductive layer 81 in the read operation RO.

Fourth Embodiment

Figure 11A:
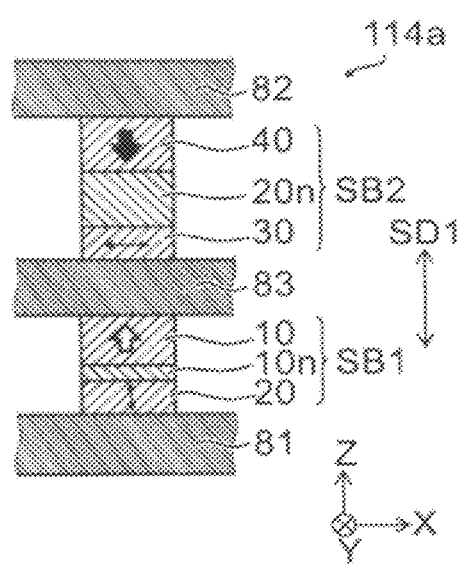
FIG. 11A and FIG. 11B are schematic cross-sectional views showing magnetic elements according to a fourth embodiment.
Figure 11B:
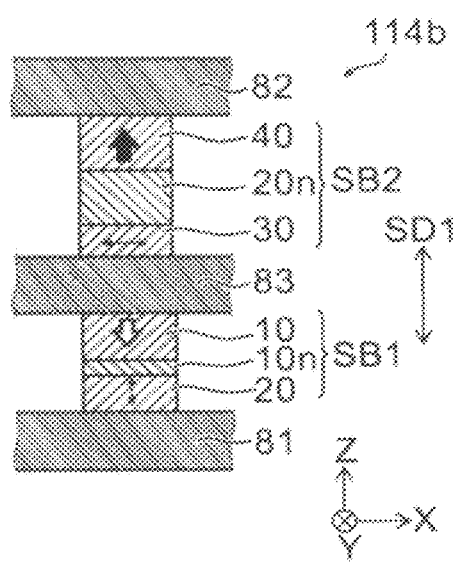

FIG. 11A and FIG. 11B are schematic cross-sectional views illustrating the configurations of magnetic elements according to a fourth embodiment.

As shown in FIG. 11A and FIG. 11B, in magnetic elements 114a and 114b according to the embodiment, the fourth ferromagnetic layer 40, the second nonmagnetic layer 20n, the third ferromagnetic layer 30, the intermediate interconnection 83, the first ferromagnetic layer 10, the first nonmagnetic layer 10n, and the second ferromagnetic layer 20 are stacked in this order. Also in this case, the directions of the magnetization of the first ferromagnetic layer 10 and the magnetization of the fourth ferromagnetic layer 40 may be oblique to the film surface.

In the magnetic elements 114a and 114b, the direction of the perpendicular oblique shadow component of the magnetization fixed in the first direction and the direction of the perpendicular oblique shadow component of the magnetization fixed in the second direction are opposite to each other.

Figure 12A:
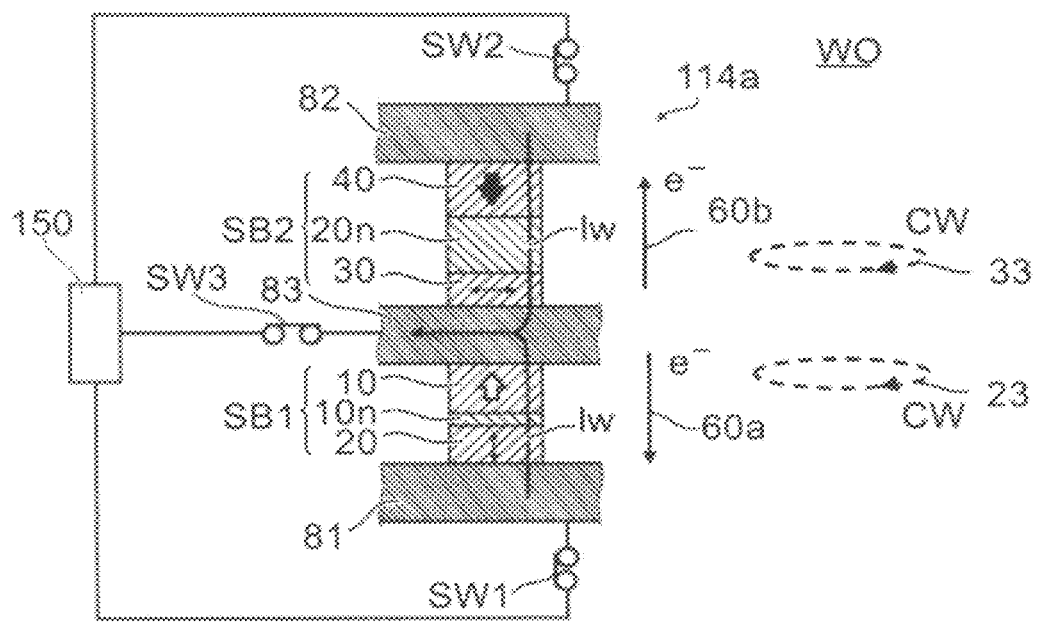
FIG. 12A and FIG. 12B are schematic views showing the operations of the magnetic element according to the fourth embodiment.
Figure 12B:
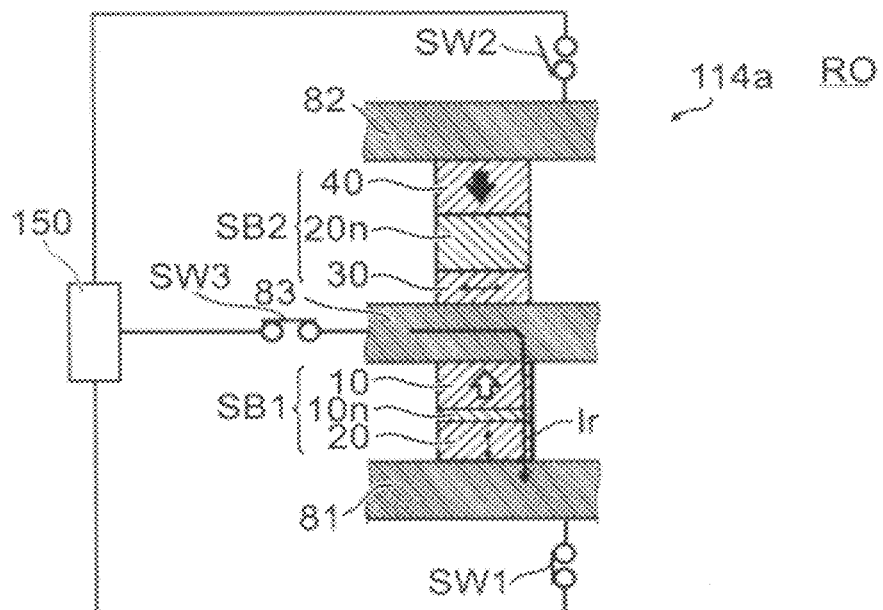

FIG. 12A and FIG. 12B are schematic views illustrating operations of the magnetic element according to the fourth embodiment.

FIG. 12A and FIG. 12B illustrate the write operation WO and the read operation RO, respectively, in the magnetic element 114a.

As shown in FIG. 12A, in the write operation WO, the first to third switches SW1 to SW3 are set in the ON state, and the write current Iw is passed between the intermediate interconnection 83 and the first conductive layer 81 and between the intermediate interconnection 83 and the second conductive layer 82. The direction of the write current Iw is arbitrary. For example, the electronic current 60a is passed in the direction from the intermediate interconnection 83 toward the first conductive layer 81, and the electronic current 60b is passed in the direction from the intermediate interconnection 83 toward the second conductive layer 82. The direction of the rotating magnetic field generated from the third ferromagnetic layer 30 and the direction in which the magnetization of the second ferromagnetic layer 20 precesses can be caused to coincide with each other.

In the magnetic element 114a (and 114b), the distance between the second ferromagnetic layer 20 and the third ferromagnetic layer 30 is shorter than that in the magnetic element 112a (and 112b). Thereby, the current necessary for writing to the second ferromagnetic layer 20 can be more reduced.

Furthermore, in the write operation WO of the magnetic elements 114a and 114b, it is also possible to pass a current while the third switch SW3 is set in the OFF state and the first switch SW1 and the second switch SW2 are set in the ON state. In this case, the direction of the spin polarization of the electron injected into the third ferromagnetic layer 30 is the same as that of the electron whose spin is polarized in the fourth ferromagnetic layer 40 and that of the electron whose spin is polarized in the first ferromagnetic layer 10. Therefore, the efficiency of the generation of the rotating magnetic field generated from the third ferromagnetic layer 30 improves. Furthermore, by applying a magnetic field in the direction opposite to the direction of the magnetization of the fourth ferromagnetic layer 40, the direction of the rotating magnetic field generated from the third ferromagnetic layer 30 and the direction in which the magnetization of the second ferromagnetic layer 20 precesses can be caused to coincide with each other.

As the intermediate interconnection 83, a metal conductor or semiconductor may be used. As the second nonmagnetic layer 20n, a metal conductor, insulator, or semiconductor may be used. Layers based on different materials may be used as the intermediate interconnection 83 and the second nonmagnetic layer 20n. In the case where a semiconductor is used as the intermediate interconnection 83, a metal conductor is preferably used as the second nonmagnetic layer 20n. Thereby, an increase in the resistance value can be suppressed. As the metal conductor, copper (Cu), aluminum (Al), silver (Ag), gold (Au), and the like are preferable.

As shown in FIG. 12B, the read operation RO in the magnetic element 114a is similar to that in the magnetic element 111. Thereby, false writing during reading is suppressed.

The operation in the magnetic element 114b is similar to that in the magnetic element 114a and a description is therefore omitted.

Fifth Embodiment

Figure 13A:
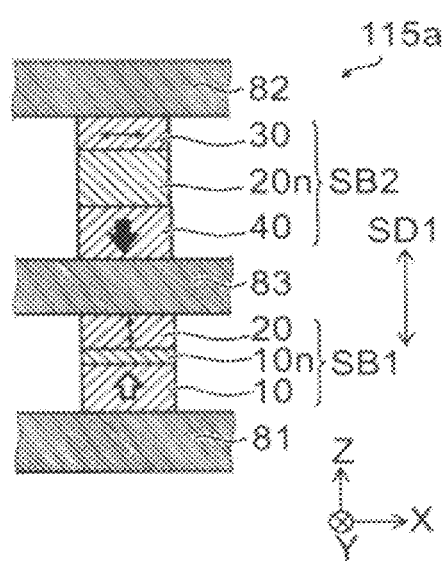
FIG. 13A and FIG. 13B are schematic cross-sectional views showing magnetic elements according to a fifth embodiment.
Figure 13B:
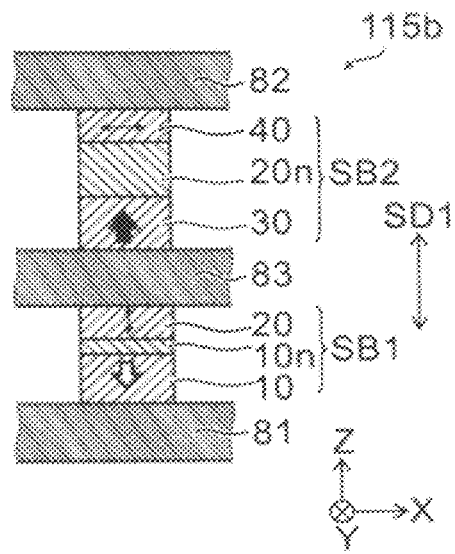

FIG. 13A and FIG. 13B are schematic cross-sectional views illustrating the configurations of magnetic elements according to a fifth embodiment.

As shown in FIG. 13A and FIG. 13B, in magnetic elements 115a and 115b according to the embodiment, the third ferromagnetic layer 30, the second nonmagnetic layer 20n, the fourth ferromagnetic layer 40, the intermediate interconnection 83, the second ferromagnetic layer 20, the first nonmagnetic layer 10n, and the first ferromagnetic layer 10 are stacked in this order. Also in this case, the directions of the magnetization of the first ferromagnetic layer 10 and the magnetization of the fourth ferromagnetic layer 40 may be oblique to the film surface.

In the magnetic elements 115a and 115b, the direction of the perpendicular oblique shadow component of the magnetization fixed in the first direction is opposite to the direction of the perpendicular oblique shadow component of the magnetization fixed in the second direction.

Figure 14A:
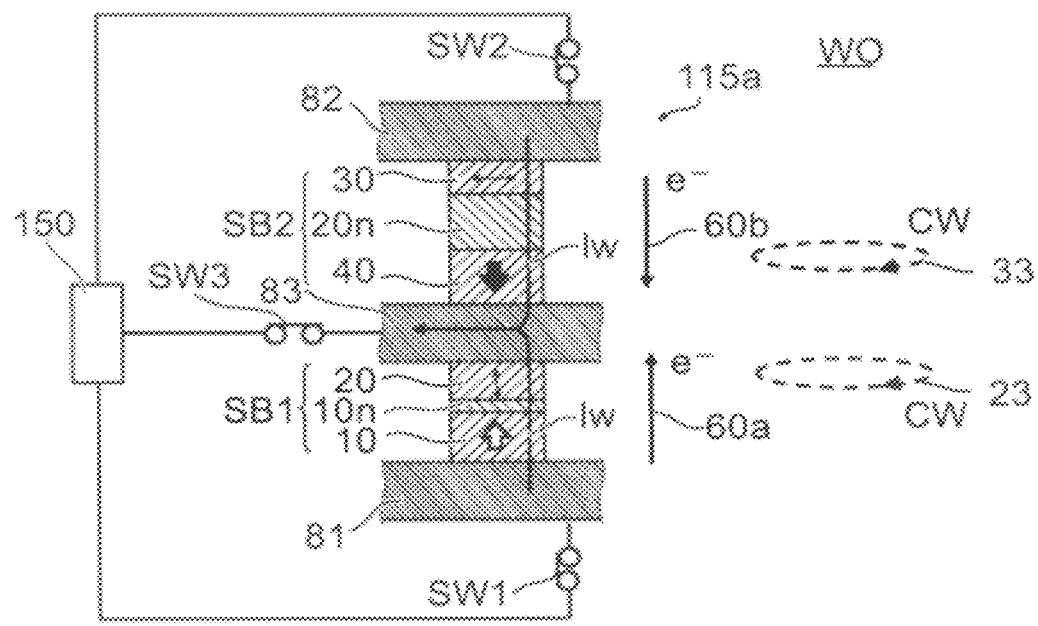
FIG. 14A and FIG. 14B are schematic views showing the operations of the magnetic element according to the fifth embodiment.
Figure 14B:
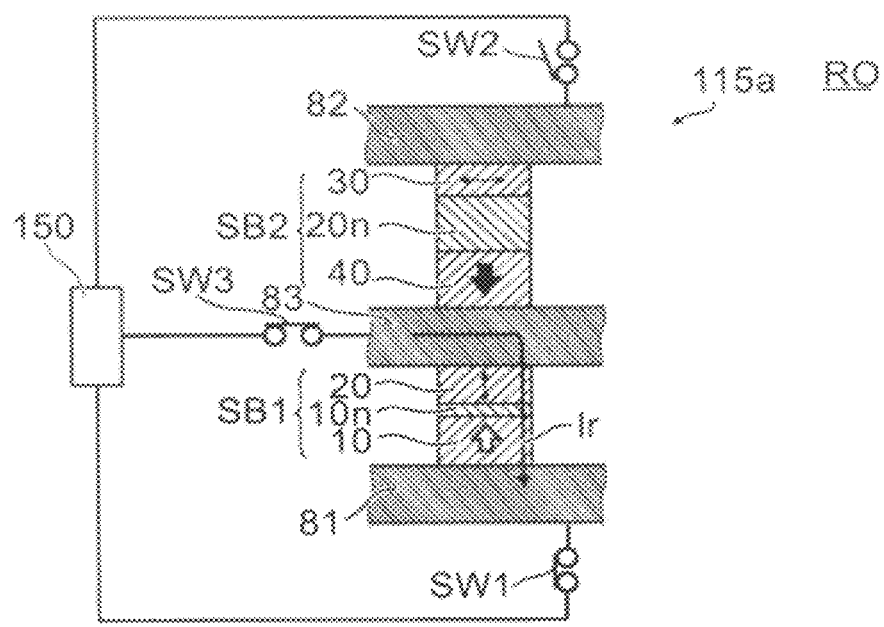

FIG. 14A and FIG. 14B are schematic views illustrating operations of the magnetic element according to the fifth embodiment.

FIG. 14A and FIG. 14B illustrate the write operation WO and the read operation RO, respectively, in the magnetic element 115a.

As shown in FIG. 14A, in the write operation WO, the first to third switches SW1 to SW3 are set in the ON state, and the write current Iw is passed between the intermediate interconnection 83 and the first conductive layer 81 and between the intermediate interconnection 83 and the second conductive layer 82. The direction of the write current Iw is arbitrary. The direction of the rotating magnetic field generated from the third ferromagnetic layer 30 and the direction in which the magnetization of the second ferromagnetic layer 20 precesses can be caused to coincide with each other.

In the magnetic element 115a (and 115b), the distance between the second ferromagnetic layer 20 and the third ferromagnetic layer 30 is shorter than that in the magnetic element 112a (and 112b). Thereby, the current necessary for writing to the second ferromagnetic layer 20 can be more reduced.

Furthermore, in the write operation WO of the magnetic elements 115a and 115b, it is also possible to pass a current while the third switch SW3 is set in the OFF state and the first switch SW1 and the second switch SW2 are set in the ON state. Also in this case, the direction of the spin polarization of the electron injected into the third ferromagnetic layer 30 is the same as that of the electron whose spin is polarized in the fourth ferromagnetic layer 40 and the direction of the electron whose spin is polarized in the first ferromagnetic layer 10. Therefore, the efficiency of the generation of the rotating magnetic field generated from the third ferromagnetic layer 30 improves. Furthermore, by applying a magnetic field in the direction opposite to the direction of the magnetization of the fourth ferromagnetic layer 40, the direction of the rotating magnetic field generated from the third ferromagnetic layer 30 and the direction in which the magnetization of the second ferromagnetic layer 20 precesses can be caused to coincide with each other. Also in this operation, since the distance between the second ferromagnetic layer 20 and the third ferromagnetic layer 30 is shorter than that of the magnetic element 112a (and 112b), the current necessary for writing can be more reduced.

As the intermediate interconnection 83, a metal conductor or semiconductor may be used. As the second nonmagnetic layer 20n, a metal conductor, insulator, or semiconductor may be used. Layers based on different materials may be used as the intermediate interconnection 83 and the second nonmagnetic layer 20n. In the case where a semiconductor is used as the intermediate interconnection 83, a metal conductor is preferably used as the second nonmagnetic layer 20n. Thereby, an increase in the resistance value can be suppressed. As the metal conductor, copper (Cu), aluminum (Al), silver (Ag), gold (Au), and the like are preferable.

As shown in FIG. 14B, the read operation RO in the magnetic element 115a is similar to that in the magnetic element 111. Thereby, false writing during reading is suppressed.

The operation in the magnetic element 115b is similar to that in the magnetic element 114a and a description is therefore omitted.

As shown in FIG. 12A, FIG. 12B, FIG. 14A, and FIG. 14B, the embodiment includes a nonvolatile memory device including the magnetic element 114a or 115a of an example according to the fourth embodiment or the fifth embodiment and the control circuit unit 150. The operations mentioned above are performed by the control circuit unit 150. More specifically, in the read operation RO, the control circuit unit 150 passes the read current Ir having a larger value than the current flowing between the second conductive layer 82 and the intermediate interconnection 83 between the first conductive layer 81 and the intermediate interconnection 83. In the write operation WO in this example, the control circuit unit 150 passes a current (the write current Iw) between the first conductive layer 81 and the intermediate interconnection 83 and between the second conductive layer 82 and the intermediate interconnection 83.

FIG. 15A to FIG. 15F are schematic views illustrating the configuration of a magnetic element according to the embodiment.

Figure 15A:
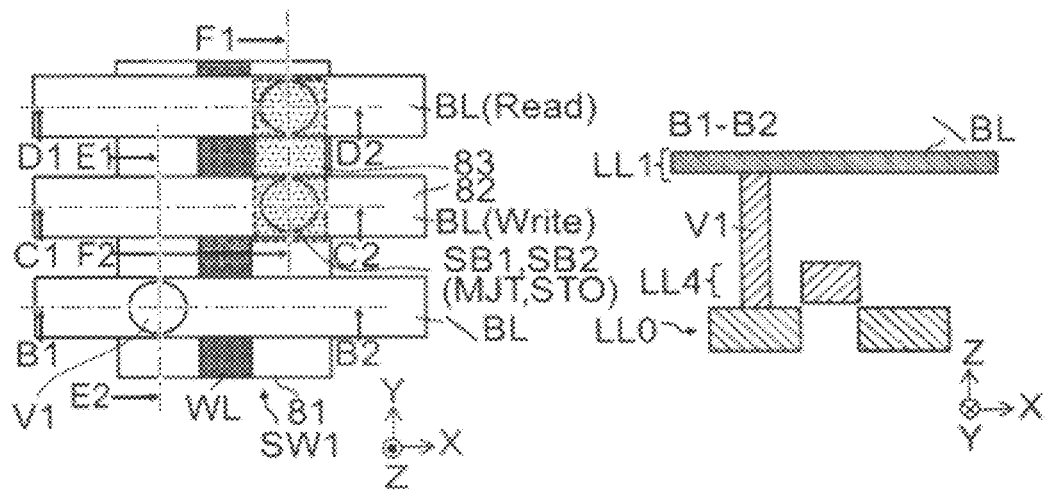
Figure 15C:
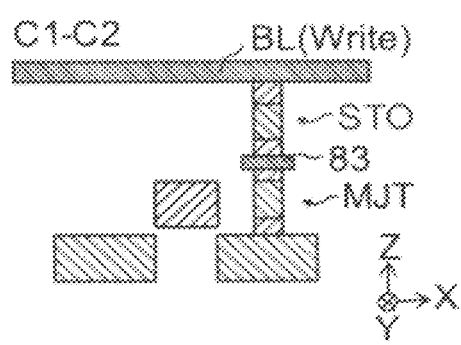
Figure 15D:
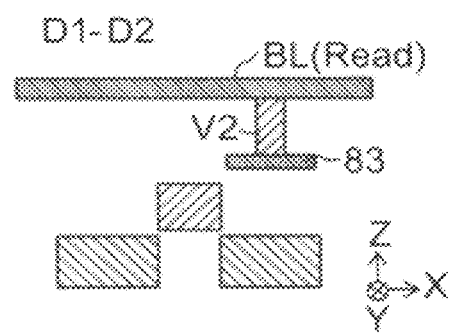
Figure 15E:
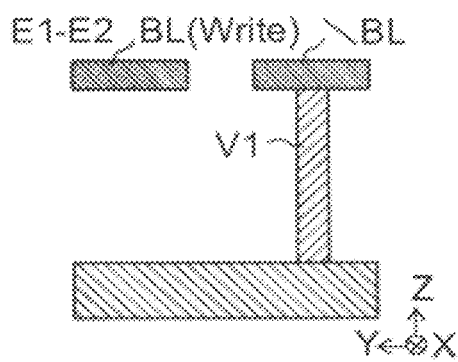

FIG. 15A is a schematic plan view. FIG. 5B to FIG. 5F are cross-sectional views taken along line B1-B2, C1-C2, D1-D2, E1-E2, and F1-F2 of FIG. 15A, respectively. The drawings illustrate an example of the structure of the magnetic element according to the first to fifth embodiments. For easier viewing, conductive portions are illustrated and the insulating portions and the semiconductor portions are omitted in the drawings.

Hereinbelow, the first stacked unit SB1 may be referred to as "MTJ" and the second stacked unit SB2 may be referred to as "STO," as appropriate.

Figure 15F:
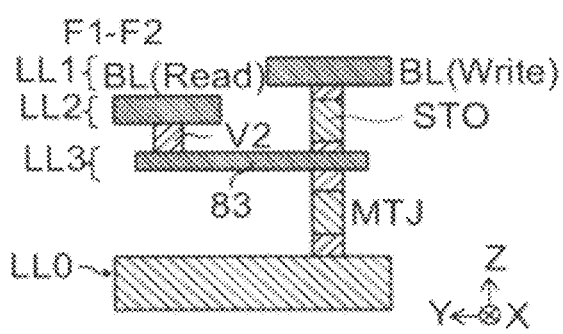

As shown in FIG. 15B and FIG. 15F, in this example, a first interconnection layer LL1, a second interconnection layer LL2, a third interconnection layer LL3, and a fourth interconnection layer LL4 are provided on a semiconductor layer LL0 (e.g. a semiconductor substrate). The fourth interconnection layer LL4 is provided between the first interconnection layer LL1 and the semiconductor layer LL0, the third interconnection layer LL3 is provided between the first interconnection layer LL1 and the fourth interconnection layer LL4, and the second interconnection layer LL2 is provided between the first interconnection layer LL1 and the third interconnection layer LL3. However, the embodiment is not limited thereto but the configuration of the interconnection layers is arbitrary.

As shown in FIG. 15A to FIG. 15F, a bit interconnection for reading BL(Read), a bit interconnection for writing BL(Write), a bit interconnection bar \BL, and a word line WL(Gate) are provided. In this example, the bit interconnection for reading BL(Read) is, for example, a third bit interconnection, the bit interconnection for writing BL(Write) is, for example, a second bit interconnection, and the bit interconnection bar \BL is, for example, a first bit interconnection. In the embodiment, it is assumed that one bit line includes the first bit interconnection, the second bit interconnection, and the third bit interconnection. Such a bit line is provided in plural. The extending direction of the word line WL(Gate) intersects with the extending direction of the bit line mentioned above. The extending direction of the first bit interconnection is parallel to the extending direction of the second bit interconnection and the extending direction of the third bit interconnection, for example.

The bit interconnection for reading BL(Read) is provided in the second interconnection layer LL2, for example. The bit interconnection for writing BL(Write) and the bit interconnection bar \BL are provided in the first interconnection layer LL1, for example. The word line WL(Gate) is provided in the fourth interconnection layer LL4, for example.

The extending direction of the word line WL intersects with (in this example, is orthogonal to) the extending direction of the bit interconnection for writing BL(Write) and the extending direction of the bit interconnection bar \BL. The word line WL extends along, for example, the Y-axis. The bit interconnection for writing BL(Write) and the bit interconnection bar \BL extend along, for example, the X-axis.

The first switch SW1 is connected to the MTJ. An FET is used as the first switch SW1. The first switch SW1 includes a source, a drain, and a gate. The source and the drain extend along the Y-axis. The direction from the source to the drain lies along the X-axis, for example. An insulating film (not shown) is provided on a semiconductor layer (not shown) between the source and the drain, and the gate is provided on the insulating film.

One end (the lower end) of the MTJ is connected to the drain. The source is connected to the bit interconnection bar \BL via a via for a source V1. The other end (the upper end) of the MTJ is connected to the intermediate interconnection 83. One end (the lower end) of the STO is connected to the intermediate interconnection 83. The other end (the upper end) of the STO is connected to the bit interconnection for writing BL(Write).

The intermediate interconnection 83 is provided in the third interconnection layer LL3. The intermediate interconnection 83 is connected to the bit interconnection for reading BL(Read) via a via for an intermediate interconnection V2.

The operations described in regard to the first to fifth embodiments can be performed by such a configuration.

The intermediate interconnection 83 takes also the role of a spacer connecting the magnetic memory unit and the magnetic field generation source. In the case where a spin torque is transferred between the magnetic memory unit and the magnetic field generation source, a single-layer film of Ti, a single-layer film of Ta, and a stacked film of a Ti film and a Ta film, for example, may be used as the intermediate interconnection 83. On the other hand, in the case where the intermediate interconnection 83 is configured not to allow a spin torque to be transferred, a stacked film including a Ru film, for example, may be used as the intermediate interconnection 83.

A method for manufacturing a magnetic element according to the embodiment will now be described using the magnetic element 112a. The following manufacturing method, however, is applied to the magnetic elements according to the first to fifth embodiments described above, magnetic elements modified based on them, and the like with appropriate alteration of the order of processes.

In the following description, "material A\material B" means that material B is stacked on material A.

A lower electrode (not shown) is formed on a wafer, and then the wafer is set in an ultrahigh vacuum sputter apparatus. On the lower electrode, a Ta\Ru layer that forms the magnetic memory unit (a contact layer for contact with an electrode, also functioning as a stopper layer), an FePd\CoFeB layer (the second ferromagnetic layer 20), a MgO layer (the first nonmagnetic layer 10n), a CoFeB\FePt layer (the first ferromagnetic layer 10), and Ru (a cap layer) are stacked in this order. Thereby, a workpiece is formed. Here, the strength of the magnetic anisotropy in the perpendicular direction to the film surface of the FePd\CoFeB layer and the CoFeB\FePt layer can be adjusted by annealing in a magnetic field as well.

Next, EB (electron beam) lithography is performed to form a resist mask with a diameter of 20 nm. Ion milling is performed to remove the portions not covered with the resist of the workpiece until the Ta layer also functioning as a stopper layer becomes exposed.

Next, an insulator film, such as $SiO_2$ or $SiN_x$, is deposited in order to perform interlayer insulating on the magnetic memory unit. Planarization is performed by CMP (chemical mechanical polishing) or the like, and then RIE (reactive ion etching) or the like is performed to etch the entire surface to expose the cap layer.

Next, the wafer is set in an ultrahigh vacuum sputter apparatus and a Ta\Ru\Ta layer (a layer that forms the intermediate interconnection 83) is stacked.

Photolithography is used to perform patterning so that the position of the intermediate interconnection 83 may be covered with a photoresist. Ion milling is performed to remove the portions not covered with the photoresist to form the intermediate interconnection 83. Further, a $SiO_2$ film is deposited in order to perform interlayer insulating, and then the photoresist and the $SiO_2$ film on the intermediate interconnection 83 are lifted off.

Next, the wafer is set in an ultrahigh vacuum sputter apparatus and an FePt\CoFeB\Cu\permalloy (Py) layer (the magnetic field generation source) and a Ta layer (a contact layer) thereon are stacked in this order.

Next, EB lithography is performed to form a resist mask with a diameter of 20 nm so that the resist mask may be disposed on the magnetic memory unit having been previously formed. Ion milling is performed to remove the portions not covered with the resist to form the magnetic field generation source.

Next, a $SiO_2$ film is deposited in order to perform interlayer insulating on the magnetic field generation source and the contact layer for contact with an electrode. Planarization is performed by CMP (chemical mechanical polishing) or the like, and then RIE (reactive ion etching) or the like is performed to etch the entire surface to expose the contact layer.

Further, photolithography is used to perform patterning so that a photoresist may not cover the position of the via (the position of the via for a source V1 and the position of the via for an intermediate interconnection V2). RIE is performed to etch the portions not covered with the photoresist until the intermediate interconnection 83 becomes exposed, and the via is thus formed. Then, the photoresist is removed.

Next, the wafer is set in an ultrahigh vacuum sputter apparatus and a Ti\Al\Ti layer that forms an upper electrode is stacked.

Next, photolithography is used to form a photoresist mask of the pattern of the upper electrode, and RIE is performed to remove the portions not covered with the photoresist of the Ti\Al\Ti layer. This upper interconnection electrode is laid out in such a pattern as includes an interconnection portion (the bit interconnection for reading BL(Read)) connected to the intermediate interconnection 83 via the via and an interconnection portion (the bit interconnection for writing BL(Write)) connected to the exposed contact layer.

Thus, a magnetic element having the structure illustrated in FIG. 15A to FIG. 15F is fabricated.

Sixth Embodiment

Figure 16A:
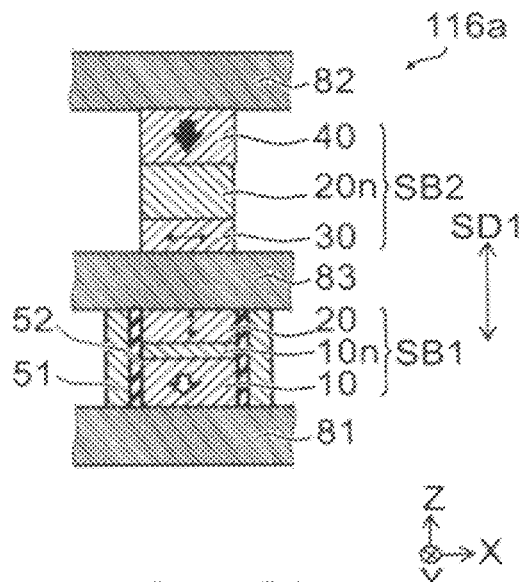
FIG. 16A to FIG. 16C are schematic cross-sectional views showing magnetic elements according to a sixth embodiment.
Figure 16B:
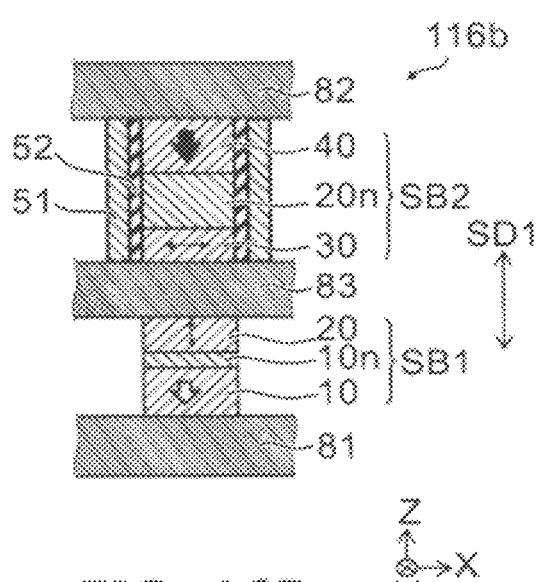
Figure 16C:
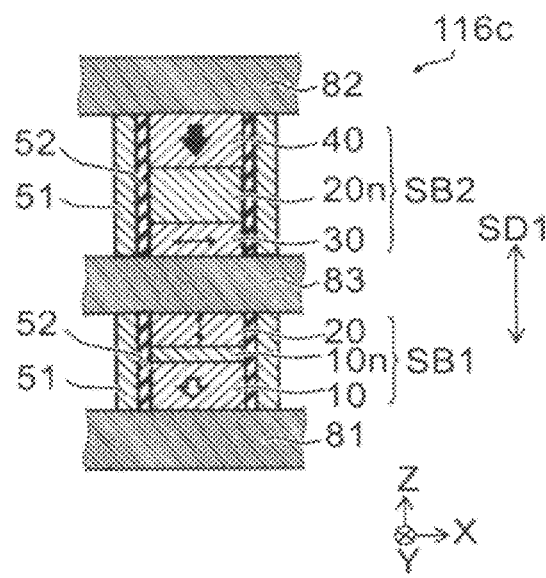

FIG. 16A to FIG. 16C are schematic cross-sectional views illustrating the configurations of magnetic elements according to a sixth embodiment.

As shown in FIG. 16A, in a magnetic element 116a according to the embodiment, a magnetic shield 51 opposed to the side surface of the first stacked unit SB1 is provided.

As shown in FIG. 16B, in a magnetic element 116b according to the embodiment, the magnetic shield 51 opposed to the side surface of the second stacked unit SB2 is provided.

As shown in FIG. 16C, in a magnetic element 116c according to the embodiment, the magnetic shield 51 opposed to the side surface of the first stacked unit SB1 and the side surface of the second stacked unit SB2 is provided.

That is, the magnetic elements 116a to 116c further include the magnetic shield 51 opposed to at least one of the side surface of the first stacked unit SB1 and the side surface of the second stacked unit SB2.

In addition, the magnetic elements 116a to 116c further include a protection layer 52 provided between the above-mentioned at least one of the side surface of the first stacked unit SB1 and the side surface of the second stacked unit SB2 and the magnetic shield 51.

For example, the side surface of the first stacked unit SB1 and the side surface of the second stacked unit SB2 are covered with the magnetic shield 51 such as a permalloy (Py) via the protection layer 52 such as, for example, SiN or $Al_2O_3$.

Thereby, in the case where a plurality of magnetic elements are arranged, the possibility is decreased that the stray magnetic field from an adjacent magnetic element affects the operation of the first stacked unit SB1 and the second stacked unit SB2. Thereby, the current injection amount necessary to generate the rotating magnetic field can be reduced. Furthermore, the possibility can be decreased that the stray magnetic field from the first stacked unit SB1 and the second stacked unit SB2 acts on an adjacent magnetic element. As a consequence, the plurality of magnetic elements can be closely arranged to improve the integration degree.

As the protection layer 52, an oxide, nitride, or fluoride including at least one element selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe) may be used.

As the magnetic shield 51, a metal selected from the group consisting of iron (Fe), cobalt (Co), nickel (Ni), manganese (Mn), and chromium (Cr) or an alloy including two or more metals selected from the group may be used.

In addition, as the magnetic shield 51, an alloy including at least one metal selected from the group consisting of iron (Fe), cobalt (Co), nickel (Ni), manganese (Mn), and chromium (Cr) and at least one metal selected from the group consisting of platinum (Pt), palladium (Pd), iridium (Ir), ruthenium (Ru), and rhodium (Rh) may be used.

The characteristics of the magnetic shield 51 can be adjusted by the composition of the magnetic material included in the magnetic shield 51 and heat treatment. Furthermore, as the magnetic shield 51, an amorphous alloy of rare earth-transition metal such as TbFeCo and GdFeCo may be used. Furthermore, a stacked structure such as Co/Pt, Co/Pd, and Co/Ni may be used as the magnetic shield 51.

The magnetic shield 51 (and the protection layer 52) mentioned above may be provided also in the magnetic elements described in regard to the first to fifth embodiments and magnetic elements modified based on them.

Furthermore, although not shown in FIG. 16A to FIG. 16C, the magnetic shield 51 may be opposed to at least part of the intermediate interconnection 83. The magnetic shield 51 may cover at least part of the intermediate interconnection 83. In this case, the protection layer 52 may be provided between the magnetic shield 51 and the intermediate interconnection 83.

A method for fabricating a magnetic element according to the sixth embodiment will now be described. In the following, a method for manufacturing the magnetic element 116b is described.

A lower electrode (not shown) is formed on a wafer, and then the wafer is set in an ultrahigh vacuum sputter apparatus. Next, on the lower electrode, a Ta\Ru layer (a contact layer for contact with an electrode, also functioning as a stopper layer), an FePd\CoFeB layer (the second ferromagnetic layer 20), a MgO layer (the first nonmagnetic layer 10n), CoFeB\FePt layer (the first ferromagnetic layer 10), and Ru (a cap layer) are stacked in this order. Here, the strength of the magnetic anisotropy in the perpendicular direction to the film surface of the FePd\CoFeB layer and the CoFeB\FePt layer can be adjusted by annealing in a magnetic field as well.

Next, EB lithography is performed to form a resist mask with a diameter of 20 nm. Ion milling is performed to remove the portions not covered with the resist until the Ta layer also functioning as a stopper layer on the lower electrode becomes exposed.

Next, an insulator film, such as $SiO_2$ or $SiN_x$, is deposited in order to perform interlayer insulating on the magnetic memory unit. Planarization is performed by CMP (chemical mechanical polishing) or the like, and then RIE (reactive ion etching) or the like is performed to etch the entire surface to expose the cap layer.

Next, the wafer is set in an ultrahigh vacuum sputter apparatus and a Ru layer (the intermediate interconnection 83) is stacked.

Photolithography is used to perform patterning so that the position of the intermediate interconnection 83 may be covered with a photoresist. Ion milling is performed to remove the portions not covered with the photoresist. A $SiO_2$ film is deposited in order to perform interlayer insulating, and then the photoresist and the $SiO_2$ film on the intermediate interconnection 83 are lifted off.

Next, the wafer is set in an ultrahigh vacuum sputter apparatus and an FePt\CoFeB\Cu\Py layer (the magnetic field generation source) and a Ta layer (a contact layer for contact with an electrode) thereon are stacked in this order.

Next, EB lithography is performed to form a resist mask with a diameter of 20 nm. Ion milling is performed to remove the portions not covered with the resist. Subsequently, a SiN layer is formed as the protection layer 52, and then a Py layer functioning as the magnetic shield 51 is formed. Etchback is performed to leave the Py layer on the side wall of the magnetic element.

Next, a $SiO_2$ film is deposited in order to perform interlayer insulating on the magnetic element, then planarization is performed by CMP or the like, and then RIE or the like is performed to etch the entire surface to expose the contact layer for contact with an electrode.

Further, photolithography is used to perform patterning so that a portion not covered with the photoresist may be created in the position of the via. Ion milling is performed to remove the portions not covered with the photoresist, and the photoresist is removed.

Further, a resist is applied to the entire surface of the workpiece, and a stepper exposure apparatus is used to perform patterning on the resist so that a portion not covered with the resist may be created in the positions of the via and an upper electrode. The openings corresponding to the via and the upper electrode are filled with Cu to form a film, and the resist is removed. The upper electrode is provided with a not-shown interconnection to enable electrical input and output.

Seventh Embodiment

Figure 17A:
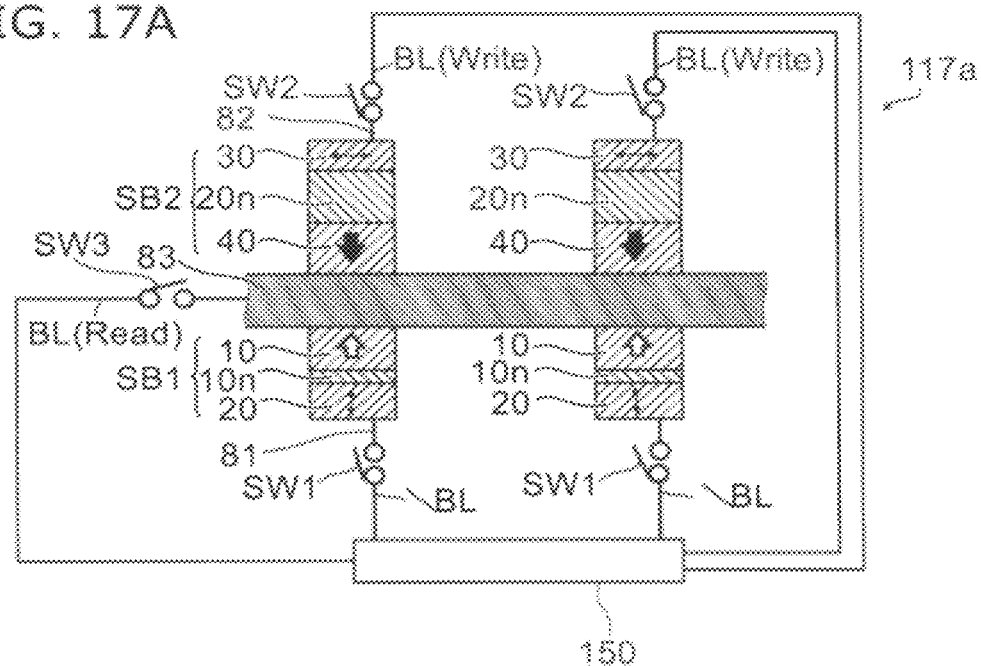
FIG. 17A and FIG. 17B are schematic views showing magnetic elements according to a seventh embodiment.
Figure 17B:
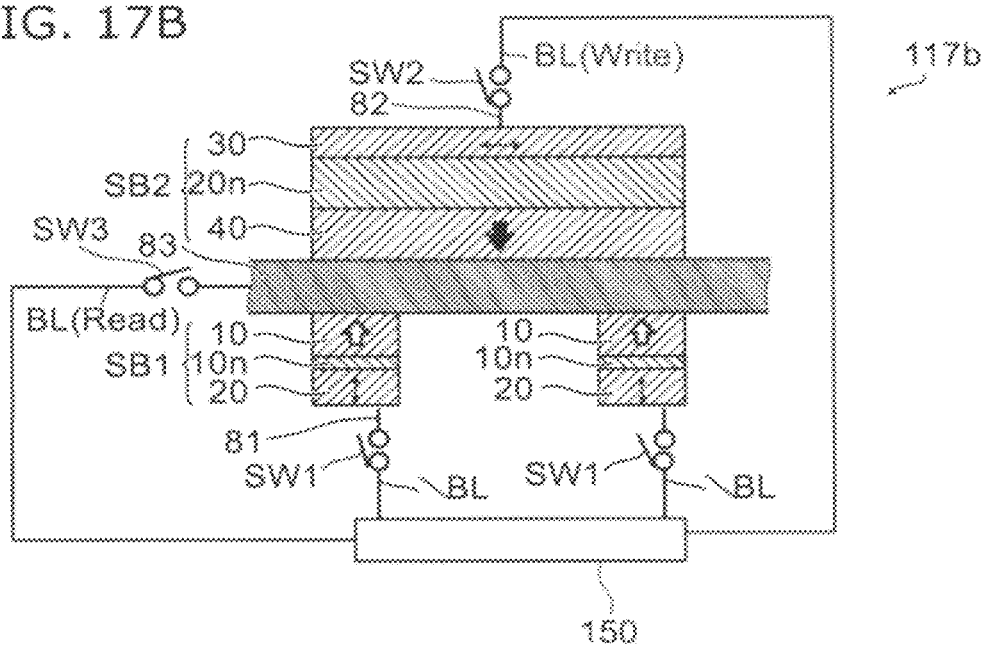

FIG. 17A and FIG. 17B are schematic views illustrating the configurations of magnetic elements according to a seventh embodiment.

As shown in FIG. 17A, a plurality of magnetic elements are provided in a magnetic element 117a according to the embodiment. In this example, the intermediate interconnection 83 is shared between the plurality of magnetic elements. That is, in a structure in which the magnetic memory unit (the first stacked unit SB1) is connected to the magnetic field generation source (the second stacked unit SB2) via the intermediate interconnection 83, the intermediate interconnection 83 may be shared between adjacent magnetic elements. That is, the intermediate interconnection 83 is connected between adjacent magnetic elements.

As shown in FIG. 17B, in a magnetic element 117b according to the embodiment, one magnetic field generation source is connected to two or more magnetic memory units (the first stacked units SB1) via the intermediate interconnection 83.

As shown in FIG. 17A and FIG. 17B, also in this case, the embodiment includes a nonvolatile memory device including the magnetic element 117a or 117b of an example according to the seventh embodiment and the control circuit unit 150. The control circuit unit 150 is directly or indirectly connected to the first conductive layer 81, the second conductive layer 82, and the intermediate interconnection 83 of each of the plurality of magnetic elements. The control circuit unit 150 performs the read operation RO and the write operation WO mentioned above.

As shown in FIG. 5A, FIG. 5B, FIG. 7A, FIG. 7B, FIG. 10A, FIG. 10B, FIG. 12A, FIG. 12B, FIG. 14A, FIG. 14B, FIG. 17A, and FIG. 17B, the nonvolatile memory device according to the embodiment may further include a transistor (e.g. the first to third transistors, e.g. the first to third switches SW1 to SW3) directly or indirectly connected at least one of between the first conductive layer 81 and the control circuit unit 150, between the second conductive layer 82 and the control circuit unit 150, and between the intermediate interconnection 83 and the control circuit unit 150.

According to the first to seventh embodiments, the intermediate interconnection 83 is provided between the magnetic memory unit and the magnetic field generation source. Thereby, in the write operation WO, by passing a current through the magnetic field generation source, a rotating magnetic field oscillates from the magnetic field generation source to assist writing to the magnetic memory unit. In the read operation RO, by passing no current through the magnetic field generation source, the generation of a rotating magnetic field from the magnetic field generation source is prevented and false writing can be suppressed.

Specific examples of the embodiment will now be described with reference to the drawings.

Figure 18A:
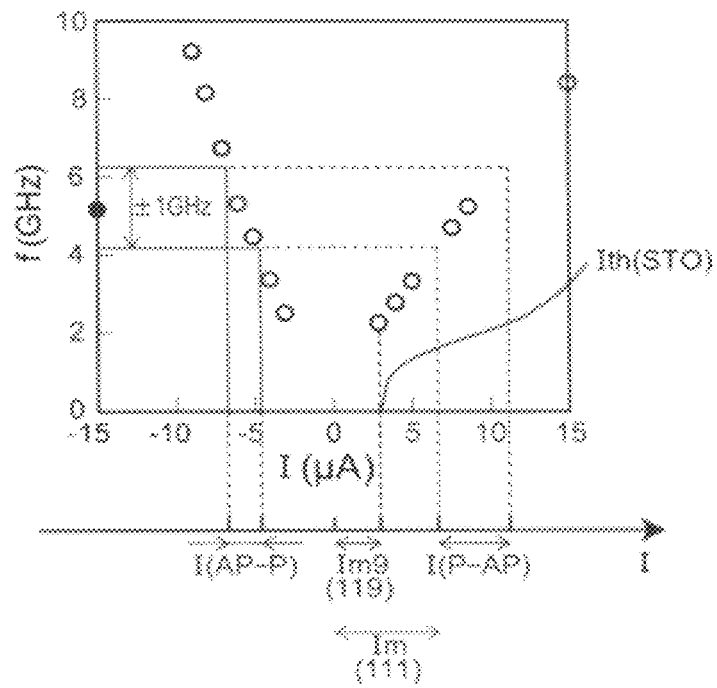
FIG. 18A to FIG. 18C are graphs showing the characteristics of a magnetic element according to a first specific example.
Figure 18B:
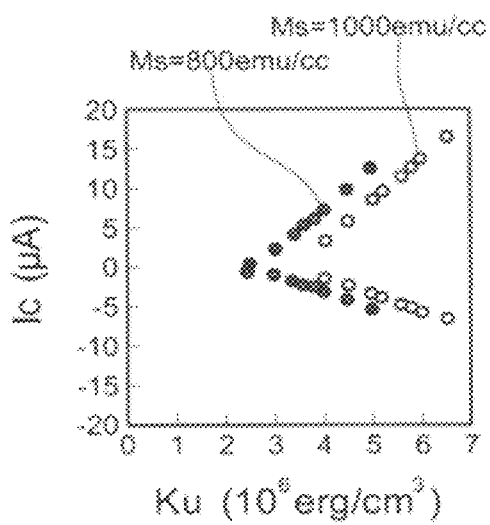
Figure 18C:
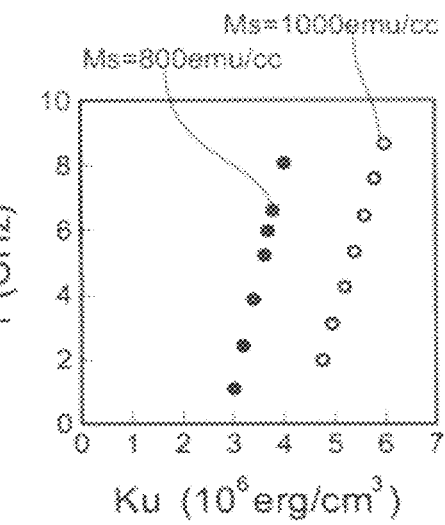

FIG. 18A to FIG. 18C are graphs illustrating characteristics of a magnetic element according to a first specific example.

FIG. 18A illustrates characteristics of the magnetic field generation source, and FIG. 18B illustrates characteristics of the magnetic memory unit.

FIG. 18A illustrates an example of the result of a simulation using micromagnetics in regard to the magnetic field generation source in the magnetic element 111 illustrated in FIG. 1A. The magnetic field generation source in this example has a pillar shape with a diameter of 20 nm. The fourth ferromagnetic layer (thickness: 8 nm) is a perpendicular magnetic film of Ms (saturated magnetization)=1000 emu/cc and Ku (magnetic anisotropy energy)=8 Merg/cm$^3$. The second nonmagnetic layer 20n is a Cu layer (thickness: 8 nm). The third ferromagnetic layer 30 (thickness: 3 nm) is an in-plane magnetic film of Ms=800 emu/cc and Ku=5000 erg/cm$^3$. The spin polarization degree is 0.4 and the dumping constant is 0.01.

On the other hand, FIG. 18B and FIG. 18C illustrate characteristics of the magnetic memory unit.

The horizontal axis of FIG. 18A is the current I and the vertical axis is the frequency f. As shown in FIG. 18A, the margin Im9 of the read current in a magnetic element 119 of a reference example in which the read operation RO using the intermediate interconnection 83 is not performed is narrow. That is, the upper limit of the margin Im9 of the read current Ir is smaller than the threshold current Ith(STO) of the magnetic field generation source. In contrast, in the magnetic element 111 according to the embodiment in which the read operation RO is performed using the intermediate interconnection 83, the margin Im of the read current is wide.

Here, the read operation RO in the magnetic element 119 of the reference example is described. In the reference example, a current is passed between the first conductive layer 81 and the second conductive layer 82 to read the memory state of the magnetic memory unit.

Figure 19:
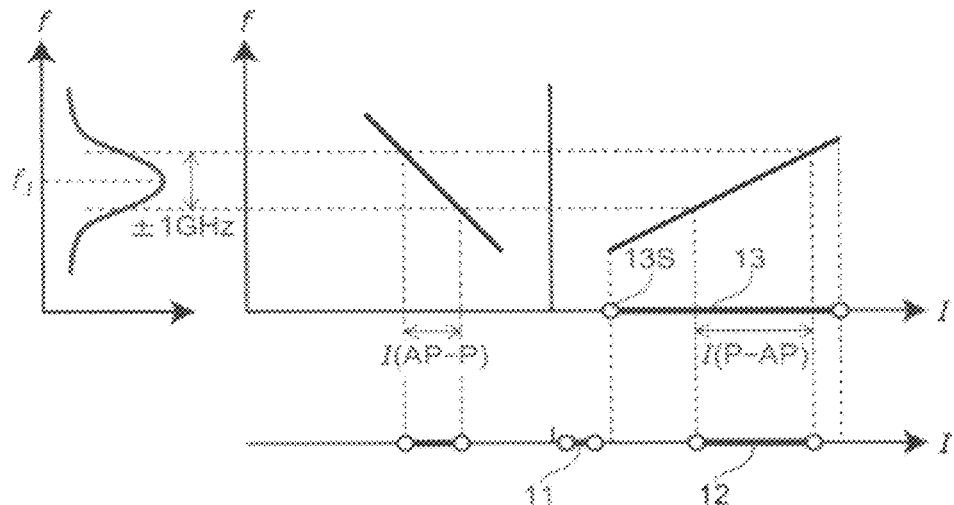
FIG. 19 is a graph showing the characteristics of the magnetic element.

FIG. 19 is a graph illustrating characteristics of the magnetic element.

The horizontal axis of FIG. 19 is the current flowing through the magnetic element, and the vertical axis is the frequency f.

As shown in FIG. 19, in the case where the rotating magnetic field from the magnetic field generation source is caused to act on the magnetic memory unit, the effect of the magnetization reversal being assisted appears when the difference between the frequency of the rotating magnetic field and the resonance frequency of the magnetic memory unit is within a range of ±1 GHz. Although the current range in oscillating the magnetic field generation source is I3-I3S, the operating current range is limited to I2 from the viewpoint of obtaining coincidence of the frequencies.

When a current is passed between the first conductive layer 81 and the second conductive layer 82 to read the memory state, such a current is used as does not cause a rotating magnetic field from the magnetic field generation source. From this viewpoint, the range of the read current is limited to I1 That is, the upper limit of the I1 is smaller than the threshold current of the magnetic field generation source.

On the other hand, in the embodiment, since a current is passed between the first conductive layer 81 and the intermediate interconnection 83, the read current is not limited to the range of I1.

Actually, as previously shown in FIG. 18A, it can be found out that the margin of the read current is greatly improved in the embodiment. The element configuration in this case is as follows. The second ferromagnetic layer 20 (thickness: 2 nm) is a perpendicular magnetic film of Ms=800 emu/cc and Ku=3.6 Merg/cm$^3$. The first nonmagnetic layer 10n is a MgO layer (thickness: 1 nm). The first ferromagnetic layer 10 (thickness: 8 nm) is a perpendicular magnetic film of Ms=1000 emu/cc and Ku=8 Merg/cm$^3$.

The embodiment provides a magnetic element in which the frequency of the rotating magnetic field is coincide with the resonance frequency of the magnetic memory unit in the operating current range to assist the magnetization reversal in both the case where the magnetization changes from parallel to antiparallel and the opposite case.

The result of a simulation of characteristics of a second specific example will now be described. The second specific example has the configuration of the magnetic element 112a illustrated in FIG. 6A. Also the magnetic element of this specific example has a pillar shape with a diameter of 20 nm. The second ferromagnetic layer 20 (thickness: 2 nm) is a perpendicular magnetic film of Ms=1000 emu/cc and Ku=5.2 Merg/cm$^3$. The first nonmagnetic layer 10n is an MgO layer (thickness: 1 nm). The first ferromagnetic layer 10 (thickness: 8 nm) is a perpendicular magnetic film of Ms=1000 emu/cc and Ku=8 Merg/cm$^3$. In this case, the resonance frequency is 4.2 GHz. The fourth ferromagnetic layer 40 (thickness: 8 nm) is a perpendicular magnetic film of Ms=1000 emu/cc and Ku=8 Merg/cm$^3$. The second nonmagnetic layer 20n is a Cu layer (thickness: 8 nm). The third ferromagnetic layer 30 (thickness: 3 nm) is an in-plane magnetic film of Ms=800 emu/cc and Ku=5000 erg/cm$^3$. Furthermore, also characteristics in the case where the Ms of the third ferromagnetic layer 30 is 1000 emu/cc were simulated. The magnetic field strength in the position of the second ferromagnetic layer 20 was simulated while changing the thickness of the intermediate interconnection 83.

Figure 20:
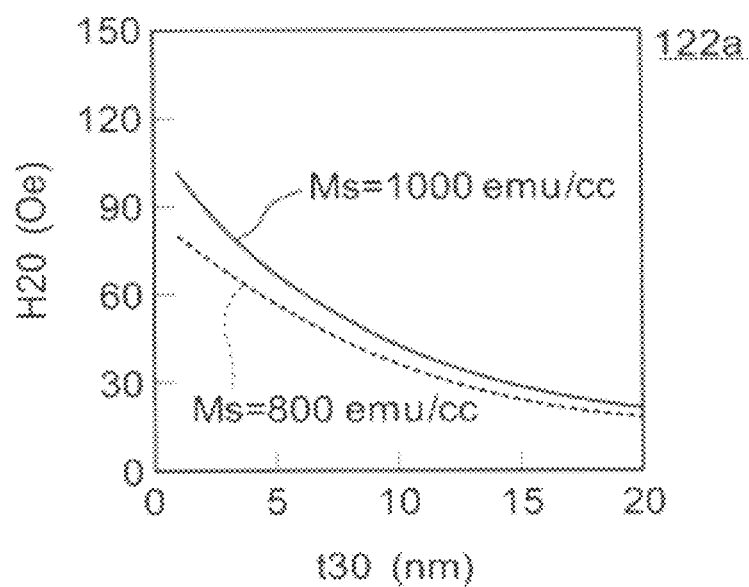
FIG. 20 is a graph showing the characteristics of the magnetic element according to a second specific example.

FIG. 20 is a graph illustrating characteristics of the magnetic element according to the second specific example.

The horizontal axis is the thickness t30 of the intermediate interconnection 83. The vertical axis is the strength (magnetic field strength H$_2$O) of the rotating magnetic field generated from the third ferromagnetic layer 30 and obtained in the position of the second ferromagnetic layer 20.

Here, the effect of the magnetization reversal being assisted appears when there is a rotating magnetic field of about 0.5% or more of the anisotropic magnetic field of the magnetic memory unit.

Figure 21:
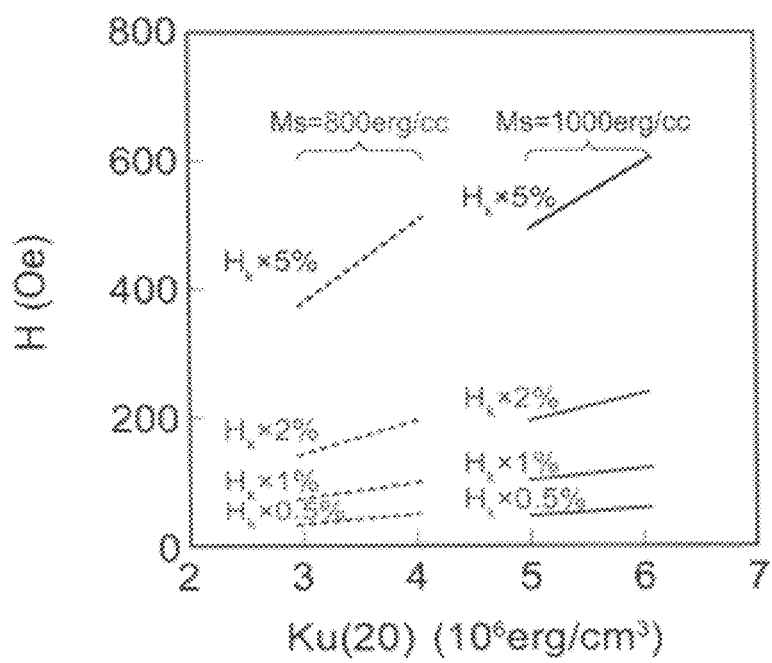
FIG. 21 is a graph showing the characteristics of the magnetic element.

FIG. 21 is a graph illustrating characteristics of the magnetic element.

FIG. 21 is a diagram showing the magnetic field strength H20 necessary for the assist effect to appear when the value of the magnetic anisotropy Ku(20) of the second ferromagnetic layer 20 is changed. The drawing shows magnetic field strengths of 0.5% to 5% of an anisotropic magnetic field Hk.

From FIG. 20 and FIG. 21, it is found out that, in the cases where the Ms of the third ferromagnetic layer 30 is 800 emu/cc and 1000 emu/cc, setting the thickness t30 of the intermediate interconnection 83 to about 1 nm provides a strength of 1% of the anisotropic magnetic field to assist the magnetization reversal. In the configuration of the second specific example, since the direction of the rotating magnetic field (the rotating magnetic field direction 33) and the direction of the magnetization rotation in the second ferromagnetic layer 20 (the precession direction 23) illustrated in FIG. 7A coincide with each other, the magnetization reversal occurs more efficiently than in the first specific example.

The result of a simulation of characteristics of a third specific example will now be described. The third specific example has the configuration of the magnetic element 113a illustrated in FIG. 9A. The shape and the configuration of each of the included layers (the configuration and material of the second ferromagnetic layer 20, the first nonmagnetic layer 10n, the first ferromagnetic layer 10, the fourth ferromagnetic layer 40, the second nonmagnetic layer 20n, and the third ferromagnetic layer 30) of the magnetic element of this specific example are similar to those of the second specific example. Also in this case, the Ms of the third ferromagnetic layer 30 is set to 800 emu/cc or 1000 emu/cc. The magnetic field strength in the position of the second ferromagnetic layer 20 was simulated while changing the thickness of the intermediate interconnection 83.

Figure 22:
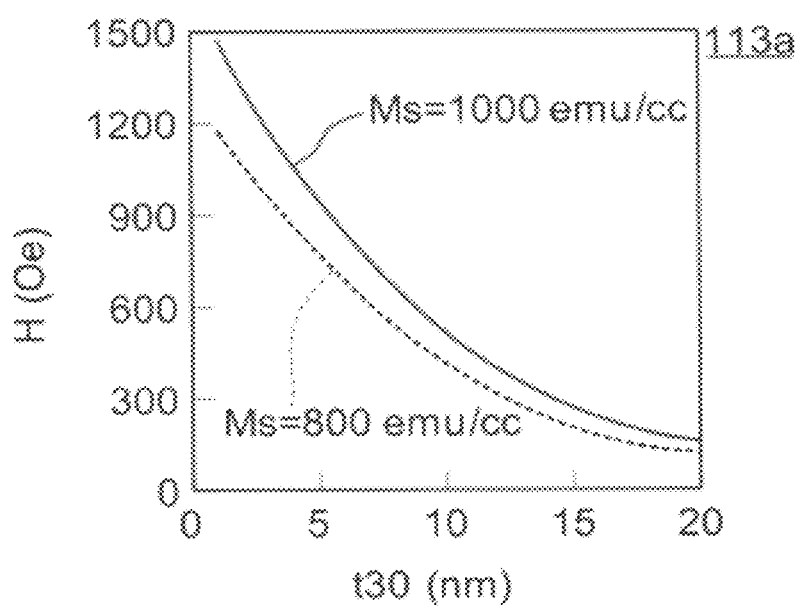
FIG. 22 is a graph showing the characteristics of the magnetic element according to a third specific example.

FIG. 22 is a graph illustrating characteristics of the magnetic element according to the third specific example.

As shown in FIG. 22, in the case where the Ms of the third ferromagnetic layer 30 is 800 emu/cc and Ku of the second ferromagnetic layer 20 is 3 Merg/cm$^3$ to 4 Merg/cm$^3$, by setting the thickness t30 of the intermediate interconnection 83 about not less than 8 nm and not more than 10 nm, a strength of 5% of the anisotropic magnetic field is obtained to assist the magnetization reversal.

As compared to the second specific example, the strength of the rotating magnetic field is greater in the third specific example. Thereby, the magnetization reversal is effectively assisted, and an increase in the reversal speed and the effect of reducing the reversal variation are obtained.

Furthermore, in the configuration of the third specific example, since the direction of the rotating magnetic field and the direction of the magnetization rotation in the second ferromagnetic layer 20 coincide with each other similarly to the second specific example (see FIG. 10A), the magnetization reversal occurs efficiently.

In the case where the Ms of the third ferromagnetic layer 30 is 1000 emu/cc and the Ku of the second ferromagnetic layer 20 is 5 Merg/cm$^3$ to 6 Merg/cm$^3$, by setting the thickness t30 of the intermediate interconnection 83 not less than 9 nm and not more than 12 nm, a strength of 5% of the anisotropic magnetic field is obtained to assist the magnetization reversal more effectively.

The result of a simulation of characteristics of a fourth specific example will now be described. The fourth specific example has the configuration of the magnetic element 114a illustrated in FIG. 1A. The shape, the size, and the configuration of each of the included layers of the magnetic element of this specific example are similar to those of the second specific example. Also in this case, the Ms of the third ferromagnetic layer 30 was set to 800 emu/cc or 1000 emu/cc. The magnetic field strength in the position of the second ferromagnetic layer 20 was simulated while changing the thickness of the intermediate interconnection 83.

Figure 23:
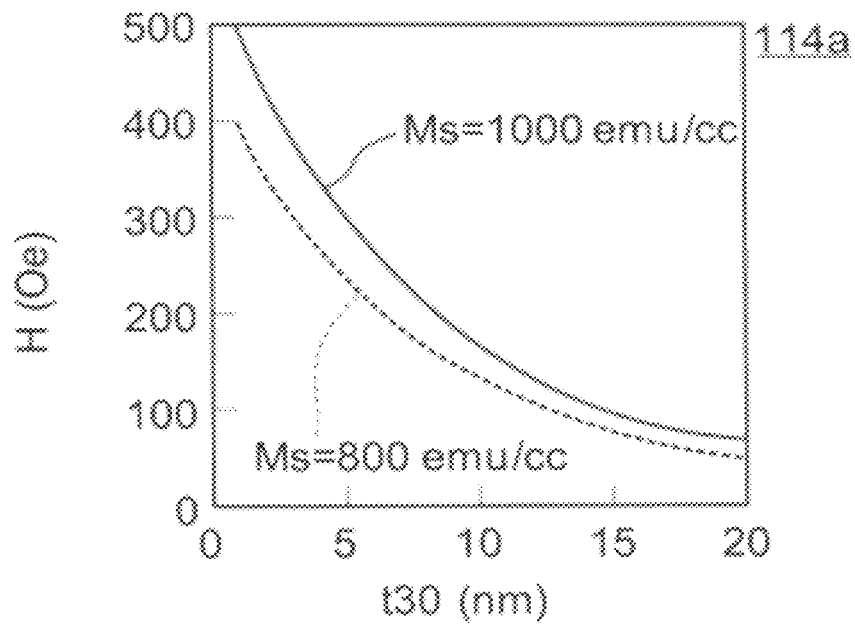
FIG. 23 is a graph showing the characteristics of the magnetic element according to a fourth specific example.

FIG. 23 is a graph illustrating characteristics of the magnetic element according to the fourth specific example.

As shown in FIG. 23, in the case where the Ms of the third ferromagnetic layer 30 is 800 emu/cc and the Ku of the second ferromagnetic layer 20 is 3 Merg/cm$^3$ to 4 Merg/cm$^3$, by setting the thickness t30 of the intermediate interconnection 83 not less than 6 nm and not more than 8 nm, a strength of 2% of the anisotropic magnetic field is obtained to assist the magnetization reversal.

As compared to the second specific example, the strength of the rotating magnetic field is greater in the fourth specific example. Thereby, the magnetization reversal is effectively assisted, and an increase in the reversal speed is obtained. In the case where the Ms of the third ferromagnetic layer 30 is 1000 emu/cc and the Ku of the second ferromagnetic layer 20 is 5 Merg/cm$^3$ to 6 Merg/cm$^3$, by setting the thickness of the intermediate interconnection 83 not less than 7 nm and not more than 8 nm, a strength of 2% of the anisotropic magnetic field is obtained to assist the magnetization reversal more effectively.

The result of a simulation of characteristics of a fifth specific example will now be described. The fifth specific example has the configuration of the magnetic element 115a illustrated in FIG. 13A. The shape, the size, and the configuration of each of the included layers of the magnetic element of this specific example are similar to those of the second specific example. Also in this case, the Ms of the third ferromagnetic layer 30 was set to 800 emu/cc or 1000 emu/cc. The magnetic field strength in the position of the second ferromagnetic layer 20 was simulated while changing the thickness of the intermediate interconnection 83.

Figure 24:
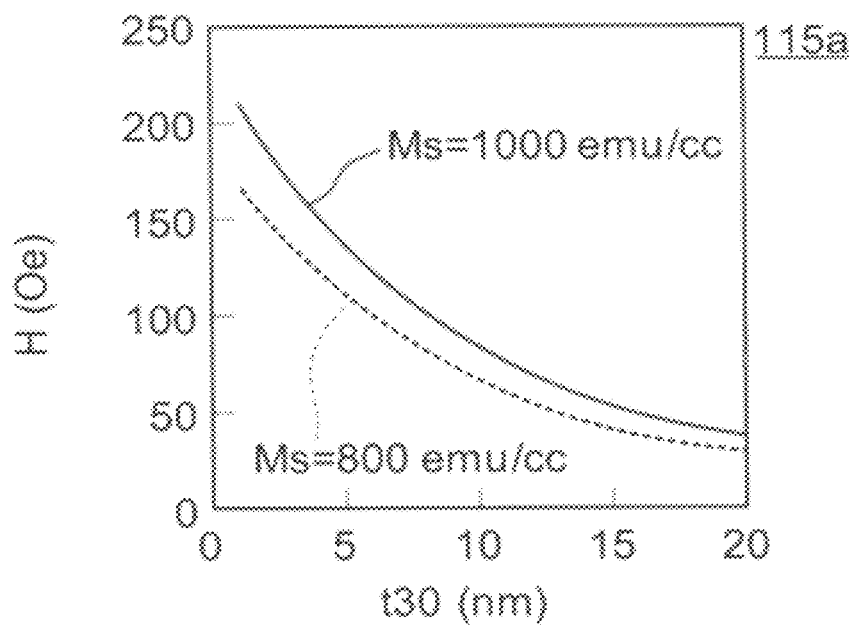
FIG. 24 is a graph showing the characteristics of the magnetic element according to a fifth specific example.

FIG. 24 is a graph illustrating characteristics of the magnetic element according to the fifth specific example.

As shown in FIG. 24, in the case where the Ms of the third ferromagnetic layer 30 is 800 emu/cc and the Ku of the second ferromagnetic layer 20 is not less than 3 Merg/cm$^3$ and not more than 4 Merg/cm$^3$, by setting the thickness t30 of the intermediate interconnection 83 not less than 6 nm and not more than 8 nm, a strength of 1% of the anisotropic magnetic field is obtained to assist the magnetization reversal.

As compared to the second specific example, the strength of the rotating magnetic field is greater in the fifth specific example. Thereby, the magnetization reversal is assisted more effectively, and an increase in the reversal speed and the effect of reducing the reversal variation are obtained.

In the case where the Ms of the third ferromagnetic layer 30 is 1000 emu/cc and the Ku of the second ferromagnetic layer 20 is 5 Merg/cm$^3$ to 6 Merg/cm$^3$, by setting the thickness of the intermediate interconnection 83 not less than 7 nm and not more than 8 nm, a strength of 1% of the anisotropic magnetic field is obtained to assist the magnetization reversal more effectively.

Eighth Embodiment

The embodiment relates to a nonvolatile memory device using one of the magnetic elements according to the embodiments mentioned above. In the following, the magnetic element is conveniently referred to as "stacked structure body M-S".

Figure 25A:
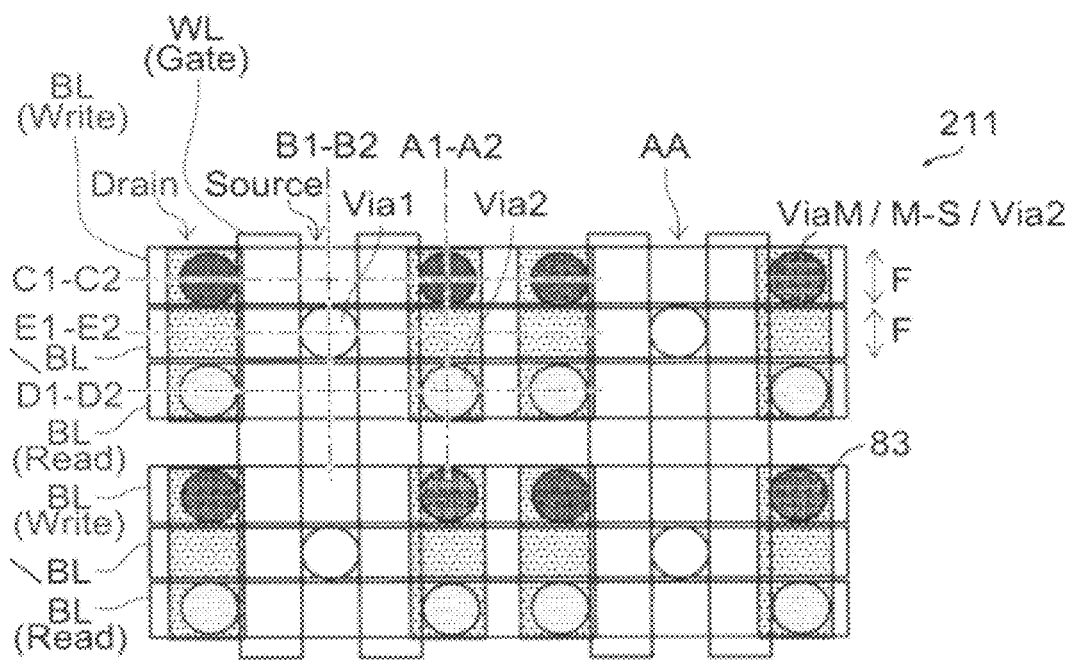
FIG. 25A and FIG. 25B are schematic plan views showing a nonvolatile memory device according an eighth embodiment.
Figure 25B:
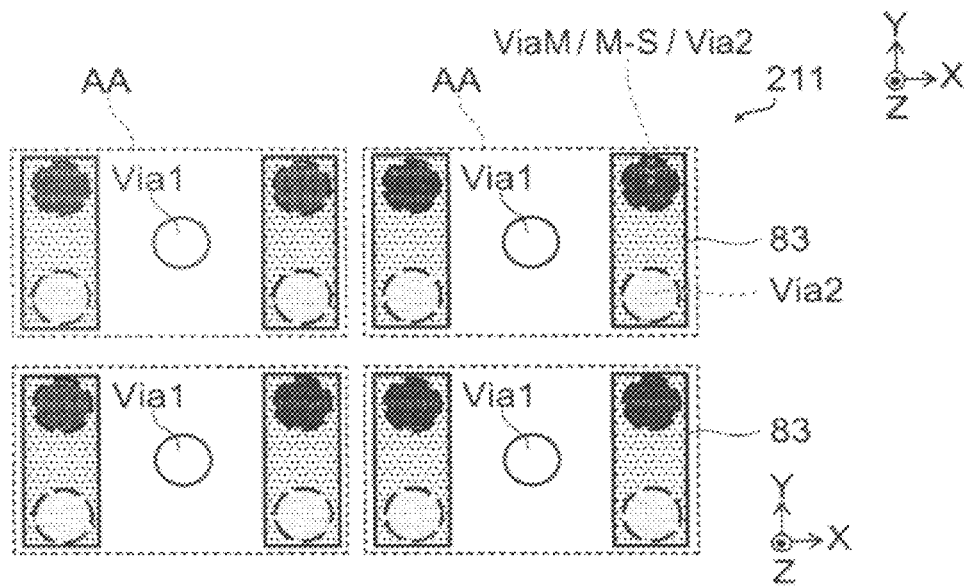

FIG. 25A and FIG. 25B are schematic plan views illustrating the configuration of a nonvolatile memory device according an eighth embodiment.

FIG. 26A to FIG. 26E are schematic cross-sectional views illustrating the configuration of the nonvolatile memory device according to the eighth embodiment.

FIG. 26A to FIG. 26E are cross-sectional views taken along line A1-A2, B1-B2, C1-C2, D1-D2, and E1-E2 of FIG. 25A, respectively.

For easier viewing, in the drawings interconnection portions and element portions are illustrated and the detailed inner structure (e.g. the stack structure etc.) of interlayer insulating films, protection films, interconnections, active areas of transistors, and the like are omitted. Furthermore, for easier viewing, the widths of the interconnections and the like are illustrated with alteration as appropriate in the drawings.

The drawings illustrate an example of the memory cell array unit of a nonvolatile memory device 211. FIG. 25B is a schematic plan view of the intermediate interconnection 83 extracted from the configuration illustrated in FIG. 25A.

As shown in FIG. 25A, in the nonvolatile memory device 211, the bit interconnection for writing BL(Write) and the bit interconnection for reading BL(Read) are alternately arranged. The width of the bit interconnection for writing BL(Write), the width of the bit interconnection for reading BL(Read), and the width of the portion therebetween are almost equal to, for example, a width F.

The bit interconnection bar \BL is disposed in every other portion between the bit interconnection for writing BL(Write) and the bit interconnection for reading BL(Read). The width of the bit interconnection bar \BL is almost equal to the width F. The layer of the bit interconnection bar \BL is different from the layer of the bit interconnection for writing BL(Write) and the layer of the bit interconnection for reading BL(Read).

In this example, the bit interconnection for writing BL(Write) is, for example, the second bit interconnection, the bit interconnection for reading BL(Read) is, for example, the third bit interconnection, and the bit interconnection bar \BL is, for example, the first bit interconnection. These bit interconnections (bit lines) extend along the X-axis, for example. That is, the extending direction of the first bit interconnection is parallel to the extending direction of the second bit interconnection and the extending direction of the third bit interconnection.

That is, one bit interconnection for writing BL(Write), one bit interconnection for reading BL(Read), and one bit interconnection bar \BL therebetween make a set (bit line). The set is arranged repeatedly in plural. The spacing between the sets is, for example, the width F. Herein, the width F is, for example, the minimum line width in the design and fabrication of the nonvolatile memory device 211.

Word lines WL are arranged in a direction intersecting with (e.g. orthogonal to) the extending direction of the bit interconnections (bit lines). The word line WL extends along the Y-axis, for example. The width of the word line WL is almost equal to the width F. The word line WL is provided in plural. The spacing between two closely-aligned word lines WL out of the plurality of word lines WL is almost equal to the width F. The spacing between two word lines between which the distance is long out of the plurality of word lines WL is almost equal to three times the width F (3F).

The word line WL forms the gate electrode of a transistor. The source region (source) and the drain region (drain) of the transistor are formed between two word lines WL. The length of the source region along the Y-axis is, for example, 3F. The length of the drain region along the Y-axis is, for example, 3F.

That is, the drain region is formed between gate electrodes between which the spacing is substantially 3F. The drain regions are separated with a width of substantially F in the bit line direction. The source region is formed between gate electrodes between which the spacing is substantially F.

The length of the active area (AA) of the transistor in the bit line direction is about 5F and the length in the word line direction is about 3F. The spacing between the active areas (AA) of transistors is about F in the bit line direction and about F in the word line direction. The three kinds of bit line mentioned above (the bit interconnection for writing BL(Write), the bit interconnection for reading BL(Read), and the bit interconnection bar \BL) are arranged so as to overlap with the active area (AA) of the transistor.

A stacked structure body M-S of the magnetic element is disposed in a position where the drain region and the BL(Write) overlaps. Here, the stacked structure body M-S includes a stacked structure of the magnetic memory unit (MTJ), the magnetic field generation source (STO), and an intermediate interconnection 83 (3rd-Wire) provided therebetween.

As shown in FIG. 25A and FIG. 25B, a connection via Via2 for connection to the intermediate interconnection 83 (3rd-Wire) is disposed in a position where the bit interconnection for reading BL(Read) and the drain region overlap. The diameter of the connection via Via2 is, for example, about F. The intermediate interconnection 83 (3rd-Wire) is disposed so as to connect the connection via Via2 and the stacked structure body M-S. The width of the intermediate interconnection 83 (3rd-Wire) is, for example, about F, and the length (the length along the Y-axis) is 3F, for example.

A connection via Via1 is disposed in a position where the bit interconnection bar \BL and the source overlap. The diameter of the connection via Via1 is, for example, about F.

In the memory cell array unit having such a configuration, an identical structure is repeated with a period of 6F in the bit line direction, and an identical structure is repeated with a period of 4F in a direction orthogonal to the bit line. Two memory cells are provided in a region of 6F×4F, which is a repeating unit of the memory cell array unit. Therefore, the nonvolatile memory device 211 has a 12F$^2$ cell configuration.

As shown in 26A, the connection via Via2 connected to the bit interconnection for writing BL(Write) extends downward and is connected to the stacked structure body M-S. The bit interconnection for writing BL(Write) is connected to the drain region via a connection via ViaM. The bit interconnection for reading BL(Read) is connected to the intermediate interconnection 83 (3rd-Wire) extending from the stacked structure body M-S in a horizontal direction via a connection via extending downward.

The bit interconnection bar \BL is disposed above the intermediate interconnection 83 (3rd-Wire). In the region shown in the drawing, the bit interconnection bar \BL is not directly connected to other portions. In this example, the bit interconnection for writing BL(Write) is provided in the same layer as the bit interconnection for reading BL(Read). The bit interconnection bar \BL is disposed below them. However, the embodiment is not limited thereto but the vertical relationships of the members are arbitrary. For example, a configuration is possible in which the heights of the three bit interconnections are different from one another and the bit interconnection bar \BL is the uppermost layer.

Figures 26A, 26B, 26C:
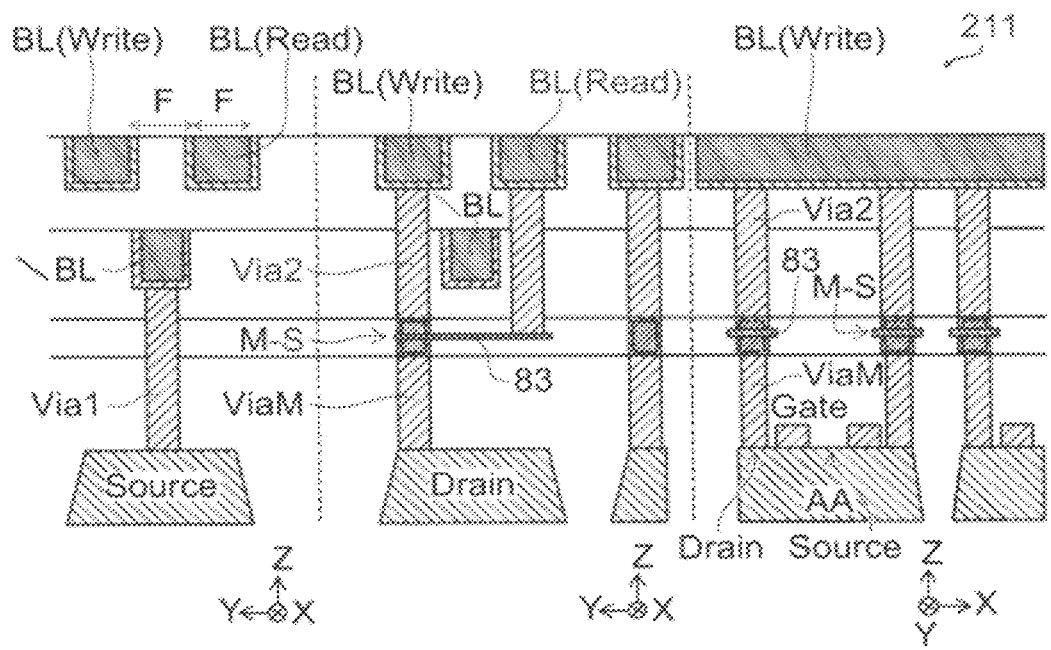
FIG. 26A to FIG. 26E are schematic cross-sectional views showing the nonvolatile memory device according to the eighth embodiment.

As shown in FIG. 26B, the connection via Via1 connected to the bit interconnection bar \BL extends downward and is connected to the source. In the region shown in the drawing, the bit interconnection for writing BL(Write) and the bit interconnection for reading BL(Read) are not directly connected to other portions.

As shown in FIG. 26C, the connection via Via2 connected to the bit interconnection for writing BL(Write) extends downward and is connected to the stacked structure body M-S. The bit interconnection for writing BL(Write) is connected to the drain region via the connection via ViaM. A plurality of stacked structure bodies M-S are arranged with two kinds of spacing: a shorter spacing of about F and a longer spacing of about 3F. Two gates and one source region disposed therebetween are provided in a region of the longer spacing (the spacing being about 3F).

Figures 26D, 26E:
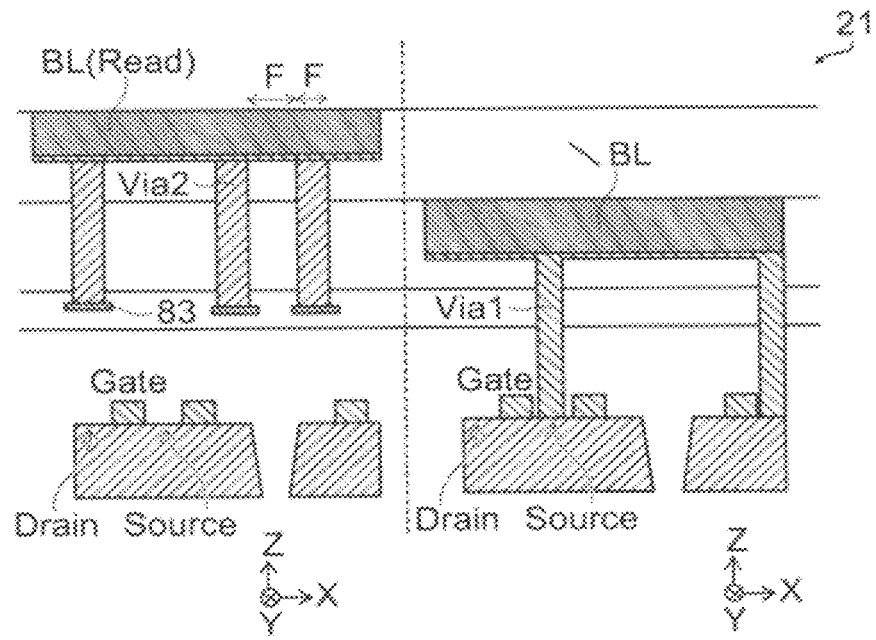

As shown in FIG. 26D, the connection via Via2 connected to the bit interconnection for reading BL(Read) extends downward and is connected to the intermediate interconnection 83 (3rd-Wire). The transistor portion (the gate, the drain, and the source) is disposed further below. In the region shown in the drawing, however, the transistor portion is not directly connected to the bit interconnection for reading BL(Read), the connection via Via2, and the intermediate interconnection 83 (3rd-Wire).

As shown in FIG. 26E, the connection via Via1 connected to the bit interconnection bar \BL extends downward and is connected to the source region. Gates are arranged on both sides of the source region, and drain regions are further arranged on the other sides of the gates.

The bit interconnection for writing BL(Write), the bit interconnection for reading BL(Read), the bit interconnection bar \BL, and the word line WL mentioned above are directly or indirectly connected to the control circuit unit 150 (not shown).

In this example, one intermediate interconnection 83 (3rd-Wire) is directly connected to one stacked structure body M-S. However, the embodiment is not limited thereto.

Figure 27A:
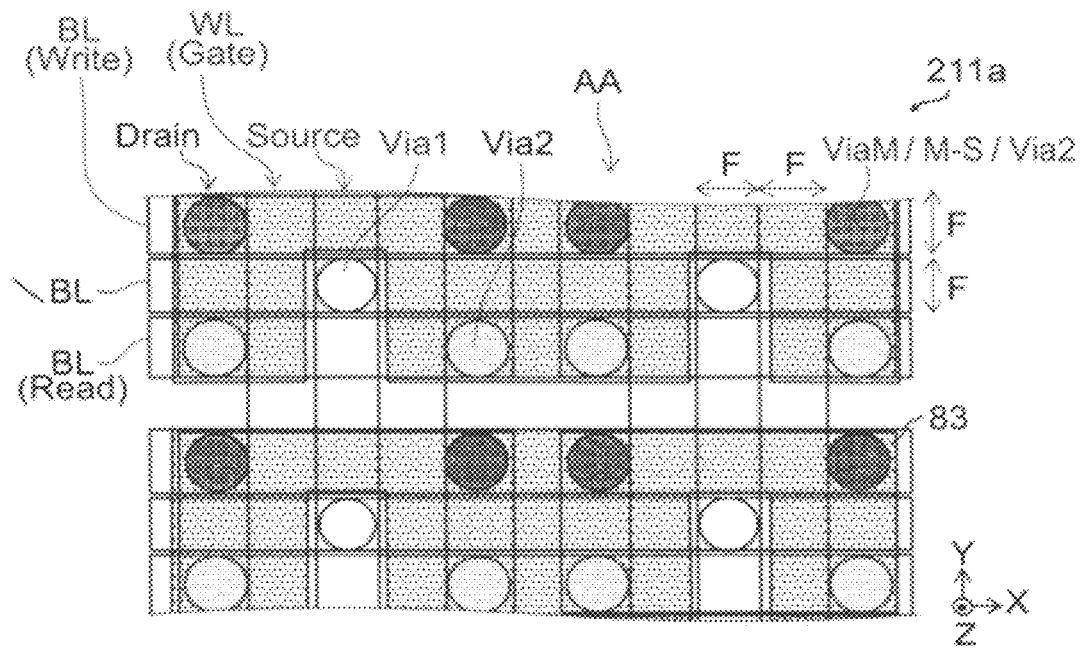
FIG. 27A and FIG. 27B are schematic plan views showing another nonvolatile memory device according to the eighth embodiment.
Figure 27B:
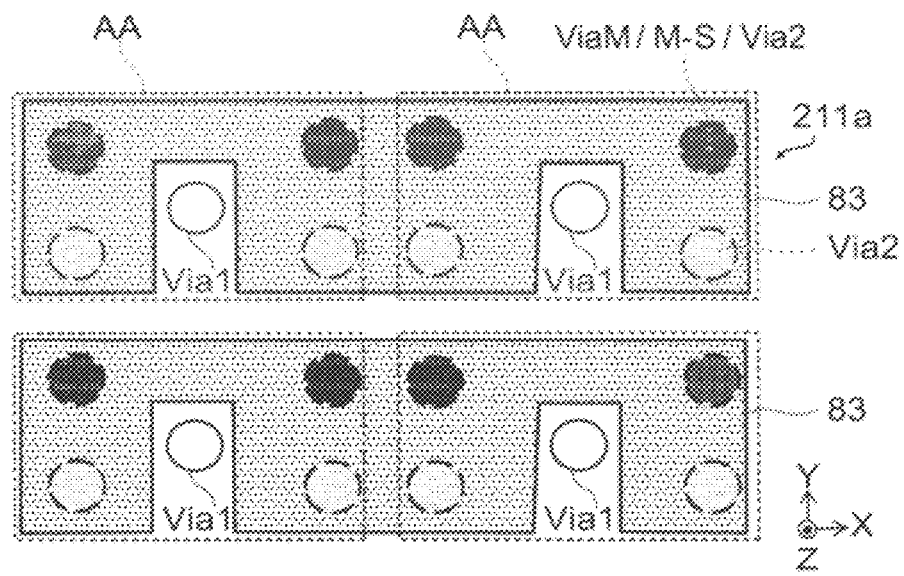

FIG. 27A and FIG. 27B are schematic plan views illustrating the configuration of another nonvolatile memory device according to the eighth embodiment.

FIG. 27B shows the intermediate interconnection 83 extracted from the configuration illustrated in FIG. 27A. The control circuit unit 150 is omitted in the drawings.

As shown in FIG. 27A and FIG. 27B, in another nonvolatile memory device 211a according to the embodiment, the intermediate interconnections 83 (3rd-Wire) included in adjacent magnetic elements are connected in the extending direction of the bit interconnection for reading BL(Read) (the X-axis direction).

Figure 28:
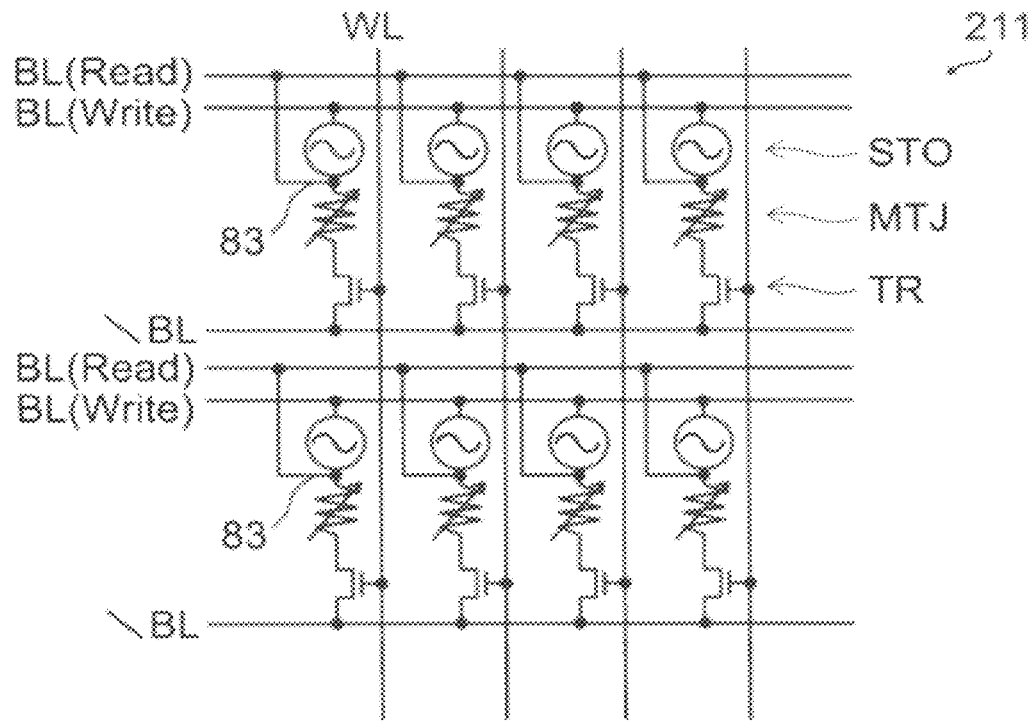
FIG. 28 is a schematic circuit diagram showing the nonvolatile memory device according to the eighth embodiment.

FIG. 28 is a schematic circuit diagram illustrating the configuration of the nonvolatile memory device according to the eighth embodiment.

As shown in FIG. 28, in the nonvolatile memory device 211 according to the embodiment, one MTJ and one STO are connected to one transistor TR, and these correspond to one memory cell. The intermediate interconnection 83 (3rd-Wire) is further connected to a portion where the STO and the MTJ are connected. The other end of the intermediate interconnection 83 (3rd-Wire) is connected to the bit interconnection for reading BL(Read). The other end of the STO is connected to the bit interconnection for writing BL(Write). One end of the transistor TR is connected to the MTJ and the other end is connected to the bit interconnection bar \BL.

The gate of the transistor TR is connected to the word line WL. The bit interconnection for writing BL(Write), the bit interconnection for reading BL(Read), and the bit interconnection bar \BL are arranged parallel in a horizontal direction in the drawing. Each of the bit interconnections is connected to each of the plurality of memory cells. The ends (e.g. both ends) of the bit interconnections are connected to the control circuit unit 150 (not shown in FIG. 28). The plurality of word lines WL extend in a direction orthogonal to the bit interconnections. Each of the plurality of word lines WL is connected to the gates of a plurality of memory cells. The ends (e.g. both ends) of the plurality of word lines WL are connected to the control circuit unit 150 (not shown in the drawing).

Figure 29:
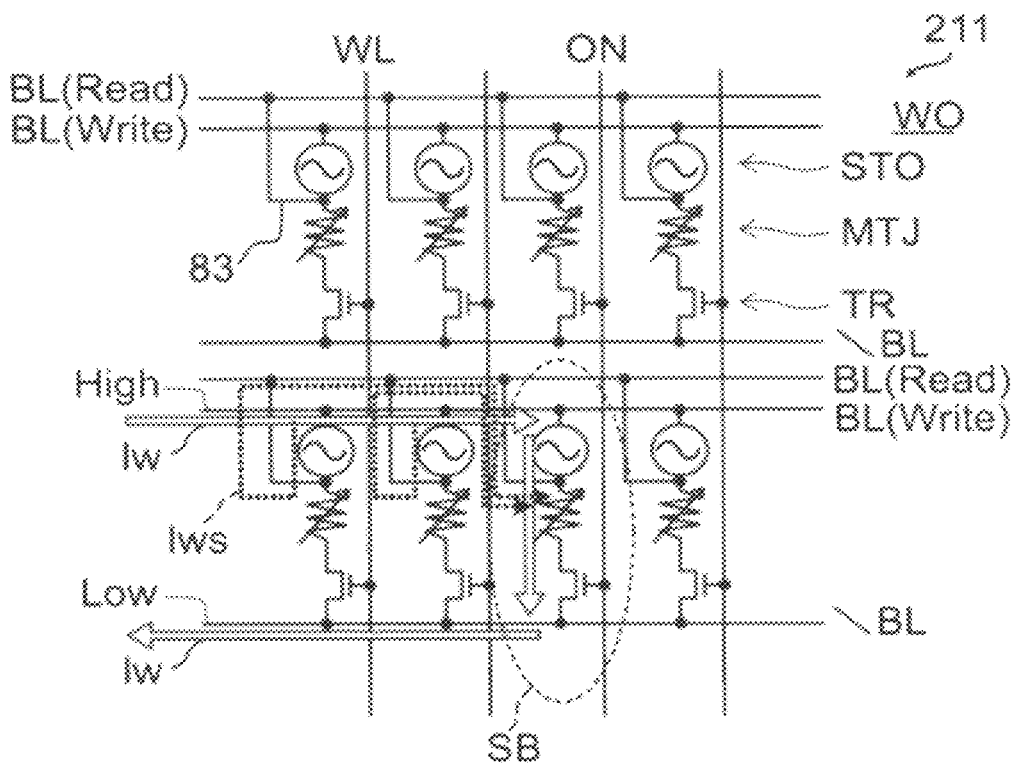
FIG. 29 is a schematic circuit diagram showing the operation of the nonvolatile memory device according to the eighth embodiment.

FIG. 29 is a schematic circuit diagram illustrating an operation of the nonvolatile memory device according to the eighth embodiment.

The drawing illustrates the write operation WO. As shown in FIG. 29, to switch the gate of a memory cell to which data will be written (herein referred to as a selected bit SB) to ON, the word line WL connected to the selected bit SB is switched to ON. Further, the bit interconnection for writing BL(Write) connected to the selected bit SB is set in a High state, and the bit interconnection bar \BL connected to the selected bit SB is set in a Low state. Thereby, in the selected bit SB, the write current Iw flows through the STO and the MTJ to perform data writing.

At this time, a sneak current Iws is produced via the STO unit, the intermediate interconnection 83 (3rd-Wire), and the bit interconnection for reading BL(Read) of a not-selected bit. However, the interconnection resistance of the bit interconnection for writing BL(Write) may be set lower than that of the intermediate interconnection 83 (3rd-Wire). Thereby, the sneak current Iws is suppressed to prevent influence on the write operation WO. To make this more effective, a diode may be connected to the intermediate interconnection 83 (3rd-Wire).

Figure 30:
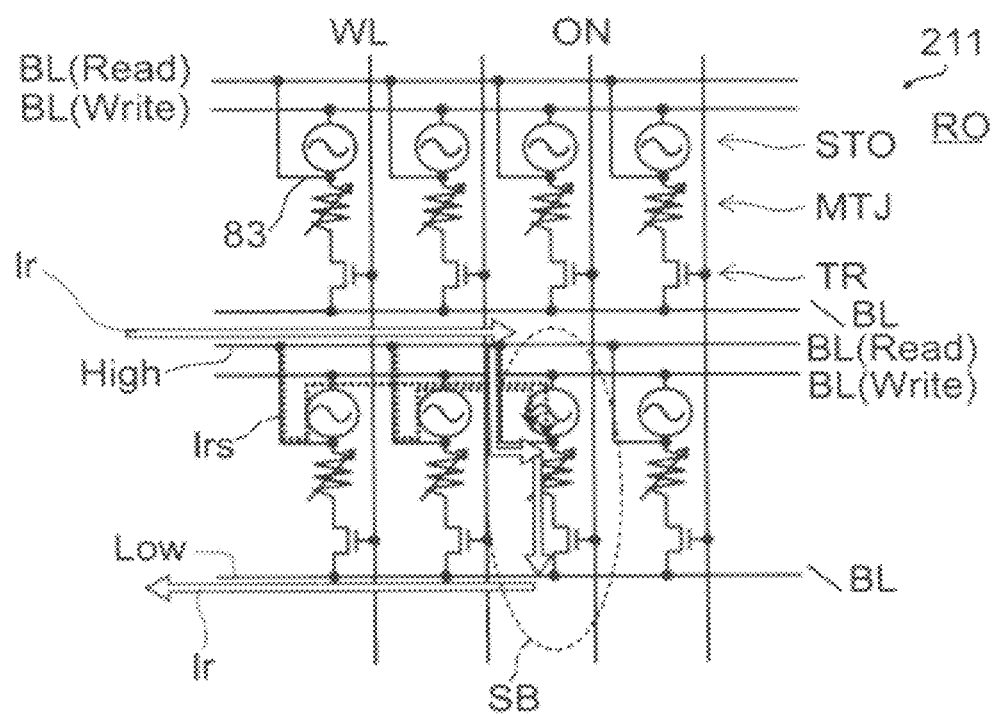
FIG. 30 is a schematic circuit diagram showing the operation of the nonvolatile memory device according to the eighth embodiment.

FIG. 30 is a schematic circuit diagram illustrating an operation of the nonvolatile memory device according to the eighth embodiment.

As shown in FIG. 30, to switch the gate of the selected bit SB to ON, the word line WL connected to the selected bit SB is switched to ON. Further, the bit interconnection for reading BL(Read) connected to the selected bit SB is set in the High state, and the bit interconnection bar \BL connected to the selected bit SB is set in the Low state. Thereby, in the selected bit SB, the read current Ir flows through the MTJ to perform data reading. At this time, the read current Ir does not flow through the STO.

At this time, the sneak current Irs is produced via the STO unit, the intermediate interconnection 83 (3rd-Wire), and the bit interconnection for writing BL(Write) of a not-selected bit and a current flows also through the selected bit SB. However, since this is not a current enough to cause rotating magnetic field generation in the STO, reading can be performed without causing false writing.

Furthermore, to make large the margin of the rotating magnetic field generation in the STO, the electric potential of the bit interconnection for writing BL(Write) connected to the selected bit SB may be controlled to make small the current flowing through the STO unit of the selected bit SB. Furthermore, by using a layout in which intermediate interconnections 83 (3rd-Wire) are connected to each other like the nonvolatile memory device 211*a*, the current flowing through the STO unit of the selected bit SB can be made small.

Ninth Embodiment

Also in the embodiment, one of the magnetic elements according to the embodiments is used.

Figure 31A:
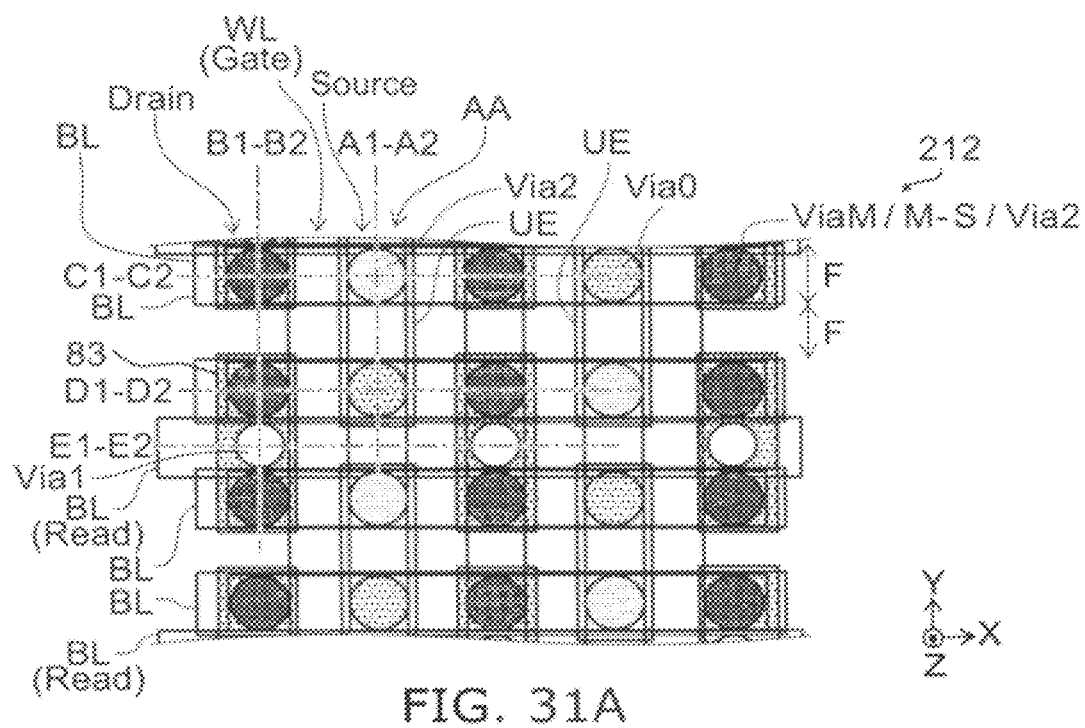
FIG. 31A and FIG. 31B are schematic plan views showing a nonvolatile memory device according to a ninth embodiment.
Figure 31B:
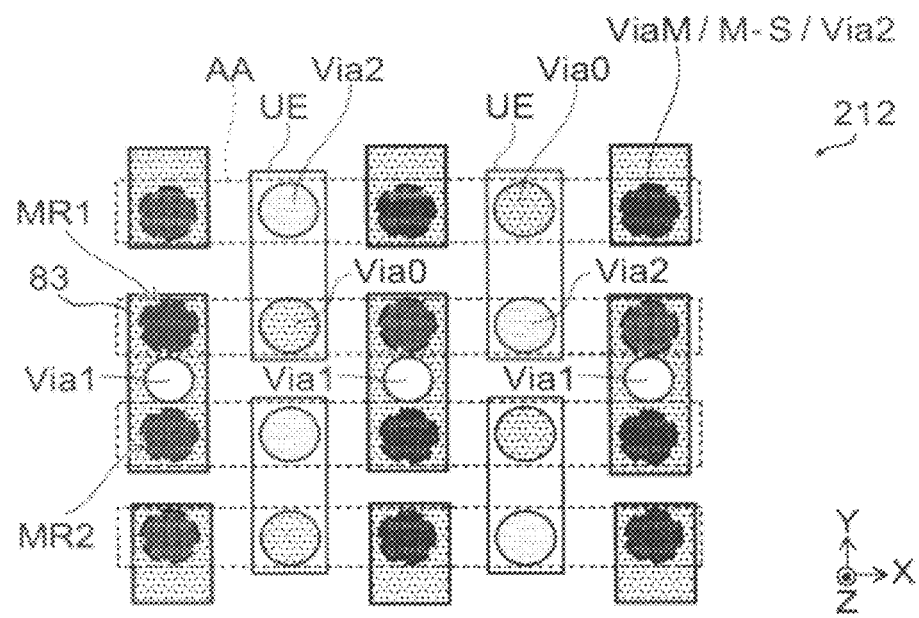

FIG. 31A and FIG. 31B are schematic plan views illustrating the configuration of a nonvolatile memory device according to a ninth embodiment.

FIG. 32A to FIG. 32E are schematic cross-sectional views illustrating the configuration of the nonvolatile memory device according to the ninth embodiment.

FIG. 32A to FIG. 32E are cross-sectional views taken along line A1-A2, B1-B2, C1-C2, D1-D2, and E1-E2 of FIG. 31A, respectively. FIG. 31B is a schematic plan view of the intermediate interconnection 83 extracted from the configuration illustrated in FIG. 31A. The control circuit unit 150 is omitted in the drawings.

As shown in FIG. 31A, in a nonvolatile memory device 212, a plurality of multiple-use bit interconnections BL with a width of about F are arranged with intervals of about F. A plurality of word lines WL with a width of about F are arranged with intervals of about F in a direction intersecting with (in this example, orthogonal to) the multiple-use bit interconnection BL.

Further, the bit interconnection for reading BL(Read) with a width of about F is disposed in every other portion between multiple-use bit interconnections BL parallel to the extending direction of the multiple-use bit interconnection BL.

The connection via Via1 connected to the intermediate interconnection 83 (3rd-Wire) is provided in a position overlapping with the bit interconnection for reading BL(Read). The diameter of the connection via Via1 is, for example, about F. The connection via Via1 is provided in plural. The spacing between connection vias Via1 is, for example, 3F.

As shown in FIG. 31A and FIG. 31B, the intermediate interconnection 83 (3rd-Wire) is provided in a position overlapping with the connection via Via1. The width of the intermediate interconnection 83 (3rd-Wire) is about F. The long side of the intermediate interconnection 83 (3rd-Wire) extends in a direction intersecting with (e.g. orthogonal to) the bit interconnection for reading BL(Read), and has a length of about 3F. The connection via Via1 is disposed almost at the center of the intermediate interconnection 83 (3rd-Wire).

The stacked structure bodies M-S of the magnetic element (a first magnetic element MR1 and a second magnetic element MR2) are disposed on both sides of the intermediate interconnection 83 (3rd-Wire). The stacked structure body M-S is disposed so as to overlap with the multiple-use bit interconnection BL. The transistor active area (AA) is disposed so as to almost overlap with the multiple-use bit interconnection BL. The width of the transistor active area is, for example, about F. The transistor active area intersects with (e.g. is orthogonal to) the word line WL. The word line WL forms the gate of the transistor.

The drain and the source are alternately arranged beside the gate. The drain and the stacked structure body M-S of the magnetic element are arranged to overlap.

A connection via Via0 connected to the source and the connection via Via2 connected to the multiple-use bit interconnection BL are arranged in a position overlapping with the source. The connection via Via0 and the connection via Via2 are alternately arranged both in a direction parallel to the multiple-use bit interconnection BL and in a direction orthogonal to the multiple-use bit interconnection BL. In regard to the connection via Via0 and the connection via Via2 arranged in the direction orthogonal to the multiple-use bit interconnection BL, a connection via Via0 and a connection via Via2 adjacent to each other make one set and are connected via an in-cell local interconnection UE. The width of the in-cell local interconnection UE is, for example, about F, and the length is about 3F. The in-cell local interconnection UE is disposed so as not to overlap with the bit interconnection for reading BL(Read).

In regard to the memory cell array unit having such a configuration, an identical structure is repeated with a period of 8F in the direction of the multiple-use bit interconnection BL, and an identical structure is repeated with a period of 4F in a direction orthogonal to the multiple-use bit interconnection BL. Four memory cells are provided in a repeating unit of 8F×4F. The nonvolatile memory device 212 has an $8F^2$ cell configuration.

As shown in 32A, the connection via Via2 connected to the multiple-use bit interconnection BL extends downward and is connected to one end of the in-cell local interconnection UE. The connection via Via0 extends from the other end of the in-cell local interconnection UE, and the in-cell local interconnection UE is connected to the source. The bit interconnection for reading BL(Read) is not disposed above the in-cell local interconnection UE, and is disposed in a portion where there is no in-cell local interconnection UE. In the region shown in the drawing, the source below the connection via Via2 is not directly connected to other portions. Although the bit interconnection for reading BL(Read) is disposed below the multiple-use bit interconnection BL in this example, the vertical arrangement relationship of them is arbitrary.

Figures 32A, 32B, 32C:
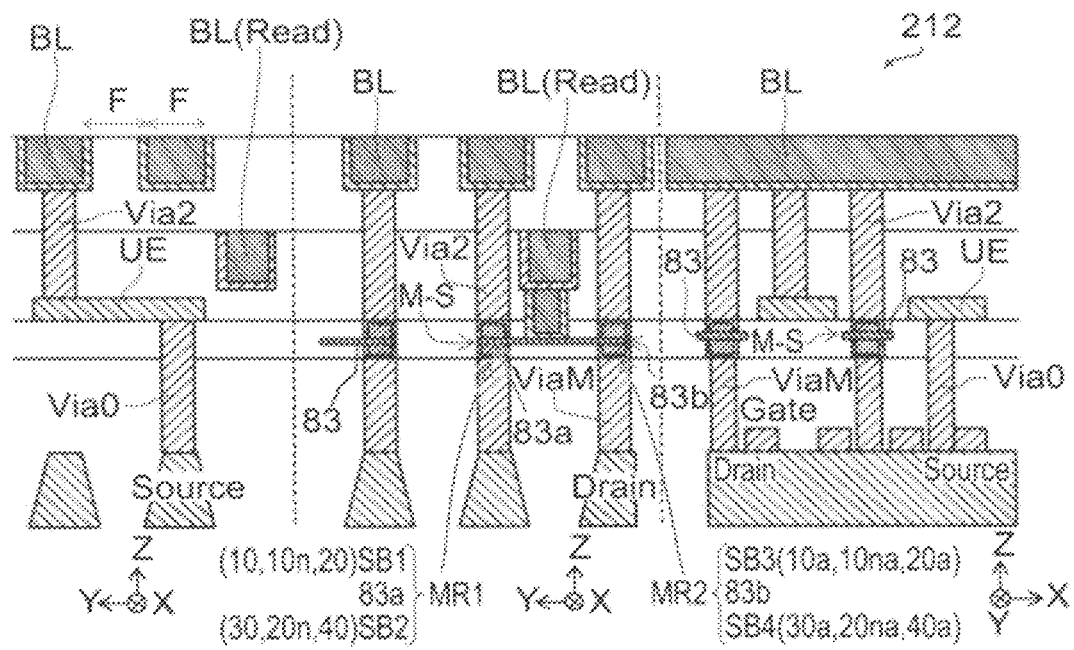
FIG. 32A to FIG. 32E are schematic cross-sectional views showing the nonvolatile memory device according to the ninth embodiment.

As shown in FIG. 32B, the connection via Via2 connected to the multiple-use bit interconnection BL extends downward and is connected to the stacked structure body M-S. The multiple-use bit interconnection BL is further connected to the drain via the connection via ViaM below the multiple-use bit interconnection BL. Two stacked structure bodies M-S adjacent in a horizontal direction (e.g. the X-axis direction) are connected via the intermediate interconnection 83 (3rd-Wire). The connection via Via1 connected to the central portion of the intermediate interconnection 83 (3rd-Wire) and extending upward is connected to the bit interconnection for reading BL(Read).

The first magnetic element MR1 includes the first stacked unit SB1, the second stacked unit SB2 and the first intermediate interconnection 83*a* (a part of the intermediate interconnection 83). The second magnetic element MR2 is juxtaposed to the first magnetic element MR1 along the direction orthogonal to the stacking direction. The second magnetic element MR2 includes the third stacked unit SB3, the fourth stacked unit SB4 and the second intermediate interconnection 83*b* (another part of the intermediate interconnection 83). The third stacked unit SB3 includes a fifth ferromagnetic layer 10a, a sixth ferromagnetic layer 20a and a third nonmagnetic layer 10na. The configurations of the fifth ferromagnetic layer 10a, the sixth ferromagnetic layer 20a and the third nonmagnetic layer 10na correspond to the configuration of the first ferromagnetic layer 10, the second ferromagnetic layer 20 and the first nonmagnetic layer 10n, respectively). The fourth stacked unit SB4 includes a seventh ferromagnetic layer 30a, an eighth ferromagnetic layer 40a and a fourth nonmagnetic layer 20na. The configurations of the seventh ferromagnetic layer 30a, the eighth ferromagnetic layer 40a and the fourth nonmagnetic layer 20na correspond to the configuration of the third ferromagnetic layer 30, the fourth ferromagnetic layer 40 and the fsecond nonmagnetic layer 20n, respectively.

As shown in FIG. 32C, the connection via Via2 connected to the multiple-use bit interconnection BL extends downward and is connected to the stacked structure body M-S or the in-cell local interconnection UE. The stacked structure body M-S and the in-cell local interconnection UE are alternately arranged in a horizontal direction (e.g. the X-axis direction). Some of the in-cell local interconnections UE are connected to the multiple-use bit interconnection BL via the connection via Via2 extending upward. The others of the in-cell local interconnections UE are connected to the source via the connection via Via0 extending downward. These two kinds of in-cell local interconnection UE are alternately arranged. Although the stacked structure body M-S is disposed below the in-cell local interconnection UE in this example, the vertical arrangement relationship of them is arbitrary.

Figures 32D, 32E:
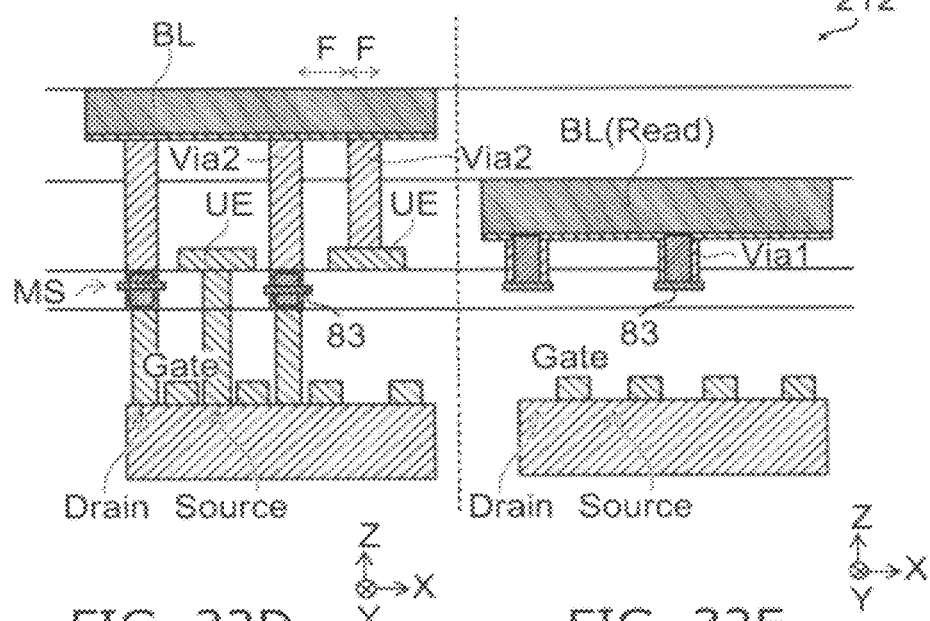

As shown in FIG. 32D, the arrangement of the connection via Via0 and the connection via Via2 connected to the in-cell local interconnection UE is opposite to the arrangement of the connection via Via0 and the connection via Via2 illustrated in FIG. 32C. The structure of the C1-C2 cross section of FIG. 31A corresponds to the structure of the D1-D2 cross section translated in a horizontal direction (the X-axis direction) by a distance of 4F.

As shown in FIG. 32E, the connection via Via1 connected to the bit interconnection for reading BL(Read) extends downward and is connected to the intermediate interconnection 83 (3rd-Wire). The drain is disposed below the intermediate interconnection 83 (3rd-Wire). In the region shown in the drawing, the drain, the gate, and the source are not directly connected to interconnections thereabove.

This example has a structure in which one intermediate interconnection 83 (3rd-Wire) is directly connected to two stacked structure bodies M-S. However, the embodiment is not limited thereto.

Figure 33A:
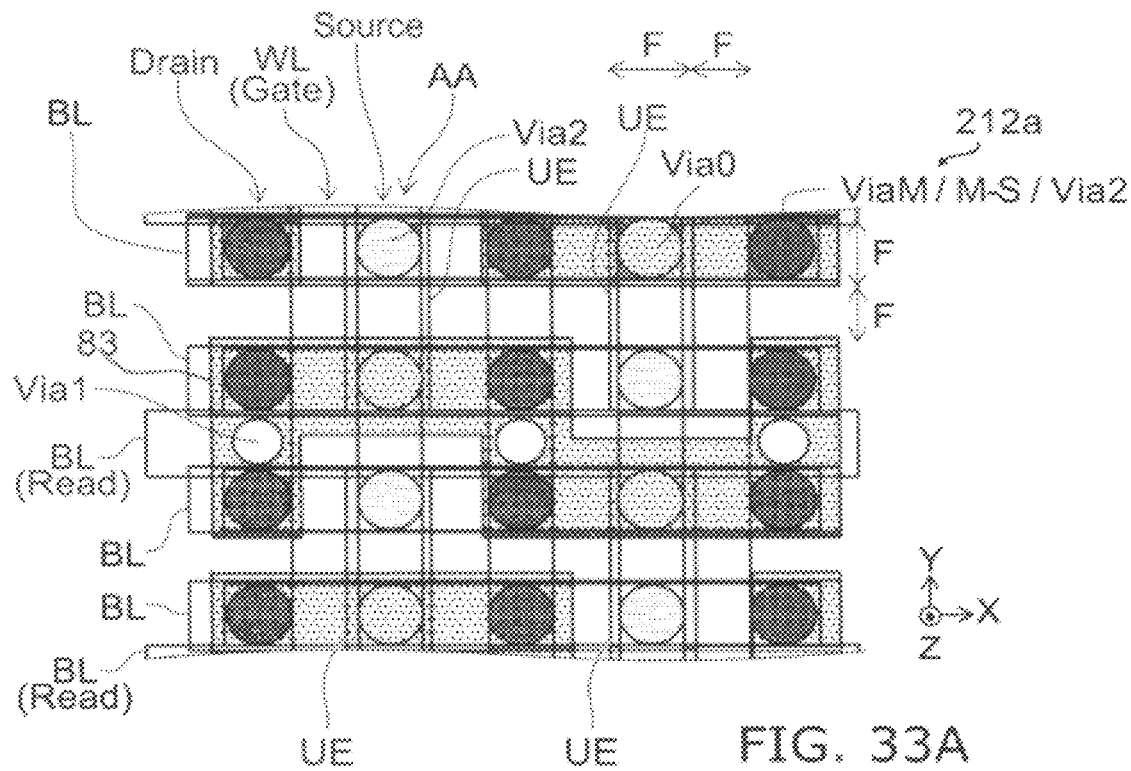
FIG. 33A and FIG. 33B are schematic plan views showing another nonvolatile memory device according to the ninth embodiment.
Figure 33B:
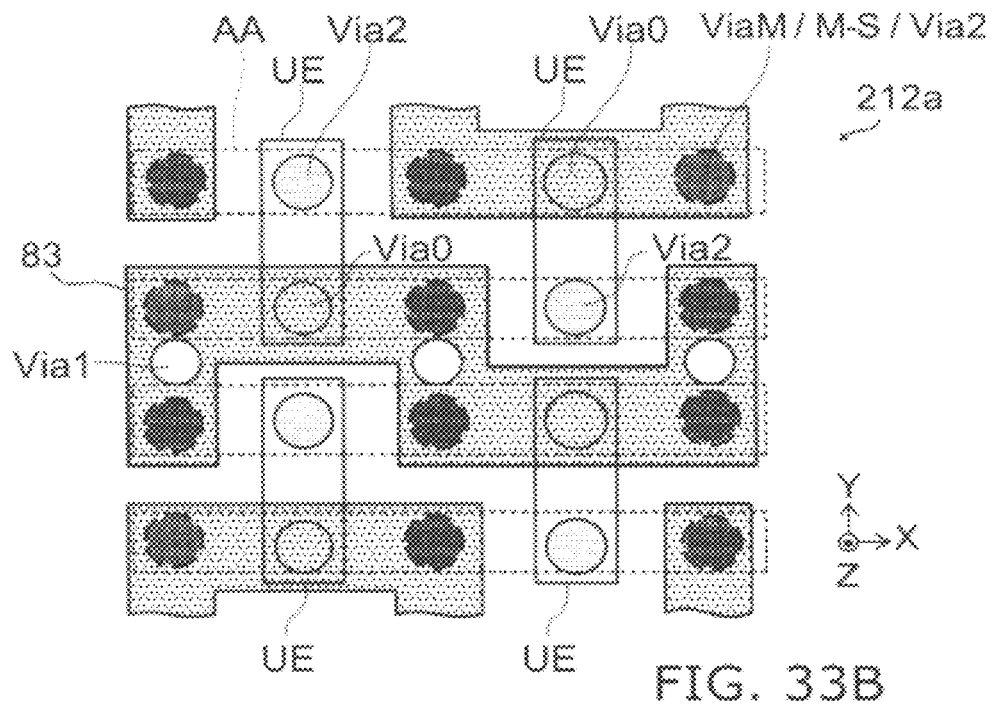

FIG. 33A and FIG. 33B are schematic plan views illustrating the configuration of another nonvolatile memory device according to the ninth embodiment.

FIG. 33B shows the intermediate interconnection 83 extracted from the configuration illustrated in FIG. 33A.

As shown in FIG. 33A and FIG. 33B, in another nonvolatile memory device 212a according to the embodiment, the intermediate interconnections 83 (3rd-Wire) included in adjacent magnetic elements are connected to each other in the extending direction of the bit interconnection for reading BL(Read) (the X-axis direction).

Figure 34:
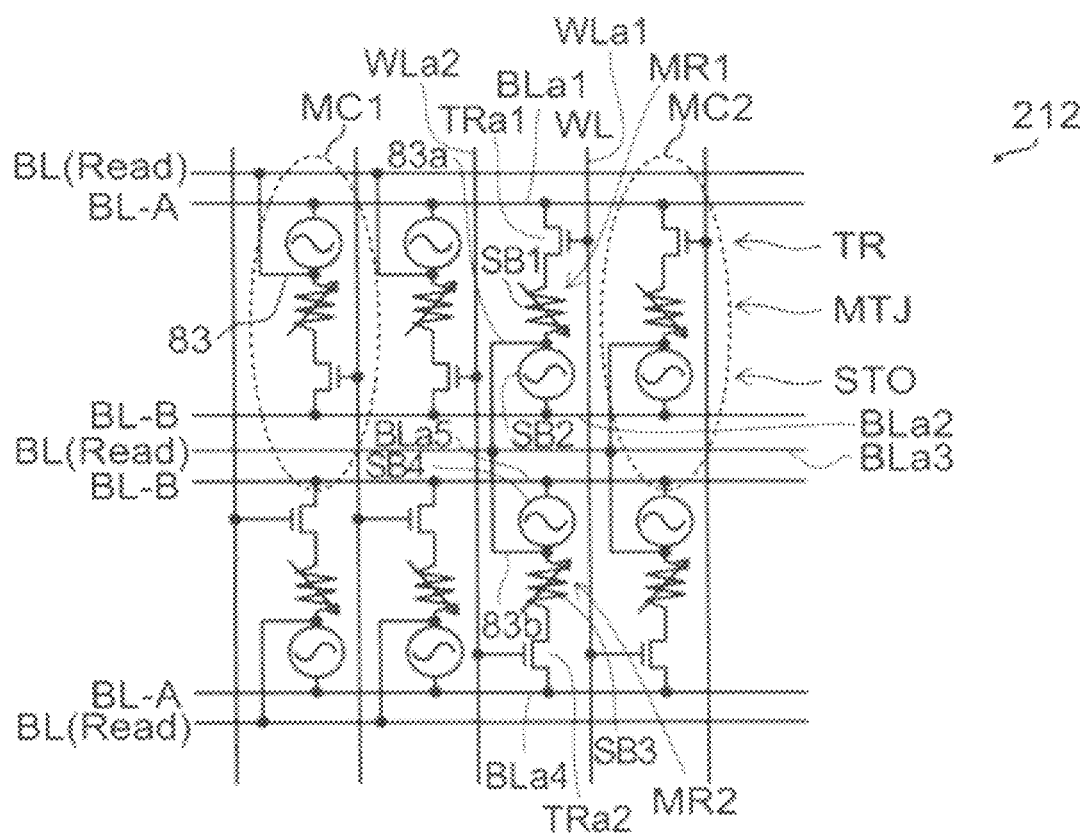
FIG. 34 is a schematic circuit diagram showing the nonvolatile memory device according to the ninth embodiment.

FIG. 34 is a schematic circuit diagram illustrating the configuration of the nonvolatile memory device according to the ninth embodiment.

In the nonvolatile memory device 212 according to the embodiment, the bit interconnection for writing BL(Write) and the bit interconnection bar \BL described in regard to the nonvolatile memory device 211 are not provided. In the embodiment, two kinds of multiple-use bit interconnection BL (a multiple-use bit interconnection BL-A and a multiple-use bit interconnection BL-B) take the roles of the bit interconnection for writing BL(Write) and the bit interconnection bar \BL depending on the memory cell connected thereto.

That is, for a first memory cell MC1, the multiple-use bit interconnection BL-A functions as the bit interconnection for writing BL(Write) and the multiple-use bit interconnection BL-B functions as the bit interconnection bar \BL. For a second memory cell MC2, the multiple-use bit interconnection BL-A functions as the bit interconnection bar \BL and the multiple-use bit interconnection BL-B functions as the bit interconnection for writing BL(Write).

In view of the point, the write operation WO and the read operation RO of data in the embodiment are the same as the write operation WO and the read operation RO described in regard to FIG. 29 and FIG. 30.

In this example, in one memory cell (a set of the MTJ and the STO), the bit interconnection for reading BL(Read) is, for example, the third bit interconnection, the multiple-use bit interconnection BL-A is the second bit interconnection, and the multiple-use bit interconnection BL-B is the first bit interconnection. In another memory cell (a set of the MTJ and the STO), the bit interconnection for reading BL(Read) is, for example, the third bit interconnection, the multiple-use bit interconnection BL-A is the first bit interconnection, and the multiple-use bit interconnection BL-B is the second bit interconnection.

Also in this example, the extending direction of the first bit interconnection is parallel to the extending direction of the second bit interconnection and the extending direction of the third bit interconnection.

Tenth Embodiment

Also in the embodiment, one of the magnetic elements according to the embodiments is used.

Figure 35:
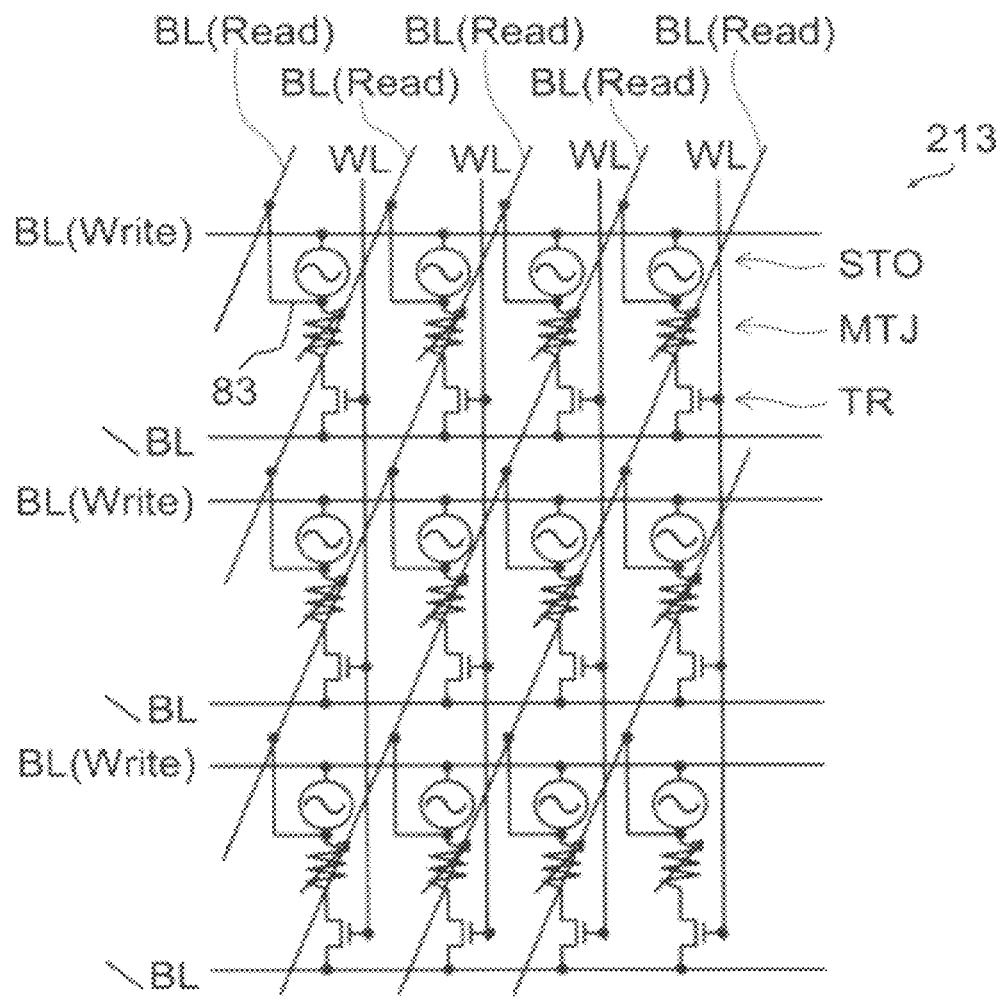
FIG. 35 is a schematic circuit diagram showing of a nonvolatile memory device according to a tenth embodiment.

FIG. 35 is a schematic circuit diagram illustrating the configuration of a nonvolatile memory device according to a tenth embodiment.

FIG. 35 illustrates the configuration of the memory cell array unit of a nonvolatile memory device 213 according to the embodiment. In the drawing, the control circuit unit 150 is omitted.

As shown in FIG. 35, in the nonvolatile memory device 213, the extending direction of the bit interconnection for writing BL(Write) is not parallel to the extending direction of the bit interconnection for reading BL(Read). That is, for the memory cells arranged vertically and horizontally, one bit interconnection for writing BL(Write) is connected to memory cells arranged along a horizontal direction (e.g. the X-axis direction). One bit interconnection for reading BL(Read) is connected to memory cells arranged in an oblique direction.

In this example, the bit interconnection for reading BL(Read) is, for example, the third bit interconnection, the bit interconnection for writing BL(Write) is, for example, the second bit interconnection, and the bit interconnection bar \BL is, for example, the first bit interconnection.

In this example, the extending direction of the third bit interconnection intersects with the extending direction of the first bit interconnection and the extending direction of the second bit interconnection.

This configuration can make small the sneak current during the write operation WO and the read operation RO. Furthermore, by the electric potential control of the bit interconnection (bit line) connected to a not-selected bit, the sneak current can be made even smaller.

Thus, the nonvolatile memory devices according to the eighth to tenth embodiments include a plurality of bit lines, a plurality of word lines, a plurality of memory cells, and a plurality of transistors.

The extending direction of the plurality of word lines intersects with the extending direction of the plurality of bit lines. Each of the plurality of memory cells is provided in a portion where each of the plurality of bit lines and each of the plurality of word lines intersects. Each memory cell includes any magnetic element according to the first to seventh embodiments. The plurality of transistors are connected between at least one of the first conductive layer 81 and the second conductive layer 82 of the plurality of magnetic elements and one of the plurality of bit lines or one of the plurality of word lines.

For example, each of the plurality of bit lines may include the first bit interconnection directly or indirectly connected to one end of the MTJ of a magnetic element, the second bit interconnection directly or indirectly connected to one end of the STO of the magnetic element, and the third bit interconnection directly or indirectly connected to the intermediate interconnection 83 of the magnetic element.

For example, in the magnetic element, one end of the MTJ is connected to the transistor and the other end of the MTJ is connected to the STO. The transistor is provided at least one of between the first bit interconnection and the MTJ and between the second bit interconnection and the STO. However, the embodiment is not limited thereto but the positional relationship of the MTJ and the STO may be opposite. A configuration is possible in which one end of the STO is connected to the transistor and the other end of the STO is connected to the MTJ. Alternatively, the transistor may be connected to both of the MTJ and the STO.

The word line WL is directly or indirectly connected to the gate of the transistor. In the nonvolatile memory device according to the embodiment, the current pathway through which a current is passed is different between the data store operation (the write operation WO) and the data read operation (the read operation RO).

That is, in the write operation WO, the write current Iw flows between the first conductive layer 81 and the intermediate interconnection 83 and between the second conductive layer 82 and the intermediate interconnection 83. In the read operation RO, the read current Ir flows between the first conductive layer 81 and the intermediate interconnection 83. Thereby, false writing during reading is suppressed.

The nonvolatile memory device according to the embodiment includes a plurality of bit lines, a plurality of word lines, and a plurality of memory cells. Each of the plurality of memory cells is provided at the intersection of each of the plurality of bit lines and each of the plurality of word lines.

Each of the plurality of memory cells includes the first stacked unit SB1, the second stacked unit SB2, the intermediate interconnection 83, and the selection transistor. The intermediate interconnection 83 is provided between the first stacked unit SB1 and the second stacked unit SB2. The selection transistor includes the gate, and a current can flow through the selection transistor by switching the gate to ON. That is, the selection transistor further includes the source and the drain, and a current flows between the source and the drain by switching the gate to ON.

The first stacked unit SB1 includes the first ferromagnetic layer 10, the second ferromagnetic layer 20, and the first nonmagnetic layer 10n mentioned above. The second stacked unit SB2 includes the third ferromagnetic layer 30, the fourth ferromagnetic layer 40, and the second nonmagnetic layer 20n mentioned above. As described above, the stacking order of them may be variously altered.

In each of the plurality of memory cells, an electron whose spin is polarized by passing a current in a direction substantially perpendicular to the film surfaces of the first and second stacked units SB1 and SB2 is caused to act on the second ferromagnetic layer 20, and a magnetic field generated from the precession of the magnetization of the third ferromagnetic layer 30 is caused to act on the second ferromagnetic layer 20. Thereby, the direction of the magnetization of the second ferromagnetic layer 20 is determined to a direction in accordance with the direction of the current, and thus each of the plurality of memory cells has the function of storing data.

Each of the plurality of bit lines includes the first to third bit interconnections. Each of the first to third bit interconnections is connected to one of the plurality of memory cells provided at the intersection of one of the plurality of bit lines and one of the plurality of word lines.

The first bit interconnection is directly or indirectly connected to a first end of the first stacked unit SB1 of the one of the memory cells on the side opposite to the intermediate interconnection 83. The second bit interconnection is directly or indirectly connected to a second end of the second stacked unit SB2 of the one of the memory cells on the side opposite to the intermediate interconnection 83. The third bit interconnection is directly or indirectly connected to the intermediate interconnection 83 of the one of the memory cells.

The selection transistor of the one of the memory cells is disposed at least one of between the first bit interconnection and the first end and between the second bit interconnection and the second end. The one of the plurality of word lines is connected to the gate of the selection transistor of the one of the memory cells.

For example, the selection transistor of the one of the memory cells is disposed between the first bit interconnection and the first end, and the source of the selection transistor of the one of the memory cells is directly or indirectly connected to one of the first bit interconnection and the first end. The drain of the transistor is directly or indirectly connected to the other of the first bit interconnection and the first end.

For example, the selection transistor of the one of the memory cells is disposed between the second bit interconnection and the second end, and the source of the transistor of the one of the memory cells is directly or indirectly connected to one of the second bit interconnection and the second end. The drain of the transistor is directly or indirectly connected to the other of the second bit interconnection and the second end.

Furthermore, in the nonvolatile memory device 212 mentioned above, some of the bit interconnections are multiply used. That is, the nonvolatile memory device 212 includes a first magnetic element MR1, a second magnetic element MR2, a first to a fifth bit interconnection BLa1-BLa5, a first selection transistor TRa1 (e.g. at least one of the first transistor and the second transistor mentioned above), a second selection transistor TRa2, and a word line WL.

The first magnetic element includes the first stacked unit SB1, the second stacked unit SB2, and a first intermediate interconnection 83b (e.g. a part of the intermediate interconnection 83).

The first stacked unit SB1 includes the first ferromagnetic layer 10 in which the magnetization is fixed in the first direction, the second ferromagnetic layer 20 stacked with the first ferromagnetic layer 10 and in which the direction of the magnetization is variable, and the first nonmagnetic layer 10n provided between the first ferromagnetic layer 10 and the second ferromagnetic layer 20.

The second stacked unit SB2 is stacked with the first stacked unit SB1 along the stacking direction SD1 running from the first ferromagnetic layer 10 toward the second ferromagnetic layer 20. The second stacked unit SB2 includes the third ferromagnetic layer 30 in which the direction of the magnetization is variable, the fourth ferromagnetic layer 40 stacked with the third ferromagnetic layer 30 along the stacking direction SD1 and in which the magnetization is fixed in the second direction, and the second nonmagnetic layer 20n provided between the third ferromagnetic layer 30 and the fourth ferromagnetic layer 40.

The first intermediate interconnection is provided between the first stacked unit SB1 and the second stacked unit SB2.

In the first magnetic element MR1, an electron whose spin is polarized by passing a current through the first stacked unit SB1 and the second stacked unit SB2 along the stacking direction SD1 is caused to act on the second ferromagnetic layer 20, and a magnetic field generated from the precession of the magnetization of the third ferromagnetic layer 30 is caused to act on the second ferromagnetic layer 20. Thereby, the direction of the magnetization of the second ferromagnetic layer 20 can be determined to a direction in accordance with the direction of the current.

The second magnetic element MR2 is juxtaposed to the first magnetic element MR1 along a direction orthogonal to the stacking direction SD1. The second magnetic element MR2 has a similar configuration to the first magnetic element MR1. That is, the second magnetic element MR2 includes a third stacked unit SB3, a fourth stacked unit SB4, and a second intermediate interconnection 83b.

The third stacked unit SB3 includes a fifth ferromagnetic layer 10a in which the magnetization is fixed in a third direction, a sixth ferromagnetic layer 20a stacked with the fifth ferromagnetic layer 10a along the stacking direction SD1 and in which the direction of the magnetization is variable, and a third nonmagnetic layer 10na provided between the fifth ferromagnetic layer 10a and the sixth ferromagnetic layer 20a.

The fourth stacked unit SB4 is stacked with the third stacked unit SB3 along the stacking direction SD1. The fourth stacked unit SB4 includes a seventh ferromagnetic layer 30a in which the direction of the magnetization is variable, an eighth ferromagnetic layer 40a staked with the seventh ferromagnetic layer 30a along the stacking direction SD1 and in which the magnetization is fixed in a fourth direction, and a fourth nonmagnetic layer 20na provided between the seventh ferromagnetic layer 30a and the eighth ferromagnetic layer 40a.

The second intermediate interconnection 83b is provided between the third stacked unit SB3 and the fourth stacked unit SB4.

In the second magnetic element MR2, an electron whose spin is polarized by passing a current through the third stacked unit SB3 and the fourth stacked unit SB4 along the stacking direction SD1 is caused to act on the sixth ferromagnetic layer 20a, and a magnetic field generated from the precession of the magnetization of the seventh ferromagnetic layer 30a is caused to act on the sixth ferromagnetic layer 20a. Thereby, the direction of the magnetization of the sixth ferromagnetic layer 20a can be determined to a direction in accordance with the direction of the current.

The first bit interconnection BLa1 is directly or indirectly connected to the first end of the first stacked unit SB1 on the side opposite to the first intermediate interconnection 83a.

The second bit interconnection BLa2 is directly or indirectly connected to the second end of the second stacked unit SB2 on the side opposite to the first intermediate interconnection 83a.

The third bit interconnection BLa3 is directly or indirectly connected to the first intermediate interconnection 83a and the second intermediate interconnection 83b.

The fourth bit interconnection BLa4 is directly or indirectly connected to a third end of the third stacked unit SB3 on the side opposite to the second intermediate interconnection 83b.

The fifth bit interconnection BLa5 is directly or indirectly connected to a fourth end of the fourth stacked unit SB4 on the side opposite to the second intermediate interconnection 83b.

The first selection transistor TRa1 is disposed at least one of between the first bit interconnection BLa1 and the first end and between the second bit interconnection BLs2 and the second end.

The second selection transistor TRa2 is disposed at least one of between the fourth bit interconnection BLa4 and the third end and between the fifth bit interconnection BLa5 and the fourth end.

The first word line WLa1 is directly or indirectly connected to the gate of the first selection transistor TRa1. The second word line WLa2 is directly or indirectly connected the gate of the second selection transistor TRa2.

The embodiment provides a magnetic element and a nonvolatile memory device suppressing false writing during reading.

In the specification of this application, "perpendicular" and "parallel" refer to not only strictly perpendicular and strictly parallel but also include, for example, the variation due to manufacturing processes, etc. It is sufficient to be substantially perpendicular and substantially parallel.

Hereinabove, embodiments of the invention are described with reference to specific examples. However, the embodiment of the invention is not limited to these specific examples. For example, one skilled in the art may appropriately select specific configurations of components of magnetic elements such as ferromagnetic layers, nonmagnetic layers, electrodes, and interconnections and components of nonvolatile memory devices such as interconnections, connection vias, and transistors from known art and similarly practice the invention. Such practice is included in the scope of the invention to the extent that similar effects thereto are obtained.

Further, any two or more components of the specific examples may be combined within the extent of technical feasibility; and such combinations are included in the scope of the invention to the extent that the purport of the invention is included.

Moreover, all magnetic elements and nonvolatile memory devices practicable by an appropriate design modification by one skilled in the art based on the magnetic elements and the nonvolatile memory devices described above as embodiments of the invention also are within the scope of the invention to the extent that the purport of the invention is included.

What is claimed is:

1. A magnetic element comprising:
a first conductive layer;
a second conductive layer;
an intermediate interconnection provided between the first conductive layer and the second conductive layer;
a first stacked unit provided between the first conductive layer and the intermediate interconnection, the first stacked unit including:
a first ferromagnetic layer, a magnetization of the first ferromagnetic layer being fixed in a first direction;
a second ferromagnetic layer stacked with the first ferromagnetic layer along a stacking direction from the first conductive layer toward the second conductive layer, a direction of a magnetization of the second ferromagnetic layer being variable; and a first nonmagnetic layer provided between the first ferromagnetic layer and the second ferromagnetic layer; and a second stacked unit provided between the second conductive layer and the intermediate interconnection, the second stacked unit including:

a third ferromagnetic layer, a direction of a magnetization of the third ferromagnetic layer being variable;

a fourth ferromagnetic layer stacked with the third ferromagnetic layer along the stacking direction, a magnetization of the fourth ferromagnetic layer being fixed in a second direction; and a second nonmagnetic layer provided between the third ferromagnetic layer and the fourth ferromagnetic layer, a direction of magnetization of the second ferromagnetic layer being configured to be determined to a direction in accordance with a direction of a current by causing an electron whose spin is polarized by passing the current through the first stacked unit and the second stacked unit along the stacking direction to act on the second ferromagnetic layer and by causing a magnetic field generated from a precession of the magnetization of the third ferromagnetic layer to act on the second ferromagnetic layer, wherein a current is configured to be passed between the first conductive layer and the intermediate interconnection in a read operation reading out data stored in the magnetic element, the current having a value larger than a current flowing between the second conductive layer and the intermediate interconnection in the read operation.

2. The element according to claim 1, wherein the first direction is opposite to the second direction.

3. The element according to claim 1, wherein the intermediate interconnection includes a metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V) or an alloy including at least two or more metals selected from the group.

4. The element according to claim 1, wherein
the intermediate interconnection includes a metal selected from the group consisting of ruthenium (Ru), osmium (Os), and iridium (Ir) or an alloy including at least two metals selected from the group and
a thickness of the intermediate interconnection is not more than three nanometers.

5. A magnetic element comprising:
a first conductive layer;
a second conductive layer;
an intermediate interconnection provided between the first conductive layer and the second conductive layer;
a first stacked unit provided between the first conductive layer and the intermediate interconnection, the first stacked unit including:
a first ferromagnetic layer, a magnetization of the first ferromagnetic layer being fixed in a first direction;
a second ferromagnetic layer stacked with the first ferromagnetic layer along a stacking direction from the first conductive layer toward the second conductive layer, a direction of a magnetization of the second ferromagnetic layer being variable; and a first nonmagnetic layer provided between the first ferromagnetic layer and the second ferromagnetic layer; and a second stacked unit provided between the second conductive layer and the intermediate interconnection, the second stacked unit including:

a third ferromagnetic layer, a direction of a magnetization of the third ferromagnetic layer being variable;

a fourth ferromagnetic layer stacked with the third ferromagnetic layer along the stacking direction, a magnetization of the fourth ferromagnetic layer being fixed in a second direction; and a second nonmagnetic layer provided between the third ferromagnetic layer and the fourth ferromagnetic layer, a direction of magnetization of the second ferromagnetic layer being configured to be determined to a direction in accordance with a direction of a current by causing an electron whose spin is polarized by passing the current through the first stacked unit and the second stacked unit along the stacking direction to act on the second ferromagnetic layer and by causing a magnetic field generated from a precession of the magnetization of the third ferromagnetic layer to act on the second ferromagnetic layer, wherein a circle-equivalent diameter of a cross-sectional shape of the third ferromagnetic layer when cut in a plane perpendicular to the stacking direction is not more than 35 nanometers and a thickness of the third ferromagnetic layer is not less than 0.5 nanometers and not more than 3.5 nanometers.

6. The element according to claim 1, further comprising a magnetic shield opposed to at least one of a side surface of the first stacked unit and a side surface of the second stacked unit.

7. The element according to claim 6, further comprising a protection layer provided between the magnetic shield and at least the one of the side surface of the first stacked unit and the side surface of the second stacked unit.

8. The element according to claim 1, wherein the intermediate interconnection includes a metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V) or an alloy including two or more metals selected from the group and
a thickness of the intermediate interconnection is not less than 1.4 nanometers and not more than 20 nanometers.

9. The element according to claim 1, wherein the intermediate interconnection includes a semiconductor, and the second nonmagnetic layer includes at least one selected from the group consisting of copper (Cu), aluminum (Al), silver (Ag) and gold (Au).

10. A nonvolatile memory device comprising:
a magnetic element including:
a first conductive layer;
a second conductive layer;
an intermediate interconnection provided between the first conductive layer and the second conductive layer;
a first stacked unit provided between the first conductive layer and the intermediate interconnection, the first stacked unit including:
a first ferromagnetic layer, a magnetization of the first ferromagnetic layer being fixed in a first direction;
a second ferromagnetic layer stacked with the first ferromagnetic layer along a stacking direction from the first conductive layer toward the second conductive layer, a direction of a magnetization of the second ferromagnetic layer being variable; and
a first nonmagnetic layer provided between the first ferromagnetic layer and the second ferromagnetic layer; and
a second stacked unit provided between the second conductive layer and the intermediate interconnection, the second stacked unit including:
a third ferromagnetic layer, a direction of a magnetization of the third ferromagnetic layer being variable;
a fourth ferromagnetic layer stacked with the third ferromagnetic layer along the stacking direction, a magnetization of the fourth ferromagnetic layer being fixed in a second direction; and
a second nonmagnetic layer provided between the third ferromagnetic layer and the fourth ferromagnetic layer,
a direction of magnetization of the second ferromagnetic layer being configured to be determined to a direction in accordance with a direction of a current by causing an electron whose spin is polarized by passing the current through the first stacked unit and the second stacked unit along the stacking direction to act on the second ferromagnetic layer and by causing a magnetic field generated from a precession of the magnetization of the third ferromagnetic layer to act on the second ferromagnetic layer; and
a control circuit unit directly or indirectly connected to the first conductive layer, the second conductive layer, and the intermediate interconnection,
the control circuit unit passing a current between the first conductive layer and the intermediate interconnection in a read operation reading out data stored in the magnetic element, the current having a value larger than a current flowing between the second conductive layer and the intermediate interconnection in the read operation.

11. The device according to claim 10, wherein the control circuit unit passes a current between the first conductive layer and the intermediate interconnection and passes a current between the second conductive layer and the intermediate interconnection in a write operation writing data to the magnetic element.

12. The device according to claim 10, wherein the control circuit unit passes a current between the first conductive layer and the second conductive layer via the intermediate interconnection in a write operation writing data to the magnetic element.

13. The device according to claim 10, further comprising a transistor directly or indirectly connected at least one of a conductive portion between the first conductive layer and the control circuit unit, a conductive portion between the second conductive layer and the control circuit unit, and a conductive portion between the intermediate interconnection and the control circuit unit.

14. The device according to claim 10, further comprising:
a transistor directly or indirectly connected at least one of a conductiove portion between the first conductive layer and the control circuit unit and a conductive portion between the second conductive layer and the control circuit unit;
a first bit interconnection directly or indirectly connected to the first conductive layer;
a second bit interconnection directly or indirectly connected to the second conductive layer;
a third bit interconnection directly or indirectly connected to the intermediate interconnection; and
a word line connected to a gate of the transistor.

15. The device according to claim 14, wherein an extending direction of the first bit interconnection is parallel to an extending direction of the second bit interconnection and an extending direction of the third bit interconnection.

16. The device according to claim 14, wherein an extending direction of the third bit interconnection intersects with an extending direction of the first bit interconnection and an extending direction of the second bit interconnection.

17. A nonvolatile memory device comprising:
a plurality of bit lines;
a plurality of word lines; and
a plurality of memory cells each provided at an intersection of each of the bit lines and each of the word lines,
each of the memory cells including:
a first stacked unit;
a second stacked unit;
an intermediate interconnection provided between the first stacked unit and the second stacked unit; and
a selection transistor including a gate, a current being able to be passed through the selection transistor by switching the gate to ON,
the first stacked unit including:
a first ferromagnetic layer, a magnetization of the first ferromagnetic layer being fixed in a first direction;
a second ferromagnetic layer stacked with the first ferromagnetic layer along a stacking direction from the first stacked unit toward the second stacked unit, a direction of a magnetization of the second ferromagnetic layer being variable; and
a first nonmagnetic layer provided between the first ferromagnetic layer and the second ferromagnetic layer,
the second stacked unit including:
a third ferromagnetic layer, a direction of a magnetization of the third ferromagnetic layer being variable;
a fourth ferromagnetic layer stacked with the third ferromagnetic layer along the stacking direction, a magnetization of the fourth ferromagnetic layer being fixed in a second direction; and
a second nonmagnetic layer provided between the third ferromagnetic layer and the fourth ferromagnetic layer,
each of the memory cells having a function of storing data by determining a direction of the magnetization of the second ferromagnetic layer to a direction in accordance with a direction of a current by causing an electron whose spin is polarized by passing the current in a direction substantially perpendicular to layer surfaces of the first and second stacked units to act on the second ferromagnetic layer and by causing a magnetic field generated from a precession of the magnetization of the third ferromagnetic layer to act on the second ferromagnetic layer,
each of the bit lines including a first, a second and a third bit interconnection,
each of the first, the second and the third bit interconnections being connected to one of the memory cells provided at the intersection of each of the bit lines and each of the word lines,
the first bit interconnection being directly or indirectly connected to a first end of the first stacked unit of the one of the memory cells on a side opposite to the intermediate interconnection,
the second bit interconnection being directly or indirectly connected to a second end of the second stacked unit of the one of the memory cells on a side opposite to the intermediate interconnection, the third bit interconnection being directly or indirectly connected to the intermediate interconnection of the one of the memory cells, the selection transistor of the one of the memory cells being disposed at least one of between the first bit interconnection and the first end and between the second bit interconnection and the second end, and the one of the word lines being connected to the gate of the selection transistor of the one of the memory cells.

18. The device according to claim 17, wherein the selection transistor of the one of the memory cells is disposed between the first bit interconnection and the first end, the selection transistor of the one of the memory cells further includes a source and a drain, the source is directly or indirectly connected to one of the first bit interconnection and the first end, and the drain is directly or indirectly connected to another one of the first bit interconnection and the first end.

19. The device according to claim 17, wherein the selection transistor of the one of the memory cells is disposed between the second bit interconnection and the second end, the selection transistor of the one of the memory cells further includes a source and a drain, the source is directly or indirectly connected to one of the second bit interconnection and the second end, and the drain is directly or indirectly connected to another one of the second bit interconnection and the second end.

20. A nonvolatile memory device comprising:

a first magnetic element including:
  a first stacked unit including:
    a first ferromagnetic layer, a magnetization of the first ferromagnetic layer being fixed in a first direction;
    a second ferromagnetic layer stacked with the first ferromagnetic layer, a direction of a magnetization of the second ferromagnetic layer being variable; and
    a first nonmagnetic layer provided between the first ferromagnetic layer and the second ferromagnetic layer;
  a second stacked unit stacked with the first stacked unit along a stacking direction from the first ferromagnetic layer toward the second ferromagnetic layer, the second stacked unit including:
    a third ferromagnetic layer, a direction of a magnetization of the third ferromagnetic layer being variable;
    a fourth ferromagnetic layer stacked with the third ferromagnetic layer along the stacking direction, a magnetization of the fourth ferromagnetic layer being fixed in a second direction; and
    a second nonmagnetic layer provided between the third ferromagnetic layer and the fourth ferromagnetic layer; and
  a first intermediate interconnection provided between the first stacked unit and the second stacked unit, a direction of the magnetization of the second ferromagnetic layer being configured to be determined to a direction in accordance with a direction of a current by causing an electron whose spin is polarized by passing the current through the first stacked unit and the second stacked unit along the stacking direction to act on the second ferromagnetic layer and by causing a magnetic field generated from a precession of the magnetization of the third ferromagnetic layer to act on the second ferromagnetic layer;

a second magnetic element juxtaposed to the first magnetic element along a direction orthogonal to the stacking direction, the second magnetic element including:
  a third stacked unit including:
    a fifth ferromagnetic layer, a magnetization of the fifth ferromagnetic layer being fixed in a third direction;
    a sixth ferromagnetic layer stacked with the fifth ferromagnetic layer along the stacking direction, a direction of a magnetization of the sixth ferromagnetic layer being variable; and
    a third nonmagnetic layer provided between the fifth ferromagnetic layer and the sixth ferromagnetic layer;
  a fourth stacked unit stacked with the third stacked unit along the stacking direction, the fourth stacked unit including:
    a seventh ferromagnetic layer, a direction of a magnetization of the seventh ferromagnetic layer being variable;
    an eighth ferromagnetic layer stacked with the seventh ferromagnetic layer along the stacking direction, a magnetization of the eighth ferromagnetic layer being fixed in a fourth direction; and
    a fourth nonmagnetic layer provided between the seventh ferromagnetic layer and the eighth ferromagnetic layer; and
  a second intermediate interconnection provided between the third stacked unit and the fourth stacked unit, a direction of the magnetization of the sixth ferromagnetic layer being configured to be determined to a direction in accordance with a direction of a current by causing an electron whose spin is polarized by passing the current through the third stacked unit and the fourth stacked unit along the stacking direction to act on the sixth ferromagnetic layer and by causing a magnetic field generated from a precession of the magnetization of the seventh ferromagnetic layer to act on the sixth ferromagnetic layer;

a first bit interconnection directly or indirectly connected to a first end of the first stacked unit on a side opposite to the first intermediate interconnection;

a second bit interconnection directly or indirectly connected to a second end of the second stacked unit on a side opposite to the first intermediate interconnection;

a third bit interconnection directly or indirectly connected to the first intermediate interconnection and the second intermediate interconnection;

a fourth bit interconnection directly or indirectly connected to a third end of the third stacked unit on a side opposite to the second intermediate interconnection;

a fifth bit interconnection directly or indirectly connected to a fourth end of the fourth stacked unit on a side opposite to the second intermediate interconnection;

a first selection transistor disposed at least one of between the first bit interconnection and the first end and between the second bit interconnection and the second end;

a second selection transistor disposed at least one of between the fourth bit interconnection and the third end and between the fifth bit interconnection and the fourth end;

a first word line directly or indirectly connected to a gate of the first selection transistor; and a second word line directly or indirectly connected to a gate of the second selection transistor.

* * * * *